US009105447B2

(12) United States Patent
Brouk et al.

(10) Patent No.: US 9,105,447 B2
(45) Date of Patent: *Aug. 11, 2015

(54) WIDE DYNAMIC RANGE ION ENERGY BIAS CONTROL; FAST ION ENERGY SWITCHING; ION ENERGY CONTROL AND A PULSED BIAS SUPPLY; AND A VIRTUAL FRONT PANEL

(71) Applicant: Advanced Energy Industries, Inc., Fort Collins, CO (US)

(72) Inventors: Victor Brouk, Fort Collins, CO (US); Daniel J. Hoffman, Fort Collins, CO (US); Daniel Carter, Fort Collins, CO (US); Dmitri Kovalevskii, Windsor, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/011,305

(22) Filed: Aug. 27, 2013

(65) Prior Publication Data

US 2014/0061156 A1    Mar. 6, 2014

Related U.S. Application Data

(60) Provisional application No. 61/694,148, filed on Aug. 28, 2012.

(51) Int. Cl.
*H01J 37/24* (2006.01)
*H01J 37/32* (2006.01)

(52) U.S. Cl.
CPC ......... *H01J 37/241* (2013.01); *H01J 37/32091* (2013.01); *H01J 37/32146* (2013.01)

(58) Field of Classification Search
USPC ................... 216/59, 61; 438/714; 315/111.21
See application file for complete search history.

(56) References Cited

U.S. PATENT DOCUMENTS

| 4,622,094 A | 11/1986 | Otsubo |
| 4,963,239 A | 10/1990 | Fujita et al. |

(Continued)

FOREIGN PATENT DOCUMENTS

| EP | 0383570 A2 | 8/1990 |
| EP | 1978542 A1 | 10/2008 |

(Continued)

OTHER PUBLICATIONS

Jeon, M., et al., "Hydrogenated amorphous silicon film as intrinsic passivation layer deposited at various temperatures using RF remo . . . ", "Current Applied Physics", Nov. 12, 2009, pp. S237-S240, vol. 10, No. (2010), Publisher: Elsevier B.V., Published in: US.

(Continued)

*Primary Examiner* — Shamim Ahmed
(74) *Attorney, Agent, or Firm* — Neugeboren O'Dowd PC

(57) ABSTRACT

This disclosure describes systems, methods, and apparatus for operating a plasma processing chamber. In particular, a periodic voltage function combined with an ion current compensation can be provided as a bias to a substrate support as a modified periodic voltage function. This in turn effects a DC bias on the surface of the substrate that controls an ion energy of ions incident on a surface of the substrate. A peak-to-peak voltage of the periodic voltage function can control the ion energy, while the ion current compensation can control a width of an ion energy distribution function of the ions. Measuring the modified periodic voltage function can provide a means to calculate an ion current in the plasma and a sheath capacitance of the plasma sheath. The ion energy distribution function can be tailored and multiple ion energy peaks can be generated, both via control of the modified periodic voltage function.

25 Claims, 53 Drawing Sheets

(56) References Cited

U.S. PATENT DOCUMENTS

| | | |
|---|---|---|
| 5,057,185 A | 10/1991 | Singh et al. |
| 5,156,703 A | 10/1992 | Oechsner |
| 5,160,397 A | 11/1992 | Doki et al. |
| 5,242,561 A | 9/1993 | Sato |
| 5,247,669 A | 9/1993 | Abraham et al. |
| 5,415,718 A | 5/1995 | Ohmi et al. |
| 5,487,785 A | 1/1996 | Horiike et al. |
| 5,535,906 A | 7/1996 | Drummond |
| 5,770,972 A | 6/1998 | Collier et al. |
| 5,859,428 A | 1/1999 | Fruchtman |
| 5,983,828 A | 11/1999 | Savas |
| 6,051,114 A | 4/2000 | Yao et al. |
| 6,110,287 A | 8/2000 | Arai et al. |
| 6,156,667 A | 12/2000 | Jewett |
| 6,201,208 B1 | 3/2001 | Wendt et al. |
| 6,291,938 B1 | 9/2001 | Jewett et al. |
| 6,313,583 B1 | 11/2001 | Arita et al. |
| 6,326,584 B1 | 12/2001 | Jewett et al. |
| 6,392,210 B1 | 5/2002 | Jewett et al. |
| 6,544,895 B1 | 4/2003 | Donohoe |
| 6,707,051 B2 | 3/2004 | Shun'ko |
| 6,714,033 B1 | 3/2004 | Makhratchev et al. |
| 6,724,148 B1 | 4/2004 | Gonzalez et al. |
| 6,777,037 B2 | 8/2004 | Sumiya et al. |
| 6,794,301 B2 | 9/2004 | Savas |
| 6,819,096 B2 | 11/2004 | Gonzalez et al. |
| 6,822,396 B2 | 11/2004 | Gonzalez et al. |
| 6,863,018 B2 | 3/2005 | Koizumi et al. |
| 6,872,289 B2 | 3/2005 | Mizuno et al. |
| 6,885,153 B2 * | 4/2005 | Quon ............... 315/111.31 |
| 6,913,938 B2 | 7/2005 | Shanmugasundram et al. |
| 6,920,312 B1 | 7/2005 | Benjamin |
| 6,927,358 B2 | 8/2005 | Gonzalez et al. |
| 6,946,063 B1 | 9/2005 | Gonzalez et al. |
| 6,984,198 B2 | 1/2006 | Krishnamurthy et al. |
| 7,005,845 B1 | 2/2006 | Gonzalez et al. |
| 7,046,524 B2 | 5/2006 | Hoffman et al. |
| 7,059,267 B2 | 6/2006 | Hedberg et al. |
| 7,201,936 B2 | 4/2007 | Schwarm et al. |
| 7,245,084 B1 | 7/2007 | Gonzalez et al. |
| 7,253,117 B2 | 8/2007 | Donohoe |
| 7,297,637 B2 | 11/2007 | Hedberg et al. |
| 7,373,899 B2 | 5/2008 | Sumiya et al. |
| 7,468,494 B2 | 12/2008 | Gonzalez et al. |
| 7,520,956 B2 * | 4/2009 | Samukawa et al. ...... 156/345.28 |
| 7,528,386 B2 | 5/2009 | Ruzic et al. |
| 7,725,208 B2 | 5/2010 | Shanmugasundram et al. |
| 7,737,702 B2 | 6/2010 | Pipitone |
| 7,764,140 B2 | 7/2010 | Nagarkatti et al. |
| 7,777,179 B2 * | 8/2010 | Chen et al. ............... 250/281 |
| 7,783,375 B2 | 8/2010 | Shanmugasundram et al. |
| 7,847,247 B2 | 12/2010 | Denpoh |
| 8,140,292 B2 | 3/2012 | Wendt |
| 2001/0014540 A1 | 8/2001 | Shan et al. |
| 2002/0038631 A1 | 4/2002 | Sumiya et al. |
| 2003/0033116 A1 | 2/2003 | Brcka et al. |
| 2004/0094402 A1 | 5/2004 | Gopalraja et al. |
| 2006/0088655 A1 | 4/2006 | Collins et al. |
| 2006/0130971 A1 | 6/2006 | Chang et al. |
| 2006/0226786 A1 | 10/2006 | Lin et al. |
| 2007/0193975 A1 | 8/2007 | Wilson |
| 2009/0077150 A1 | 3/2009 | Wendt |
| 2009/0255800 A1 | 10/2009 | Koshimizu |
| 2010/0072172 A1 | 3/2010 | Ui et al. |
| 2010/0208409 A1 | 8/2010 | Bluck et al. |
| 2010/0276273 A1 | 11/2010 | Heckman et al. |
| 2011/0089023 A1 | 4/2011 | Tanaka et al. |
| 2011/0095689 A1 | 4/2011 | Gilbert |
| 2011/0226617 A1 | 9/2011 | Hofmann et al. |
| 2011/0259851 A1 | 10/2011 | Brouk et al. |
| 2012/0052599 A1 | 3/2012 | Brouk et al. |
| 2012/0187844 A1 | 7/2012 | Brouk et al. |
| 2012/0217221 A1 | 8/2012 | Hoffman et al. |
| 2012/0318456 A1 * | 12/2012 | Brouk et al. ............. 156/345.28 |
| 2012/0319584 A1 | 12/2012 | Brouk et al. |
| 2014/0062495 A1 * | 3/2014 | Carter et al. ................. 324/459 |

FOREIGN PATENT DOCUMENTS

| | | |
|---|---|---|
| EP | 1129481 B1 | 2/2012 |
| GB | 2382459 A | 5/2003 |
| GB | 2400613 A | 10/2004 |
| JP | 60-126832 | 7/1985 |
| JP | 0214572 A | 5/1990 |
| JP | 04-193329 A | 7/1992 |
| JP | 09293600 | 11/1997 |
| JP | 2004193564 | 7/2004 |
| JP | 200971133 | 4/2009 |
| TW | 200811905 A | 3/2008 |
| WO | 0215222 A2 | 2/2002 |
| WO | 2010013476 A1 | 2/2010 |
| WO | 2010126893 A2 | 11/2010 |
| WO | 2012030500 A1 | 3/2012 |
| WO | 2012103101 A1 | 8/2012 |
| WO | 2013016619 | 1/2013 |

OTHER PUBLICATIONS

Giangregorio, M.M., et al., "Role of plasma activation in tailoring the nanostructure of multifunctional oxides thin films", "Applied Surface Sci.", Sep. 10, 2008, pp. 5396-5400, vol. 255, No. (2009), Publisher: Elsevier B.V., Published in: US.

Vahedi, V., et al., "Verification of frequency scaling laws for capacitive radio-frequency discharges using two-dimensional simulations", "Phys. Fluids B", Jul. 1993, pp. 2719-2729, vol. 5, No. 7, Publisher: Am. Inst. of Physics, Published in: US.

Rauf, S., et al., "Nonlinear Dynamics of Radio Frequency Plasma Processing Reactors Powered by Multifrequency Sources", "IEEE Transactions on Plasma Science", Oct. 5, 1999, pp. 1329-1338, vol. 27, No. 5, Publisher: IEEE.

Raoux, S., et al., "Remote microwave plasma source for cleaning chemical vapor deposition chambers; Technology for reducing global warm . . . ", "J. Vac. Sci. Technol. B Mar./Apr. 1999", 1999, pp. 477-485, vol. 17, No. 2, Publisher: Am. Vacuum Soc'y, Published in: US.

Gangoli, S.P., et al., "Production and transport chemistry of atomic fluorine in remote plasma source and cylindrical reaction chamber", "J. Phys. D: Appl. Phys.", Aug. 16, 2007, pp. 5140-5154, vol. 40, No. (2007), Publisher: IOP Publishing Ltd., Published in: UK.

Yun, Y.B., et al., "Effects of various additive gases on chemical dry etching rate enhancement of low-k SiOCH layer in F2/Ar remote plasmas", "Thin Solid Films", Aug. 15, 2007, pp. 3549-3553, vol. 516, No. (2008), Publisher: Elsevier B.V., Published in: US.

Kuo, M.S., et al., "Influence of C4F8/Ar-based etching and H2-based remote plasma ashing processes on ultralow k materials modifications", "J. Vac. Sci. Technol. B, Mar./Apr. 2010", Mar. 19, 2010, pp. 284-294, vol. 28, No. 2, Publisher: Am. Vacuum Soc'y, Published in: US.

Heil, S.B.S., et al., "Deposition of TiN and HfO2 in a commercial 200 mm plasma atomic layer deposition reactor", "J. Vac. Sci. Technol. A, Sep./Oct. 2007", Jul. 31, 2007, pp. 1357-1366, vol. 25, No. 5, Publisher: Am. Vacuum Soc'y, Published in: US.

Kim, J.Y., et al., "Remote plasma enhanced atomic layer deposition of TiN thin films using metalorganic precursor", "J. Vac. Sci. Technol. A, Jan./Feb. 2004", Nov. 13, 2003, pp. 8-12, vol. 22, No. 1, Publisher: Am. Vacuum Soc'y, Published in: US.

Wakeham, S.J., et al., "Low temperature remote plasma sputtering of indium tin oxide for flexible display applications", "Thin Solid Films", May 12, 2009, pp. 1355-1358, vol. 519, No. (2009), Publisher: Elsevier B.V.

Ohachi, T., et al., "Measurement of nitrogen atomic flux for RF-MBE growth of GaN and AlN on Si substrates", "J. of Crystal Growth", Jan. 20, 2009, pp. 2987-2991, vol. 311, No. (2009), Publisher: Elsevier B.V.

Honda, S., et al., "Hydrogenation of polycrystalline silicon thin films", "Thin Solid Films", Oct. 5, 2005, pp. 144-148, vol. 501, No. (2006), Publisher: Elsevier B.V., Published in: US.

(56) References Cited

OTHER PUBLICATIONS

Bruno, James, "Use of Simulation for Examining the Effects of Guessing Upon Knowledge Assessment on Standardized Tests", "Conference Proceedings of the 10th Conference on Winter Simulation, Miami, FL", 1978, vol. 2, Publisher: IEEE Computer Society Press, Published in: US.
Buzzi, F.L., et al., "Energy Distribution of Bombarding Ions in Plasma Etching of Dielectrics", "AVS 54th International Symposium", Oct. 15, 2007, Publisher: Univ. of Wisconsin-Madison, Published in: US.
Bryns, B., et al., "A VHF driven coaxial atmospheric air plasma: electrical and optical characterization", Dec. 16, 2011, pp. 1-18, No. Rev. 2-0, Publisher: N. C. St. U., Dep't of Nuclear Engr., Published in: US.
Kudelka, Stephan, "Supplementary European Search Report re EP Application 10 77 0205.2, PCT/US2010/032582", Jan. 30, 2013, p. 8, Published in: NL.
Emsellem, G., "Electrodeless Plasma Thruster Design Characteristics", Jul. 11, 2005, p. 22, Publisher: 41st Joint Propulsion Conference, Tucson, Published in: US.
George, M.A., et al., "Silicon Nitride Arc Thin Films by New Plasma Enhanced Chemical Vapor Deposition Source Technology", Jul. 7, 2011, pp. 1-5, Publisher: Article downloaded from www.generalplasma.com, Published in: US.
Masaaki Awano, "Japanese Office Action re Application No. 2012-508593", Apr. 19, 2013, p. 11, Published in: JP.
Masaaki, Awano, "Japanese Office Action re Application No. 2012-508593", Sep. 11, 2013, p. 7, Published in: JP.
Yamamoto, Shusaku, "Response to Japanese Office Action re Application No. 2012-508593", Aug. 16, 2013, p. 9, Published in: JP.
Duk Yeul Baek, "Korean Office Action re Applcation No. 10-2011-7009075", Mar. 25, 2013, p. 2, Published in: KR.
Krolak, M, "Matthew Krolak's MyElectricEngine.Com Megnetoplasmadynamic (MPD) Thruster Design", Apr. 28, 2011, p. 7, Publisher: Webpage downloaded from http://myelectricengine.com/projects/mpdthruster/mpdthruster.html, Published in: US.
Brayton, John Joseph, "Office Action re U.S. Appl. No. 12/870,837", Mar. 22, 2013, p. 46, Published in: US.
Abraham, Ibrahime A., "Office Action re U.S. Appl. No. 12/767,775", Apr. 25, 2013, p. 28, Published in: US.
Brayton, John Joseph, "Office Action re U.S. Appl. No. 13/193,345", Jun. 6, 2013, p. 8, Published in: US.
Brayton, John Joseph, "Office Action re U.S. Appl. No. 13/193,299", Aug. 8, 2013, p. 7, Published in: US.
Abraham, Ibrahime A., "Office Action re U.S. Appl. No. 12/767,775", Sep. 10, 2013, p. 30, Published in: US.
McLeod, Austin, "Office Action re U.S. Appl. No. 12/767,775", Oct. 17, 2012, Published in: US.
Brayton, John Joseph, "Office Action re U.S. Appl. No. 13/193,345", Nov. 7, 2013, p. 36, Published in: US.
Brayton, John J., "Office Action re U.S. Appl. No. 12/870,837", Dec. 19, 2012, Published in: US.
O'Dowd, Sean R., "Response to Office Action re U.S. Appl. No. 12/870,837", Aug. 22, 2013, p. 9, Published in: US.
O'Dowd Sean R., "Response to Office Action re U.S. Appl. No. 12/767,775", Nov. 5, 2013, p. 6, Published in: US.
Atkinson, Gerard, "International Search Report and Written Opinion re Application No. PCT/US10/032582", Feb. 21, 2011, Published in: AU.
Mitrovic, Bayer, "International Search Report and Written Opinion re Application No. PCT/US11/047467", Feb. 12, 2011, Published in: AU.
Guinea, William, "International Search Report and Written Opinion re Application No. PCT/US12/048504", Sep. 17, 2012, Published in: AU.
Lindner, Nora, "International Preliminary Report on Patentability re Application PCT/US2010/032582", Nov. 1, 2011, p. 8, Published in: CH.
Baharlou, Simin, "International Preliminary Report on Patentability re Application No. PCT/US2011/047467", Mar. 14, 2013, p. 7, Published in: CH.
Rabbani, Firoozeh, "International Search Report and Written Opinion re application No. PCT/US2012/022380", Mar. 14, 2012, Published in: AU.
Devlin, Martin, "International Search Report and Written Opinion re application No. PCT/US2012/029953", May 28, 2012, p. 11, Published in: AU.
Mitrovic, Bayer, "International Search Report and Written Opinion re Application No. PCT/US2013/056657", Oct. 28, 2013, p. 11, Published in: AU.
Williams, Jim, "International Search Report and Written Opinion re Application No. PCT/US2013/056851", Nov. 18, 2013, p. 11, Published in: AU.
Panta, Kusha, "International Search Report and Written Opinion re Application No. PCT/US2013/056659", Nov. 8, 2013, p. 5, Published in: AU.
O'Dowd, Sean R., "Response to Office Action re U.S. Appl. No. 12/767,775", Mar. 17, 2013, p. 6, Published in: US.
O'Dowd, Sean R., "Response to Office Action re U.S. Appl. No. 12/767,775", Jul. 25, 2013, p. 7, Published in: US.
Gruber, Stephen S., "Response to Office Action re U.S. Appl. No. 13/193,345", Jul. 30, 2013, p. 9, Published in: US.
SIPO, "Chinese Office Action re Application No. 201080003206.X", May 23, 2014, p. 6, Published in: CN.
Yafeng, "Chinese Office Action re Application No. 201080003206.X", Sep. 4, 2013, p. 15, Published in: CN.
Sathiraju, Srinivas, "Office Action re U.S. Appl. No. 13/597,032", Jun. 20, 2014, p. 42, Published in: US.
Abraham, Ibrahime A., "Office Action re U.S. Appl. No. 12/767,775", Jul. 1, 2014, p. 48, Published in: US.
Brayton, John Joseph, "Office Action re U.S. Appl. No. 13/193,345", Jul. 7, 2014, p. 26, Published in: US.
Brayton, John Joseph, "Office Action re U.S. Appl. No. 13/193,299", Sep. 26, 2014, p. 37, Published in: US.
Brayton, John Joseph, "Office Action re U.S. Appl. No. 13/193,299", Dec. 18, 2013, p. 43, Published in: US.
Brayton, John Joseph, "Office Action re U.S. Appl. No. 12/870,837", Dec. 20, 2013, p. 33, Published in: US.
Baharlou, Simin, "International Preliminary Report on Patentability re Application No. PCT/US2012/048504", Feb. 6, 2014, p. 11, Published in: CH.
Ramachandran, Mani, "International Search Report and Written Opinion re Application No. PCT/US2013/056634", Nov. 15, 2013, p. 10, Published in: AU.
Williams, Jim, "International Search Report and Written Opinion re Application No. PCT/US2013/056647", Oct. 30, 2013, p. 10, Published in: AU.
O'Dowd, Sean R., "Response to Office Action re U.S. Appl. No. 12/870,837", Mar. 20, 2014, p. 8, Published in: US.
Gruber, Stephen S., "Response to Office Action re U.S. Appl. No. 13/193,299", May 19, 2014, p. 18, Published in: US.
O'Dowd, Sean R., "Response to Office Action re U.S. Appl. No. 13/193,345", Mar. 7, 2014, p. 7, Published in: US.
O'Dowd, Sean R., "Response to Office Action re U.S. Appl. No. 12/767,775", Nov. 3, 2014, p. 13, Published in: US.
TIPO, "Taiwain Office Action re Application No. 099113815", Jan. 27, 2014, p. 6, Published in: TW.
TIPO, "Taiwan Office Action re Application No. 099113815", Jun. 18, 2014, p. 2, Published in: TW.
TIPO, "Taiwan Office Action re Application No. 101127182", Aug. 11, 2014, p. 11, Published in: TW.
Gruber, Stephen S., "Response to Office Action re U.S. Appl. No. 13/193,299", Aug. 28, 2013, p. 9, Published in: US.
O'Dowd, Sean R., "Reponse to Office Action re U.S. Appl. No. 12/767,775", Nov. 5, 2013, p. 6, Published in: US.
Gruber, Stephen S., "Response to Office Action dated Dec. 19, 2012 re U.S. Appl. No. 12/870,837", Jan. 9, 2013, p. 8, Published in: US.
Silapunt, et al., "Ion bombardment energy control for selective fluorocarbon plasma etching", Mar. 22, 2004, Published in: US.

(56) References Cited

OTHER PUBLICATIONS

Wang, S.B., et al., "Control of ion energy distribution at substrates during plasma processing", "J. Applied Physics", Jul. 15, 2000, pp. 643-646, vol. 88, No. 2, Publisher: Am. Inst. of Physics, Published in: US.

Xiubo, et al., "Charging of dielectric substrate materials during plasma immersion ion implantation", Nov. 9, 2001, p. 7, Published in: HK.

Abraham, Ibrahime A., "Office Action re U.S. Appl. No. 12/767,775", Dec. 15, 2014, p. 37, Published in: US.

O'Dowd, Sean R., "Response to Office Action re U.S. Appl. No. 13/597,032", Dec. 16, 2014, p. 11, Published in: US.

Moku, Tetsuji, "Japanese Office Action re Application No. 2013-527088", Apr. 21, 2015, p. 10, Published in: JP.

Moku, Tetsuji, "Japanese Office Action re Application No. 2014-523-057", Apr. 21, 2015, p. 11, Published in: JP.

Brayton, John Joseph, "Restriction Requirement re U.S. Appl. No. 13/597,050", Jan. 27, 2015, p. 7, Published in: US.

Brayton, John Joseph, "Restriction Requirement re U.S. Appl. No. 13/596,976", Feb. 23, 2015, p. 8, Published in: US.

Brayton, John Joseph, "Restriction Requirement re U.S. Appl. No. 13/597,093", Mar. 23, 2015, p. 9, Published in: US.

Brayton, John Joseph, "Office Action re U.S. Appl. No. 14/606,857", Apr. 8, 2015, p. 51, Published in: US.

Brayton, John Joseph, "Office Action re U.S. Appl. No. 12/870,837", Apr. 9, 2015, p. 40, Published in: US.

Sathiraju, Srinivas, "Office Action re U.S. Appl. No. 13/597,032", Apr. 9, 2015, p. 32, Published in: US.

Brayton, John Joseph, "Office Action re U.S. Appl. No. 13/193,345", Apr. 16, 2015, p. 34, Published in: US.

Wittmann-Regis, Agnes, "International Preliminary Report on Patentability re Application No. PCT/US2013/056634", Mar. 12, 2015, p. 7, Published in: CH.

Nickitas-Etienne, Athina, "Internaitonal Preliminary Report on Patentability re Application No. PCT/US2013/056647", Mar. 12, 2015, p. 7, Published in: CH.

Mohri, Mineko, "International Preliminary Report on Patentability re Application No. PCT/US2013/056657", Mar. 12, 2015, p. 8, Published in: CH.

Mohri, Mineko, "International Preliminary Report on Patentability re Application No. PCT/US2013/056659", Mar. 12, 2015, p. 8, Published in: CH.

Nakamura, Yukari, "International Preliminary Report on Patentability re Application No. PCT/US2013/056851", Mar. 12, 2015, p. 8, Published in: CH.

O'Dowd, Sean R., "Office Action Response re U.S. Appl. No. 12/767,775", Feb. 27, 2015, p. 6, Published in: US.

Gruber, Stephen S., "Response to Restriction Requirement re U.S. Appl. No. 13/597,050", Mar. 26, 2015, p. 11, Published in: US.

O'Dowd, Sean R., "Response to Office Action re U.S. Appl. No. 13/193,299", Mar. 26, 2015, p. 7, Published in: US.

Yafeng, Zhang, "Chinese Office Action re Application No. 201080003206.X", Nov. 26, 2014, p. 6, Published in: CN.

O'Dowd, Sean, "Response to Office Action re U.S. Appl. No. 13/193,345", Dec. 8, 2014, p. 8, Published in: US.

\* cited by examiner

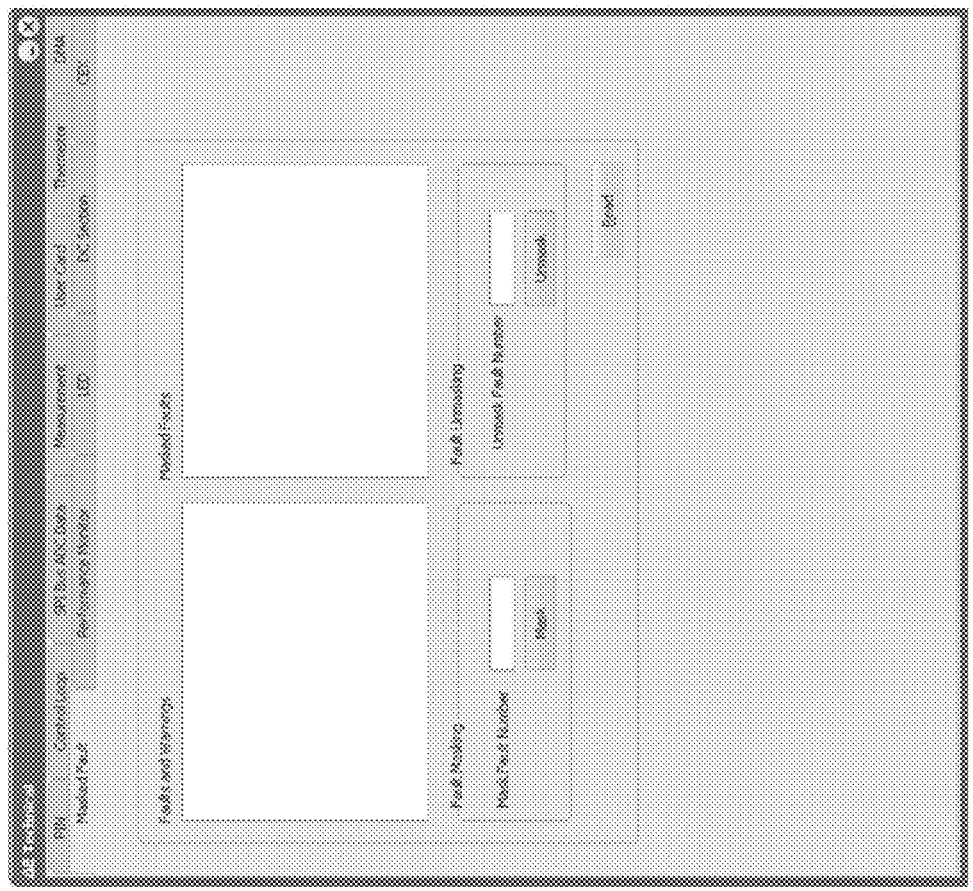
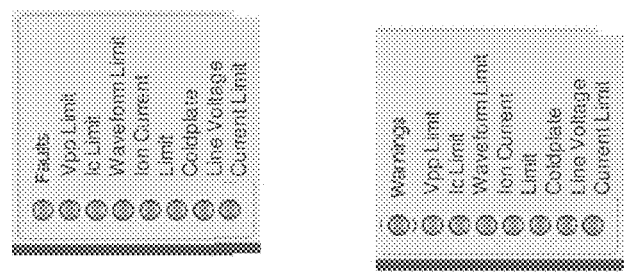
FIG. 34

WIDE DYNAMIC RANGE ION ENERGY BIAS CONTROL; FAST ION ENERGY SWITCHING; ION ENERGY CONTROL AND A PULSED BIAS SUPPLY; AND A VIRTUAL FRONT PANEL

CLAIM OF PRIORITY UNDER 35 USC §119

The present application for patent claims priority to Provisional Application No. 61/694,148 entitled "WIDE DYNAMIC RANGE ION ENERGY BIAS CONTROL; FAST ION ENERGY SWITCHING; ION ENERGY CONTROL AND A PULSED BIAS SUPPLY; AND A VIRTUAL FRONT PANEL" filed Aug. 28, 2012, and assigned to the assignee hereof and hereby expressly incorporated by reference herein.

BACKGROUND

Plasma processing can benefit from precise control over ion energy and further from an ability to control an ion energy distribution function (IEDF) of ions incident on a substrate during processing. However, precise control is hampered by a lack of non-invasive and real-time means for monitoring ion energy and IEDF.

Additionally there are various metrics that can be monitored via a knowledge of ion current, $I_I$, and sheath capacitance, $C_2$ (or $C_{sheath}$). However, there is also a lack of systems and methods that can non-invasively and in real-time monitor these values.

FIELD OF THE DISCLOSURE

The present disclosure relates generally to plasma processing and in particular to controlling ion energy.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

There are five primary aspects of this disclosure: circuit 'memory' as a cause of inaccuracies in ion energy, wide dynamic range, fast ion energy switching, pulsed ion energy control, and a virtual front panel. Wide dynamic range involves a bias supply of a plasma processing chamber, where the bias supply can effectuate two or more ion energies within a plasma of the plasma processing chamber. The two or more ion energies can be effectuated with accuracy, stability, and a wide dynamic range (ion energies that have a large ion energy separation). Fast ion energy switching involves the bias supply effectuating the two or more ion energies in a short period of time for instance from one bias supply pulse or cycle to the next (pulses or cycles are also known as periods of a modified periodic voltage function). Fast ion energy switching also includes the bias supply's ability to compensate for disturbances in ion energy within a single cycle. Pulsed ion energy control involves the timing of a pulsed envelope of bias supply cycles relative to a pulsed envelope of the plasma source supply. The virtual front panel involves a user interface enabling control of the systems, methods, and apparatus discussed in these first three aspects.

In one aspect of the disclosure, a method of operating a plasma processing chamber is described. The method can include sustaining a plasma in contact with a substrate on a substrate support within the plasma processing chamber. The method can further include accessing an effective capacitance, $C_1$, of the substrate support. The method can yet further include providing a modified periodic voltage function to the substrate support in order to effect a potential on a surface of the substrate, the modified period voltage function formed from a combination of a periodic voltage function and an ion current compensation, $I_C$. Lastly, the method can include calculating ion current, $I_I$, in the plasma as a function of measurements of the modified periodic voltage function.

In another aspect of the disclosure, a plasma processing system is disclosed. The system can include a substrate support in a plasma processing chamber. The substrate support can support a substrate. The system can also include a substrate support bias supply that provides a periodic voltage function. The system can further include an ion current compensation component that provides an ion current compensation. The ion current compensation can be combined with the periodic voltage function to form a modified periodic voltage function, which can be provided to the substrate support. In turn, effects a direct current voltage on a surface of the substrate opposite to the substrate support. This in turn controls an ion energy of ions incident on the surface of the substrate opposite to the substrate support. The modified periodic voltage function can have a first portion, a second portion, and a third portion. The first portion can include a rapidly increasing voltage while the second portion can include a substantially constant voltage. The third portion can include a sloped voltage having a starting voltage that is a voltage step, $\Delta V$, below the substantially constant voltage. The voltage step, $\Delta V$, can correspond to the ion energy, and a slope, $dV_0/dt$, can be controlled by the ion current compensation. The system can further include a controller having a non-transitory, tangible computer readable storage medium encoded with processor readable instruction to: access an effective capacitance of the substrate support, $C_1$; measure the slope, $dV_0/dt$, for at least two ion current compensation values; and calculate ion current, $I_I$, as a function of the effective capacitance, $C_1$, and the slope, $dV_0/dt$.

In yet another aspect of the disclosure, a non-transitory tangible computer readable storage medium is disclosed. The storage medium can be encoded with processing readable instructions to perform a method for controlling characteristics of an ion energy distribution function of ions from a plasma that are incident on a substrate within a plasma processing chamber. The method can include accessing an effective capacitance, $C_1$, of a substrate support supporting the substrate. The method can also include controlling a periodic voltage function provided by a substrate bias supply and an ion current compensation provided by an ion current compensation component. A combination of the periodic voltage function and the ion current compensation can be referred to as a modified periodic voltage function. The modified periodic voltage function can be provided to the substrate support in order to effect a potential on a surface of the substrate opposite to the substrate support and thereby control an ion energy, eV, of ions incident on the substrate from the plasma. The method can further include taking measurements of the modified periodic voltage function and repeatedly calculating an ion current, $I_I$, in the plasma based on the measurements.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 34 is an embodiment of a virtual front panel.

DETAILED DESCRIPTION

Figure 1:
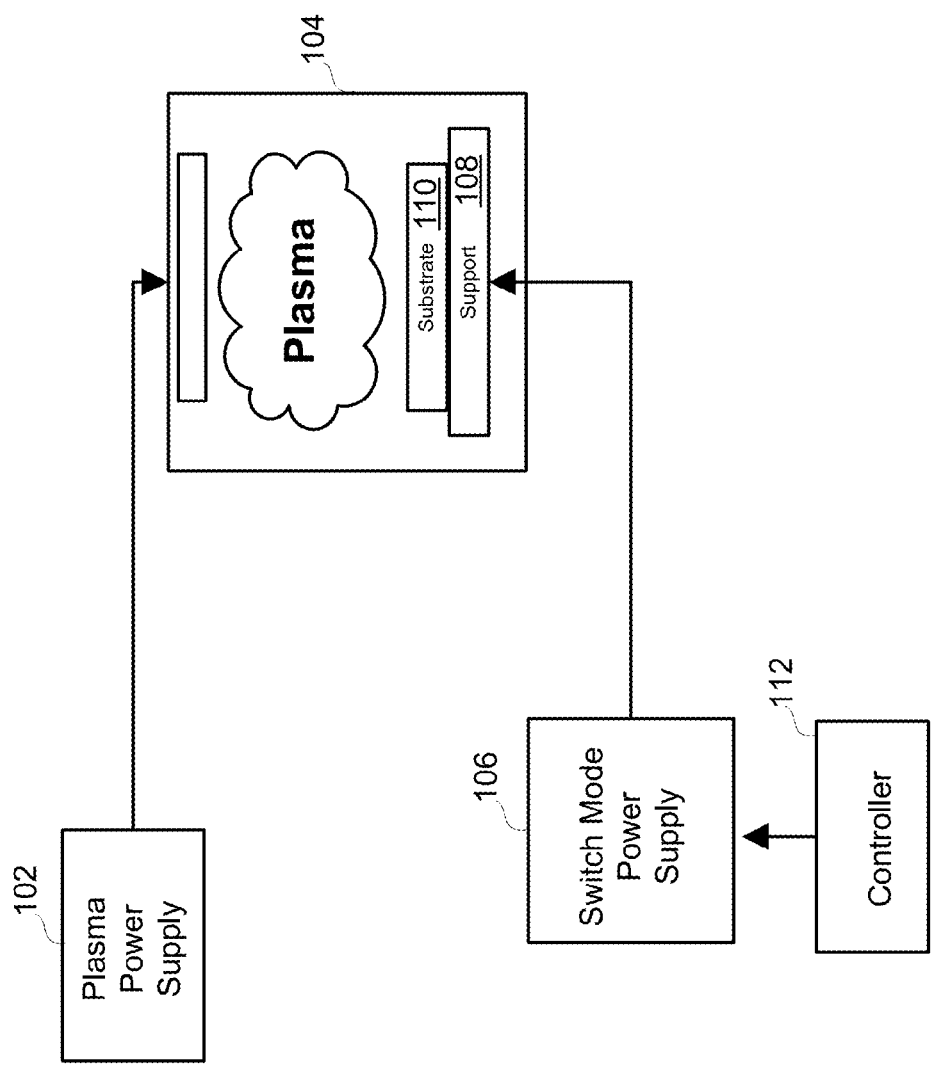
FIG. 1 is an embodiment of a plasma processing system.

An exemplary embodiment of a plasma processing system is shown generally in FIG. 1. As depicted, a plasma power supply 102 is coupled to a plasma processing chamber 104 and a switch-mode power supply 106 is coupled to a support 108 upon which a substrate 110 rests within the chamber 104. Also shown is a controller 112 that is coupled to the switch-mode power supply 106.

In this exemplary embodiment, the plasma processing chamber 104 may be realized by chambers of substantially conventional construction (e.g., including a vacuum enclosure which is evacuated by a pump or pumps (not shown)). And, as one of ordinary skill in the art will appreciate, the plasma excitation in the chamber 104 may be by any one of a variety of sources including, for example, a helicon type plasma source, which includes magnetic coil and antenna to ignite and sustain a plasma 114 in the reactor, and a gas inlet may be provided for introduction of a gas into the chamber 104.

As depicted, the exemplary plasma chamber 104 is arranged and configured to carry out plasma-assisted etching of materials utilizing energetic ion bombardment of the substrate 110, and other plasma processing (e.g., plasma deposition and plasma assisted ion implantation). The plasma power supply 102 in this embodiment is configured to apply power (e.g., RF power) via a matching network (not shown)) at one or more frequencies (e.g., 13.56 MHz) to the chamber 104 so as to ignite and sustain the plasma 114. It should be understood that the present invention is not limited to any particular type of plasma power supply 102 or source to couple power to the chamber 104, and that a variety of frequencies and power levels may be may be capacitively or inductively coupled to the plasma 114.

As depicted, a dielectric substrate 110 to be treated (e.g., a semiconductor wafer), is supported at least in part by a support 108 that may include a portion of a conventional wafer chuck (e.g., for semiconductor wafer processing). The support 108 may be formed to have an insulating layer between the support 108 and the substrate 110 with the substrate 110 being capacitively coupled to the platforms but may float at a different voltage than the support 108.

As discussed above, if the substrate 110 and support 108 are conductors, it is possible to apply a non-varying voltage to the support 108, and as a consequence of electric conduction through the substrate 110, the voltage that is applied to the support 108 is also applied to the surface of the substrate 110.

When the substrate 110 is a dielectric, however, the application of a non-varying voltage to the support 108 is ineffective to place a voltage across the treated surface of the substrate 110. As a consequence, the exemplary switch-mode power supply 106 is configured to be controlled so as to effectuate a voltage on the surface of the substrate 110 that is capable of attracting ions in the plasma 114 to collide with the substrate 110 so as to carry out a controlled etching and/or deposition of the substrate 110, and/or other plasma-assisted processes.

Moreover, as discussed further herein, embodiments of the switch-mode power supply 106 are configured to operate so that there is an insubstantial interaction between the power applied (to the plasma 114) by the plasma power supply 102 and the power that is applied to the substrate 110 by the switch-mode power supply 106. The power applied by the switch-mode power supply 106, for example, is controllable so as to enable control of ion energy without substantially affecting the density of the plasma 114.

Furthermore, many embodiments of the exemplary switch-mode supply 106 depicted in FIG. 1 are realized by relatively inexpensive components that may be controlled by relatively simple control algorithms. And as compared to prior art approaches, many embodiments of the switch mode power supply 106 are much more efficient; thus reducing energy costs and expensive materials that are associated with removing excess thermal energy.

One known technique for applying a voltage to a dielectric substrate utilizes a high-power linear amplifier in connection with complicated control schemes to apply power to a substrate support, which induces a voltage at the surface of the substrate. This technique, however, has not been adopted by commercial entities because it has not proven to be cost effective nor sufficiently manageable. In particular, the linear amplifier that is utilized is typically large, very expensive, inefficient, and difficult to control. Furthermore, linear amplifiers intrinsically require AC coupling (e.g., a blocking capacitor) and auxiliary functions like chucking are achieved with a parallel feed circuit which harms AC spectrum purity of the system for sources with a chuck.

Another technique that has been considered is to apply high frequency power (e.g., with one or more linear amplifiers) to the substrate. This technique, however, has been found to adversely affect the plasma density because the high frequency power that is applied to the substrate affects the plasma density.

In some embodiments, the switch-mode power supply 106 depicted in FIG. 1 may be realized by buck, boost, and/or buck-boost type power technologies. In these embodiments, the switch-mode power supply 106 may be controlled to apply varying levels of pulsed power to induce a potential on the surface of the substrate 110.

Figure 2:
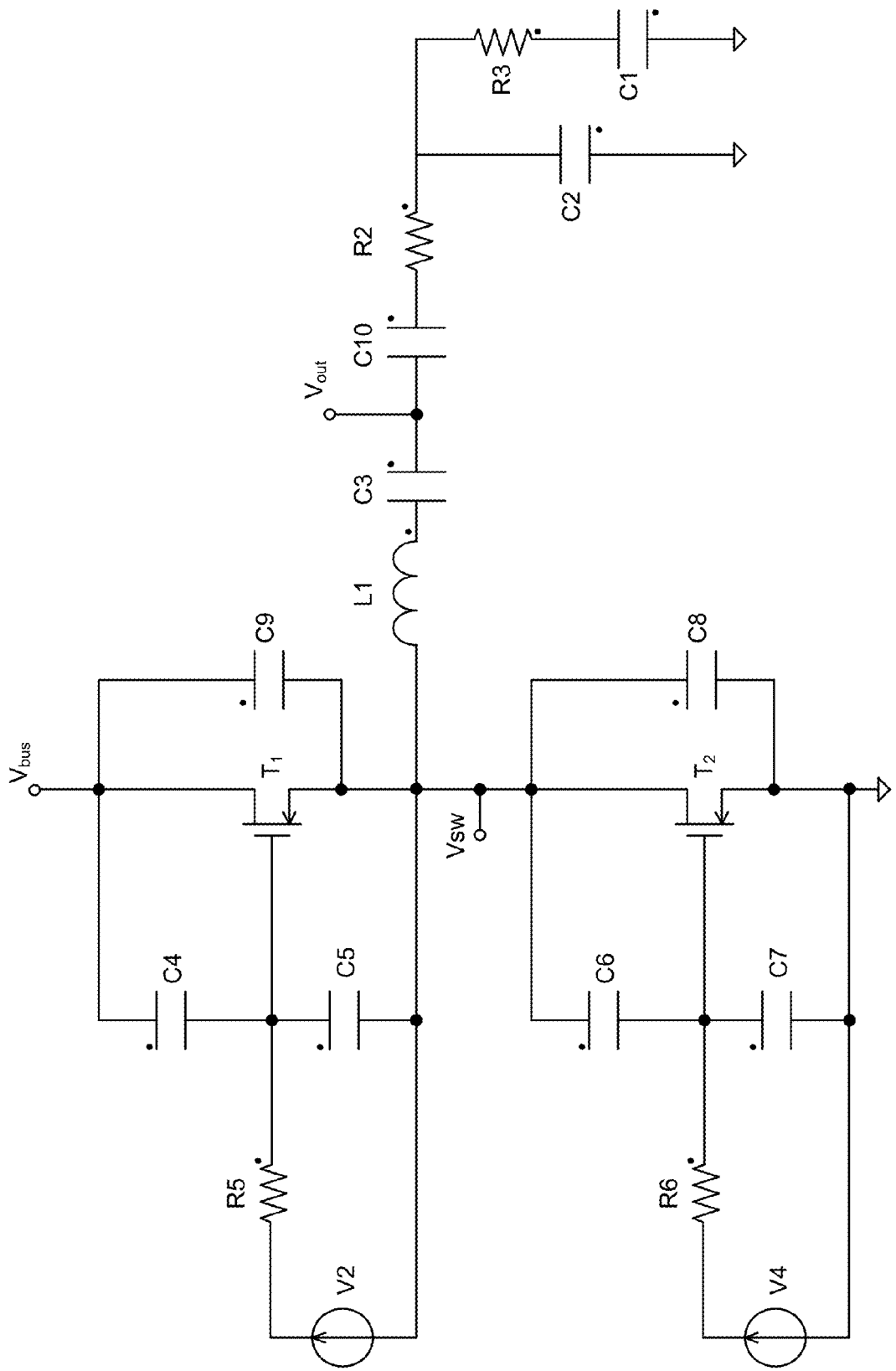
FIG. 2 is a schematic representation of components that may be utilized to realize a switch-mode bias supply.

Referring next to FIG. 2, it is a schematic representation of components that may be utilized to realize a switch-mode bias supply. As shown, the switching components $T_1$ and $T_2$ in this embodiment are arranged in a half-bridge (also referred to as or totem pole) type topology. Collectively, R2, R3, C1, and C2 represent a plasma load, C10 is an effective capacitance (also referred to herein as a series capacitance or a chuck capacitance), and C3 is an optional physical capacitor to prevent DC current from the voltage induced on the surface of the substrate or from the voltage of an electrostatic chuck (not shown) from flowing through the circuit. C10 is referred to as the effective capacitance because it includes the series capacitance (or also referred to as a chuck capacitance) of the substrate support and the electrostatic chuck (or e-chuck) as well as other capacitances inherent to the application of a bias such as the insulation and substrate. As depicted, L1 is stray inductance (e.g., the natural inductance of the conductor that feeds the power to the load). And in this embodiment, there are three inputs: $V_{bus}$, V2, and V4.

V2 and V4 represent drive signals, and in this embodiment, V2 and V4 can be timed (e.g., the length of the pulses and/or the mutual delay) so that the closure of $T_1$ and $T_2$ may be modulated to control the shape of the voltage output $V_{out}$, which is applied to the substrate support. In many implementations, the transistors used to realize the switching components $T_1$ and $T_2$ are not ideal switches, so to arrive at a desired waveform, the transistor-specific characteristics are taken into consideration. In many modes of operation, simply changing the timing of V2 and V4 enables a desired waveform to be applied at $V_{out}$.

For example, the switches $T_1$, $T_2$ may be operated so that the voltage at the surface of the substrate 110 is generally negative with periodic voltage pulses approaching and/or slightly exceeding a positive voltage reference. The value of the voltage at the surface of the substrate 110 is what defines the energy of the ions, which may be characterized in terms of an ion energy distribution function (IEDF). To effectuate desired voltage(s) at the surface of the substrate 110, the pulses at $V_{out}$ may be generally rectangular and have a width that is long enough to induce a brief positive voltage at the surface of the substrate 110 so as to attract enough electrons to the surface of the substrate 110 in order to achieve the desired voltage(s) and corresponding ion energies.

The periodic voltage pulses that approach and/or slightly exceed the positive voltage reference may have a minimum time limited by the switching abilities of the switches $T_1$, $T_2$. The generally negative portions of the voltage can extend so long as the voltage does not build to a level that damages the switches. At the same time, the length of negative portions of the voltage should exceed an ion transit time.

$V_{bus}$ in this embodiment defines the amplitude of the pulses measured at $V_{out}$, which defines the voltage at the surface of the substrate, and as a consequence, the ion energy.

Figure 3:
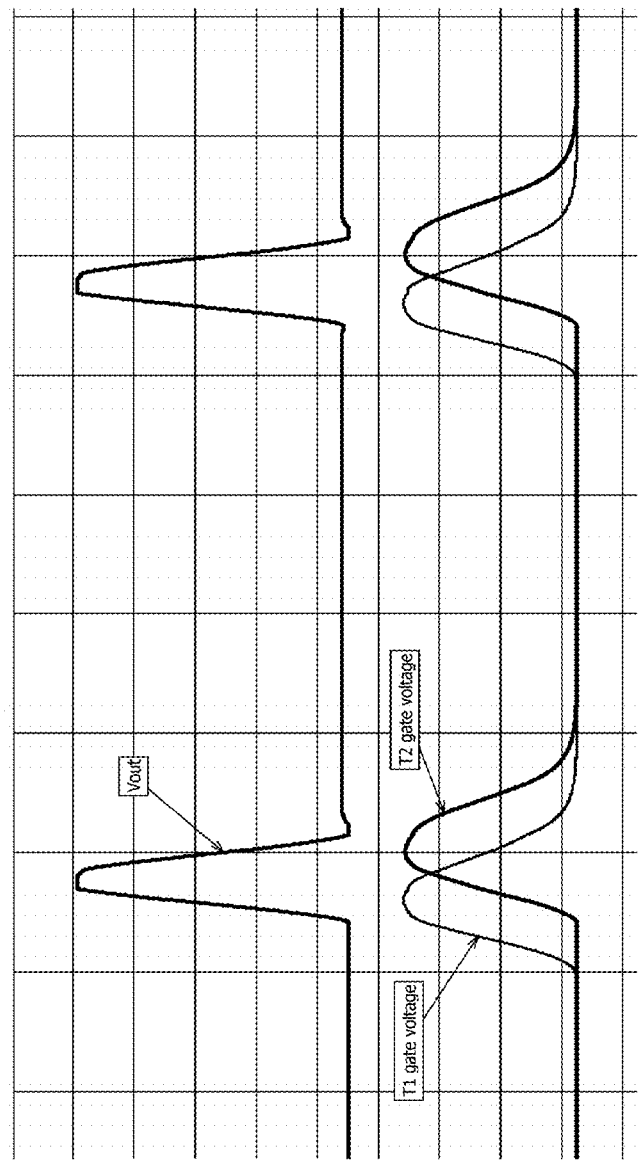
FIG. 3 is a timing diagram depicting two drive signal waveforms that may be applied to $T_1$ and $T_2$ (as V2 and V4) so as to generate the periodic voltage function at $V_{out}$.

The pulse width, pulse shape, and/or mutual delay of the two signals V2, V4 may be modulated to arrive at a desired waveform at $V_{out}$ (also referred to herein as a modified periodic voltage function), and the voltage applied to $V_{bus}$ may affect the characteristics of the pulses. In other words, the voltage $V_{bus}$ may affect the pulse width, pulse shape and/or the relative phase of the signals V2, V4. Referring briefly to FIG. 3, for example, shown is a timing diagram depicting two drive signal waveforms that may be applied to $T_1$ and $T_2$ (as V2 and V4) so as to generate the periodic voltage function at $V_{out}$. To modulate the shape of the pulses at $V_{out}$ (e.g. to achieve the smallest time for the pulse at $V_{out}$, yet reach a peak value of the pulses) the timing of the two gate drive signals V2, V4 may be controlled.

For example, the two gate drive signals V2, V4 may be applied to the switching components $T_1$, $T_2$ so the time that each of the pulses is applied at $V_{out}$ may be short compared to the time t between pulses, but long enough to induce a positive voltage at the surface of the substrate 110 to attract electrons to the surface of the substrate 110. Moreover, it has been found that by changing the gate voltage level between the pulses, it is possible to control the slope of the voltage that is applied to $V_{out}$ between the pulses (e.g., to achieve a substantially constant voltage at the surface of the substrate between pulses). In some modes of operation, the repetition rate of the gate pulses is about 400 kHz, but this rate may certainly vary from application to application.

Although not required, in practice, based upon modeling and refining upon actual implementation, waveforms that may be used to generate the desired (or defined) ion energy distributions may be defined, and the waveforms can be stored (e.g., in the waveform memory portion described with reference to FIG. 1 as a sequence of voltage levels). In addition, in many implementations, the waveforms can be generated directly (e.g., without feedback from $V_{out}$); thus avoiding the undesirable aspects of a feedback control system (e.g., settling time).

Figure 4:
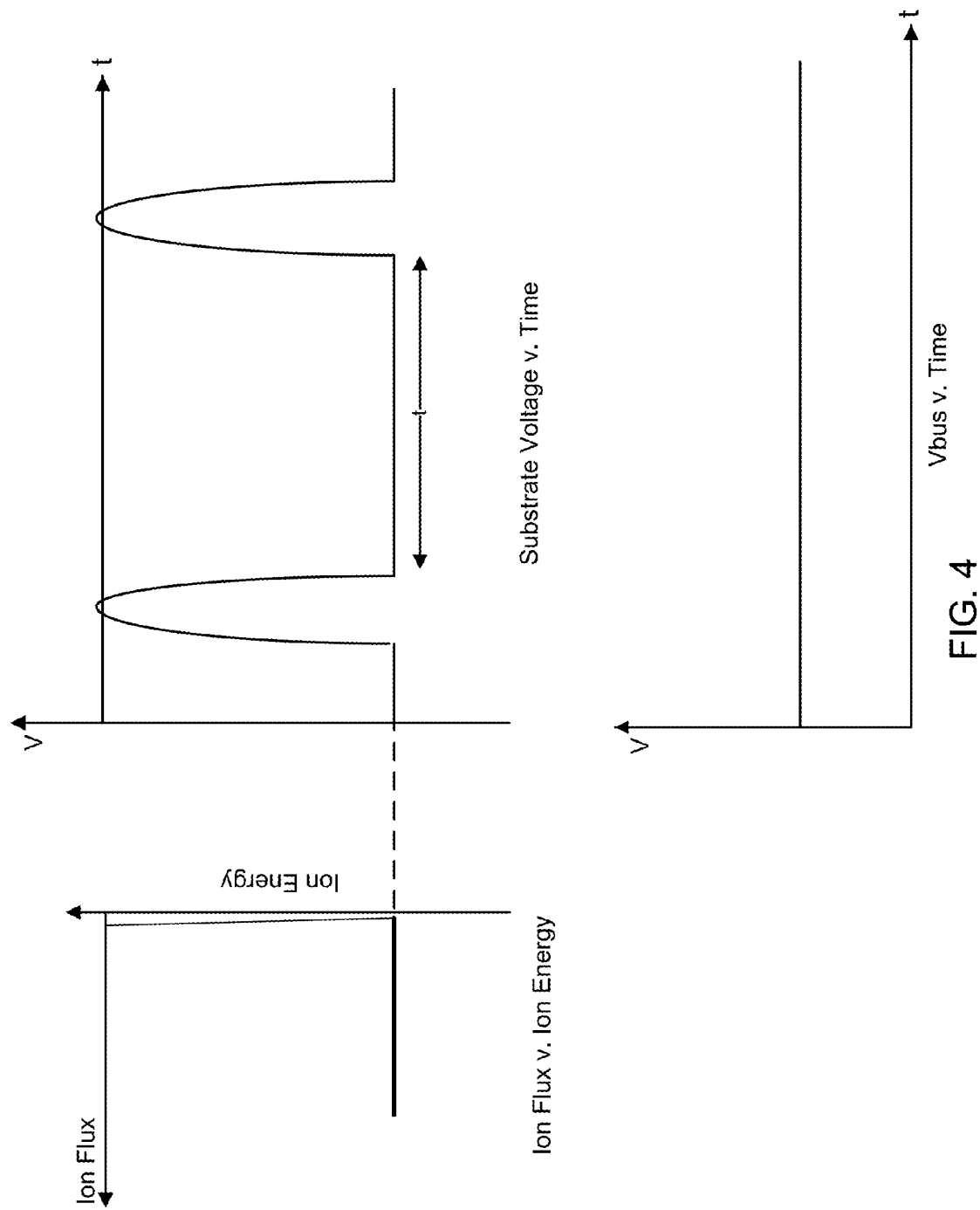
FIG. 4 is a graphs depicting $V_{bus}$ versus time, voltage at the surface of the substrate versus time, and the corresponding ion energy distribution.

Referring again to FIG. 2, $V_{bus}$ can be modulated to control the energy of the ions, and the stored waveforms may be used to control the gate drive signals V2, V4 to achieve a desired pulse amplitude at $V_{out}$ while minimizing the pulse width. Again, this is done in accordance with the particular characteristics of the transistors, which may be modeled or implemented and empirically established. Referring to FIG. 4, for example, shown are graphs depicting $V_{bus}$ versus time, voltage at the surface of the substrate 110 versus time, and the corresponding ion energy distribution.

The graphs in FIG. 4 depict a single mode of operating the switch mode bias supply 106, which effectuates an ion energy distribution (or ion energy distribution function (IEDF)) that is concentrated at a particular ion energy. As depicted, to effectuate the single concentration of ion energies in this example, the voltage applied at $V_{bus}$ is maintained constant while the voltages applied to V2 and V4 are controlled (e.g., using the drive signals depicted in FIG. 3) so as to generate pulses at the output of the switch-mode bias supply 106, which effectuates the corresponding ion energy distribution shown in FIG. 4.

As depicted in FIG. 4, the potential at the surface of the substrate 110 is generally negative to attract the ions that bombard and etch the surface of the substrate 110. The periodic short pulses that are applied to the substrate 110 (by applying pulses to $V_{out}$) have a magnitude defined by the potential that is applied to $V_{bus}$ and these pulses cause a brief change in the potential of the substrate 110 (e.g., close to positive or slightly positive potential), which attracts electrons to the surface of the substrate to achieve the generally negative potential along the surface of the substrate 110. As depicted in FIG. 4, the constant voltage applied to $V_{bus}$ effectuates a single concentration of ion flux at particular ion energy; thus a particular ion bombardment energy may be selected by simply setting $V_{bus}$ to a particular potential. In other modes of operation, two or more separate concentrations of ion energies may be created (e.g., see FIGS. 5, 20, 23, 25, 26, 27).

One of skill in the art will recognize that the power supply need not be limited to a switch-mode power supply, and as such the output of the power supply can also be controlled in order to effect a certain ion energy. As such, the output of the power supply, whether switch-mode or otherwise, when considered without being combined with an ion current compensation or an ion current, can also be referred to as a power supply voltage, $V_{PS}$.

Figure 5:
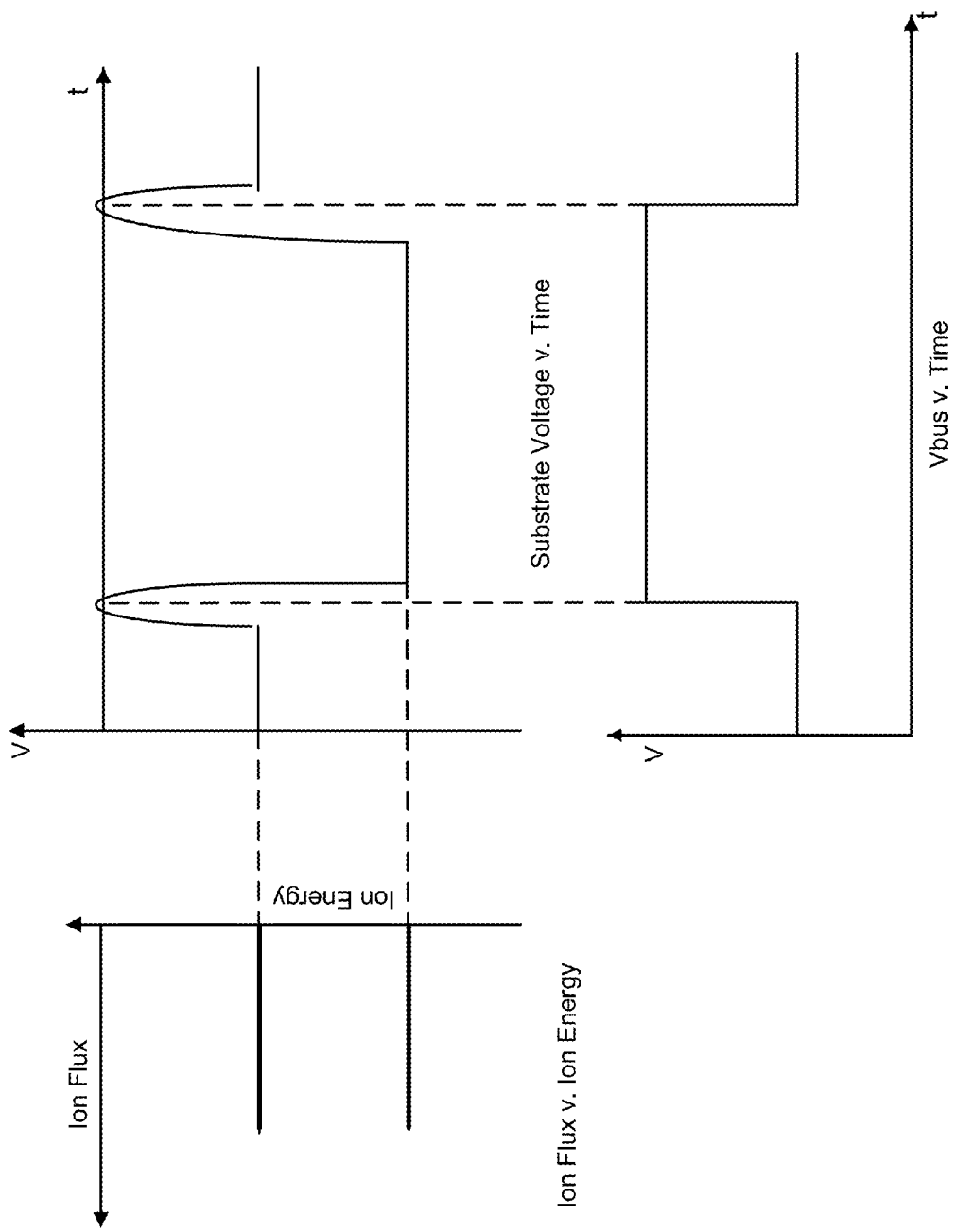
FIG. 5 is a single mode of operating the switch mode bias supply, which effectuates an ion energy distribution (or ion energy distribution function (IEDF)) that is concentrated at a particular ion energy.

Referring next to FIG. 5, for example, shown are graphs depicting a bi-modal mode of operation in which two separate peaks in ion energy distribution are generated. As shown, in this mode of operation, the substrate experiences two distinct levels of voltages and periodic pulses, and as a consequence, two separate concentrations of ion energies are created. As depicted, to effectuate the two distinct ion energy concentrations, the voltage that is applied at $V_{bus}$ alternates between two levels, and each level defines the energy level of the two ion energy concentrations.

Although FIG. 5 depicts the two voltages at the substrate 110 as alternating after every pulse (e.g., FIGS. 25 and 27), this is certainly not required. In other modes of operation for example, the voltages applied to V2 and V4 are switched (e.g., using the drive signals depicted in FIG. 3) relative to the voltage applied to $V_{out}$ so that the induced voltage at the surface of the substrate alternates from a first voltage to a second voltage (and vice versa) after two or more pulses (e.g., FIG. 26).

In prior art techniques, attempts have been made to apply the combination of two waveforms (generated by waveform generators) to a linear amplifier and apply the amplified combination of the two waveforms to the substrate in order to effectuate multiple ion energies. This approach, however, is much more complex then the approach described with reference to FIG. 5, and requires an expensive linear amplifier, and waveform generators.

Figure 6:
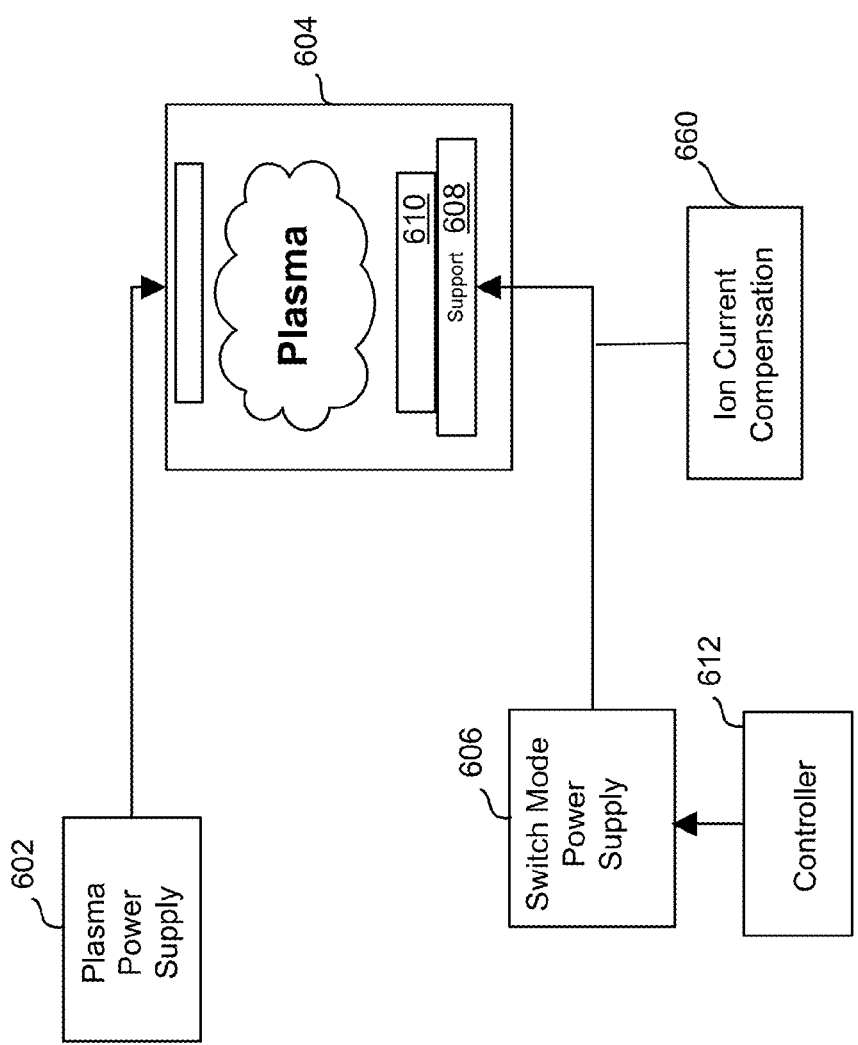
FIG. 6 is a block diagram depicting an embodiment in which an ion current compensation component compensates for ion current in the plasma chamber.

Referring next to FIG. 6, it is a block diagram depicting an embodiment in which an ion current compensation component 660 compensates for ion current in the plasma chamber 604. Applicants have found that, at higher energy levels, higher levels of ion current within the chamber affect the voltage at the surface of the substrate, and as a consequence, the ion energy distribution is also affected.

Figure 7:
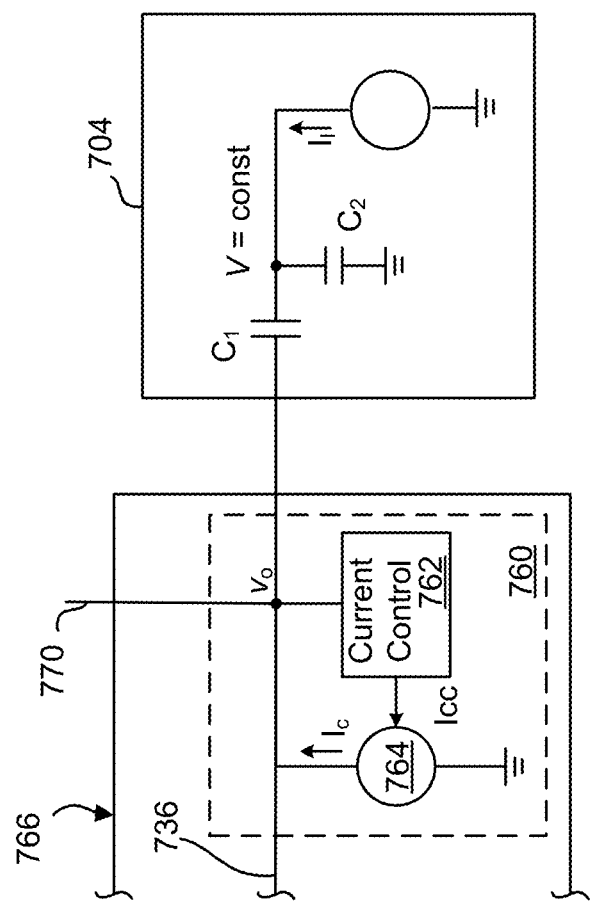
FIG. 7 is an exemplary ion current compensation component.

The ion current compensation component 660 may be realized as a separate accessory that may optionally be added to the switch mode power supply 606 and controller 612. In other embodiments, (e.g., as depicted in FIG. 7) the ion current compensation component 660 may share a common housing 766 (see FIG. 7) with other components described herein (e.g., the switch-mode power supply 106, 606 and ion current compensation 660). In this embodiment, the periodic voltage function provided to the plasma chamber 604 can be referred to as a modified periodic voltage function since it comprises the periodic voltage function modified by the ion current compensation from ion current compensation component 660. The controller 612 can sample a voltage, $V_O$, at different times at an electrical node where outputs of the switch mode power supply 606 and the ion current compensation 660 combine.

As depicted in FIG. 7, shown is an exemplary ion current compensation component 760 that includes a current source 764 coupled to an output 736 of a switch mode supply and a current controller 762 that is coupled to both the current source 764 and the output 736. Also depicted in FIG. 7 is a plasma chamber 704, and within the plasma chamber are capacitive elements $C_1$, $C_2$, and ion current $I_I$. As depicted, $C_1$ represents the inherent capacitance (also referred to herein as effective capacitance) of components associated with the chamber 704, which may include, but is not limited to, insulation, the substrate, substrate support, and an e-chuck, and $C_2$ represents sheath capacitance and stray capacitances. In this embodiment, the periodic voltage function provided to the plasma chamber 704, and measurable as $V_O$, can be referred to as a modified periodic voltage function since it comprises the periodic voltage function modified by the ion current compensation, $I_C$.

The sheath (also herein referred to as a plasma sheath) is a layer in a plasma near the substrate surface and possibly walls of the plasma processing chamber with a high density of positive ions and thus an overall excess of positive charge. The surface with which the sheath is in contact with typically has a preponderance of negative charge. The sheath arises by virtue of the faster velocity of electrons than positive ions thus causing a greater proportion of electrons to reach the substrate surface or walls, thus leaving the sheath depleted of electrons. The sheath thickness, $\lambda_{sheath}$, is a function of plasma characteristics such as plasma density and plasma temperature.

It should be noted that because $C_1$ in this embodiment is an inherent (also referred to herein as effective) capacitance of components associated with the chamber 704, it is not a capacitance that can be controlled during processing. For example, some prior art approaches that utilize a linear amplifier couple bias power to the substrate with a blocking capacitor, and then utilize a monitored voltage across the blocking capacitor as feedback to control their linear amplifier. Although a capacitor could couple a switch mode power supply to a substrate support in many of the embodiments disclosed herein, it is unnecessary to do so because feedback control using a blocking capacitor is not required in several embodiments of the present invention.

Figure 8:
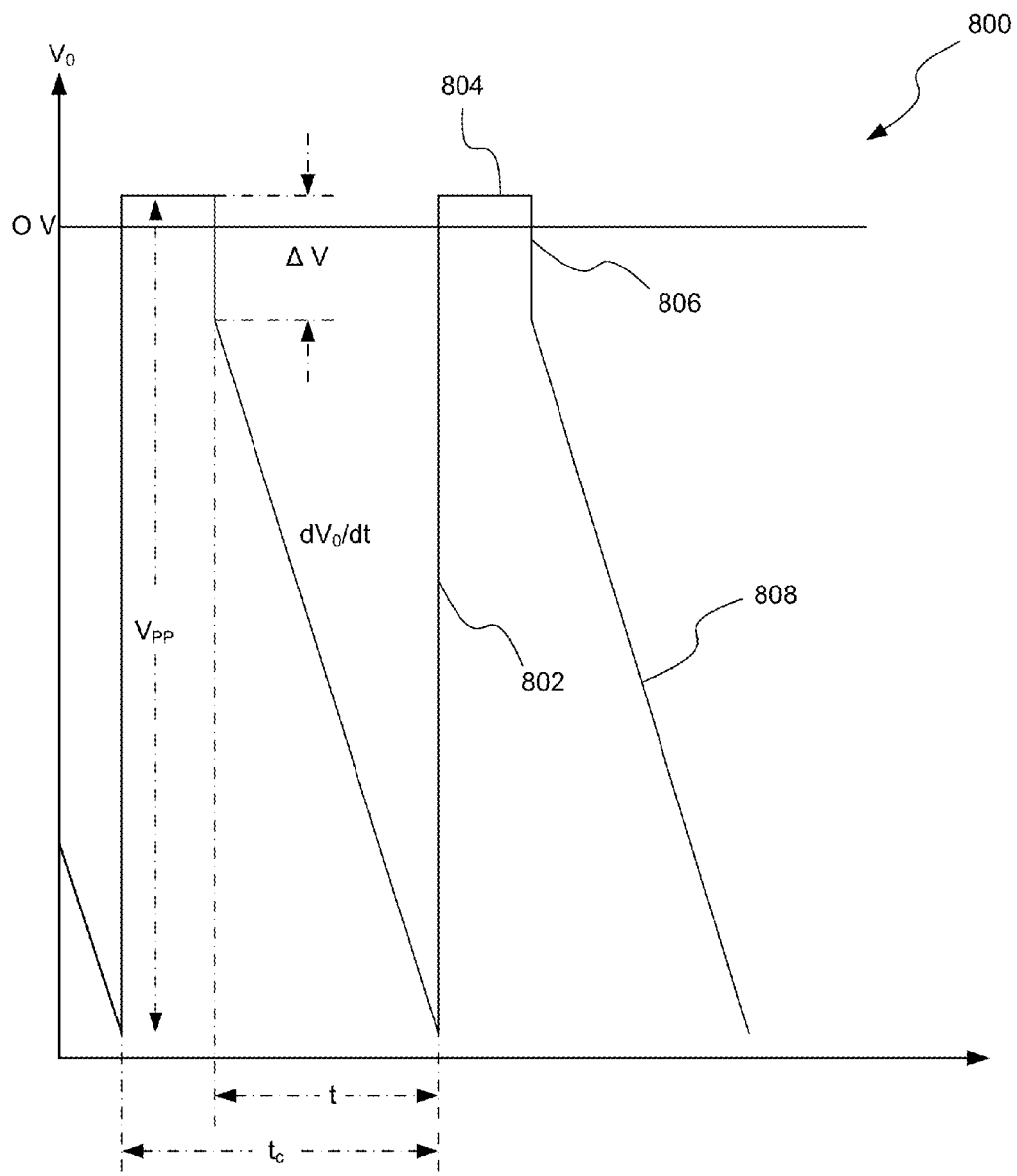
FIG. 8 is graph depicting an exemplary voltage (e.g., the modified periodic voltage function) at $V_O$.

While referring to FIG. 7, simultaneous reference is made to FIG. 8, which is a graph depicting an exemplary voltage (e.g., the modified periodic voltage function) at $V_0$ depicted in FIG. 7. In operation, the current controller 762 monitors the voltage (the modified periodic voltage function) at $V_0$. Ion current is calculated over an interval t or some sub portion thereof (depicted in FIG. 8) as:

$$I_I = C_1 \frac{dV_O}{dt} \quad \text{(Equation 1)}$$

Ion current, $I_I$, and inherent capacitance (also referred to as effective capacitance), $C_1$, can either or both be time varying. Because $C_1$ is substantially constant for a given tool and is measurable, only $V_O$ needs to be monitored to enable ongoing control of compensation current. As discussed above, to obtain a more mono-energetic distribution of ion energy the current controller controls the current source 764 so that $I_C$ is substantially the same as $I_I$ (or in the alternative, related according to Equation 3). In this way, a narrow spread of ion energies may be maintained even when the ion current reaches a level that affects the voltage at the surface of the substrate.

Also depicted in FIG. 7 is a feedback line 770, which may be utilized in connection with controlling an ion energy distribution. For example, the value of $\Delta V$ (also referred to herein as a voltage step or the third portion 806) depicted in FIG. 8, is indicative of instantaneous ion energy and may be used in many embodiments as part of a feedback control loop. In one embodiment, the voltage step, $\Delta V$, is related to ion energy according to Equation 6. In other embodiments, the peak-to-peak voltage, $V_{PP}$, can be related to the instantaneous ion energy. Alternatively, the difference between the peak-to-peak voltage, $V_{PP}$, and the product of the slope, $dV_O/dt$, of the fourth portion 808 times time, t, can be correlated to the instantaneous ion energy (e.g., $V_{PP} - dV_O/dt \cdot t$).

Figure 16:
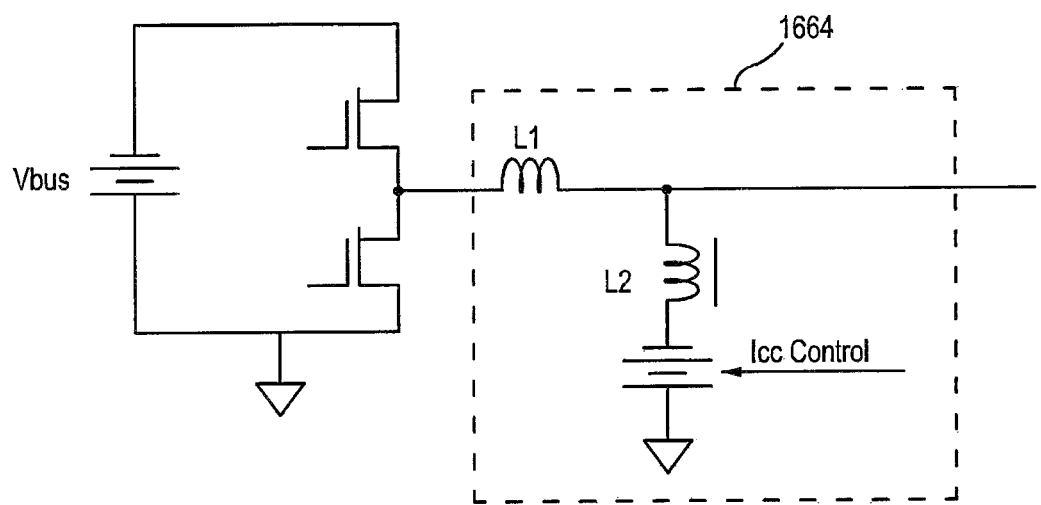
FIG. 16 is an exemplary embodiment of a current source, which may be implemented to realize the current source described with reference to FIG. 7.

Referring next to FIG. 16, shown is an exemplary embodiment of a current source 1664, which may be implemented to realize the current source 764 described with reference to FIG. 7. In this embodiment, a controllable negative DC voltage source, in connection with a series inductor L2, function as a current source, but one of ordinary skill in the art will appreciate, in light of this specification, that a current source may be realized by other components and/or configurations.

Figure 17:
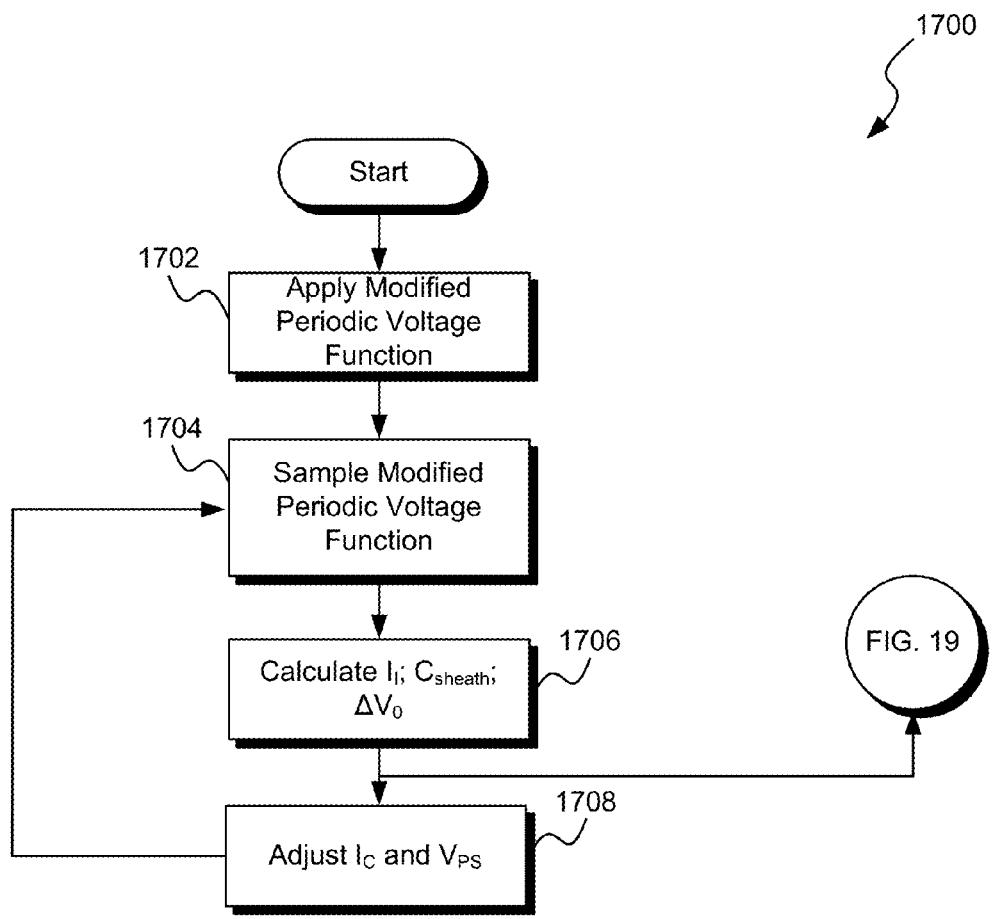
FIG. 17 is one embodiment of a method of controlling an ion energy distribution of ions impacting a surface of a substrate.

FIG. 17 illustrates one embodiment of a method of controlling an ion energy distribution of ions impacting a surface of a substrate. The method 1700 starts by applying a modified periodic voltage function 1702 (see the modified periodic voltage function 802 in FIG. 8) to a substrate support supporting a substrate within a plasma processing chamber. The modified periodic voltage function can be controlled via at least two 'knobs' such as an ion current compensation, $I_C$, (see $I_C$ 2104 in FIG. 21) and a power supply voltage, $V_{PS}$, (see power supply voltage 2106 in FIG. 21). An exemplary component for generating the power supply voltage is the switch mode power supply 106 in FIG. 1. In order to help explain the power supply voltage, $V_{PS}$, it is illustrated herein as if measured without coupling to the ion current and ion current compensation. The modified periodic voltage function is then sampled at a first and second value of an ion current compensation, $I_C$, 1704. At least two samples of a voltage of the modified periodic voltage function are taken for each value of the ion current compensation, $I_C$. The sampling 1704 is performed in order to enable calculations 1706 (or determinations) of the ion current, $I_I$, and a sheath capacitance, $C_2$, 1706 (e.g., C2 in FIG. 2). Ion current, $I_I$, for instance, can be determined using Equation 1. Such determinations may involve finding an ion current compensation, $I_C$, that if applied to the substrate support (or as applied to the substrate support) would generate a narrow (e.g., minimum) ion energy distribution function (IEDF) width. The calculations 1706 can also optionally include determining a voltage step, $\Delta V$, (also known as a third portion of the modified periodic voltage function 1406) based on the sampling 1704 of the waveform of the modified periodic voltage function. The voltage step, $\Delta V$, can be related to an ion energy of ions reaching the substrate's surface. When finding the ion current, $I_I$, for the first time, the voltage step, $\Delta V$, can be ignored. Details of the sampling 1704 and the calculations 1706 will be provided in discussions of FIG. 18 to follow. Sheath capacitance, $C_2$, can be calculated via the following equation:

$$C_2 = \frac{C_1 \cdot (I_I + I_C)}{I_C - C_1 \cdot \frac{dV_0}{dt}} \quad \text{(Equation 2)}$$

Figure 19:
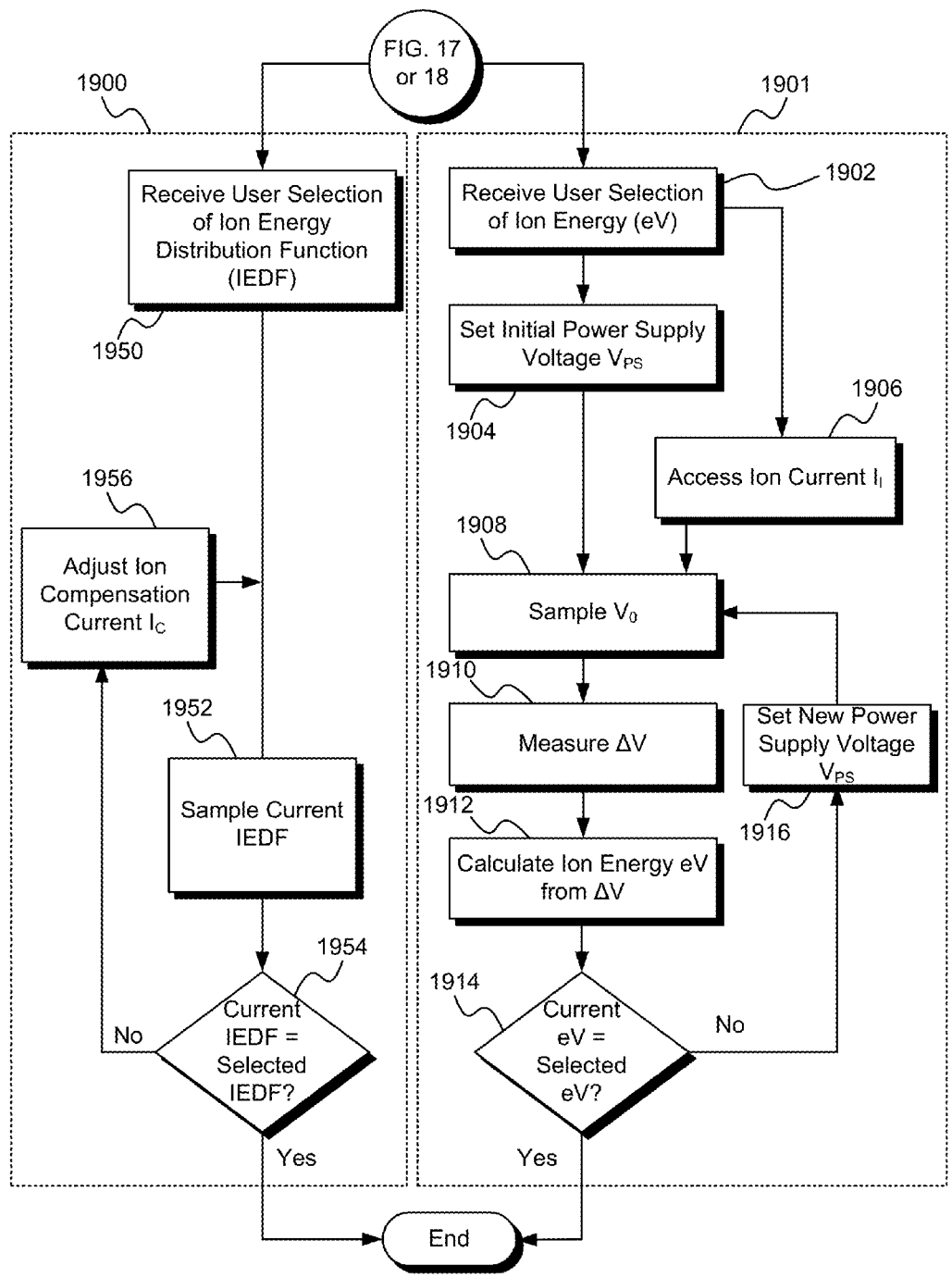
FIG. 19 shows methods for setting the IEDF width and the ion energy.
Figure 20:
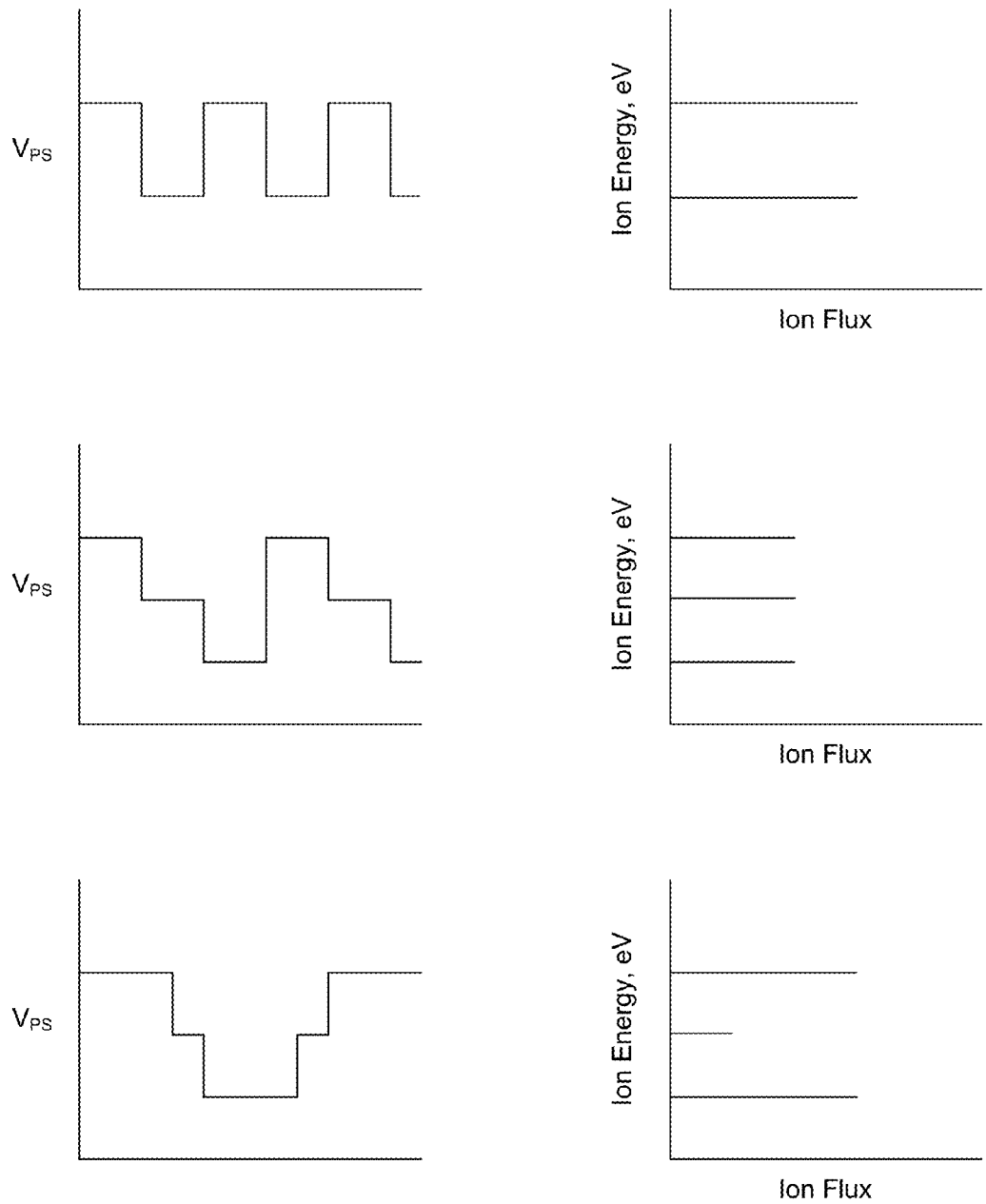
FIG. 20 illustrates three relationships between a power supply voltage, $V_{PS}$, and an ion energy distribution function.
Figure 23:
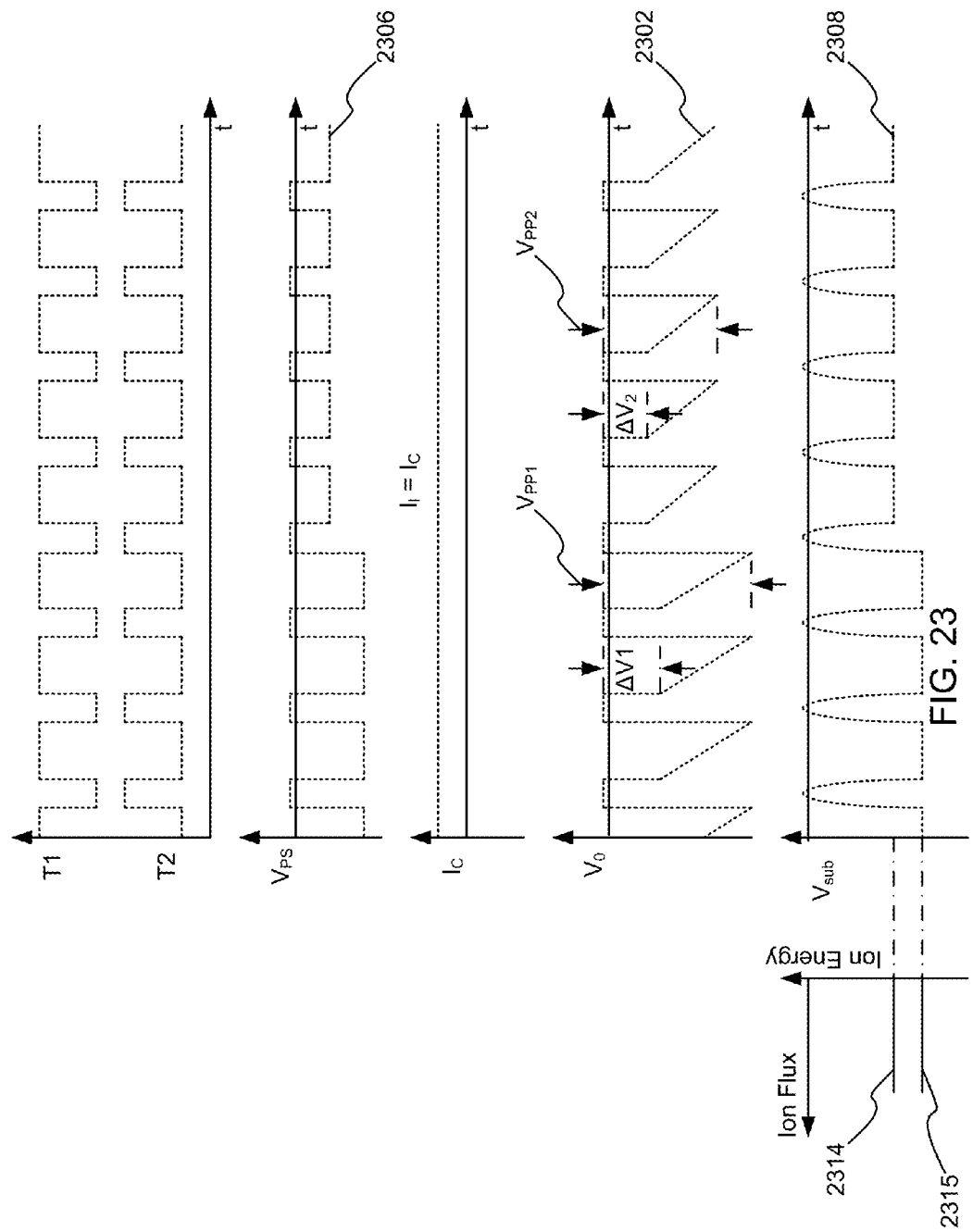
FIG. 23 is yet a embodiment of charts showing relations between power supply switch timing, periodic voltage function, ion current compensation, modified periodic voltage function, substrate surface voltage, and ion energy distribution function.
Figure 24:
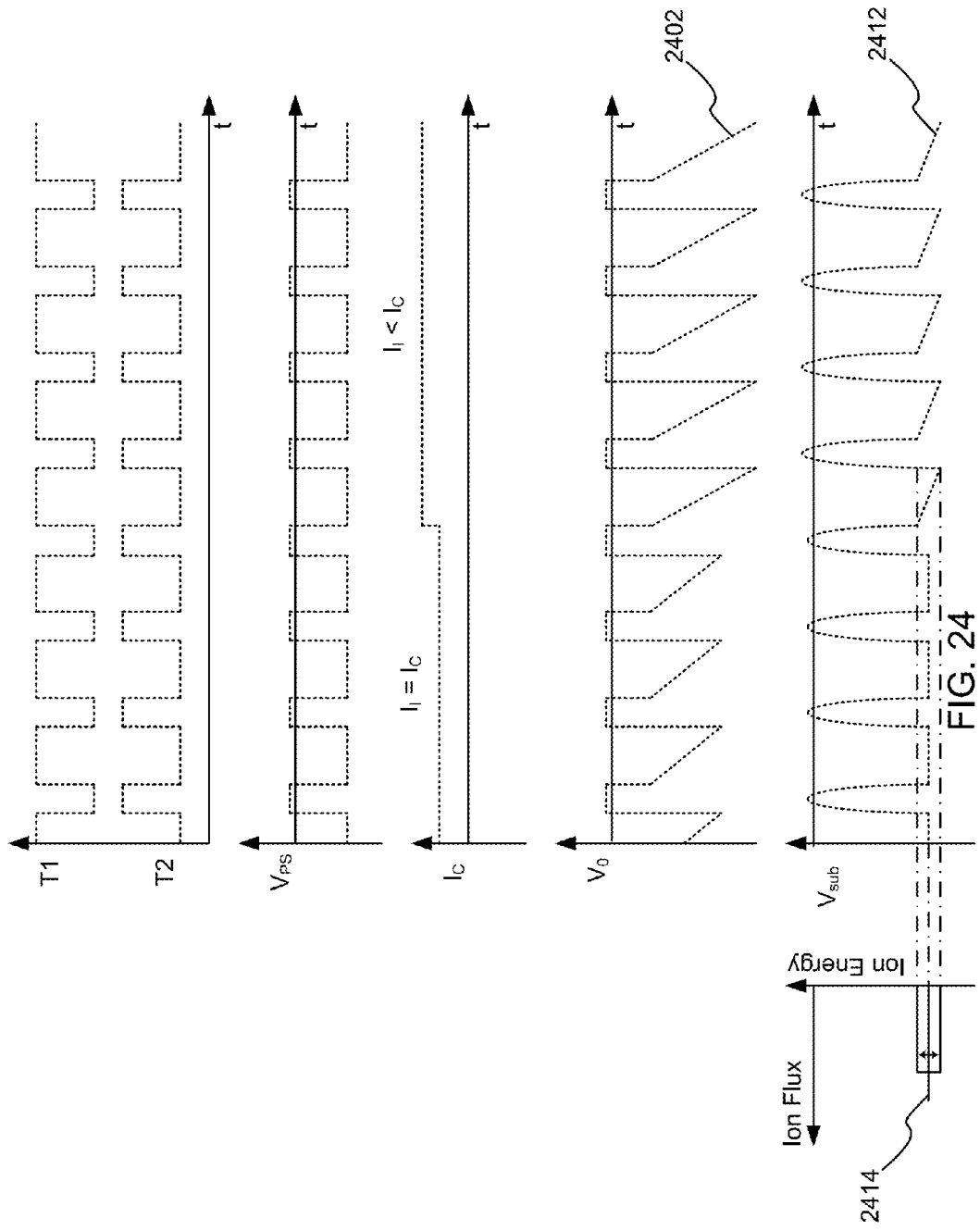
FIG. 24 is yet a embodiment of charts showing relations between power supply switch timing, periodic voltage function, ion current compensation, modified periodic voltage function, substrate surface voltage, and ion energy distribution function.

Once the ion current, $I_I$, and sheath capacitance, $C_2$, are known, the method 1700 may move to the method 1900 of FIG. 19 involving setting and monitoring an ion energy and a shape (e.g., width) of the IEDF. For instance, FIG. 23 illustrates how a change in the power supply voltage can effect a change in the ion energy. In particular, a magnitude of the illustrated power supply voltage is decreased resulting in a decreased magnitude of the ion energy. Additionally, FIG. 24 illustrates that given a narrow IEDF 2414, the IEDF can be widened by adjusting the ion current compensation, $I_C$. Alternatively or in parallel, the method 1700 can perform various metrics that make use of the ion current, $I_I$, the sheath capacitance, $C_2$, and other aspects of the waveform of the modified periodic voltage function.

In addition to setting the ion energy and/or the IEDF width, the method 1700 may adjust the modified periodic voltage function 1708 in order to maintain the ion energy and the IEDF width. In particular, adjustment of the ion current compensation, $I_C$, provided by an ion current compensation component, and adjustment of the power supply voltage may be performed 1708. In some embodiments, the power supply voltage can be controlled by a bus voltage, $V_{bus}$, of the power supply (e.g., the bus voltage $V_{bus}$ of FIG. 2). The ion current compensation, $I_C$, controls the IEDF width, and the power supply voltage controls the ion energy.

After these adjustments 1708, the modified periodic voltage function can again be sampled 1704 and calculations of ion current, $I_I$, sheath capacitance, $C_2$, and the voltage step, $\Delta V$, can again be performed 1706. If the ion current, $I_I$, or the voltage step, $\Delta V$, are other than defined values (or in the alternative, desired values), then the ion current compensation, $I_C$, and/or the power supply voltage can be adjusted 1708. Looping of the sampling 1704, calculating, 1706, and adjusting 1708 may occur in order to maintain the ion energy, eV, and/or the IEDF width.

Figure 18:
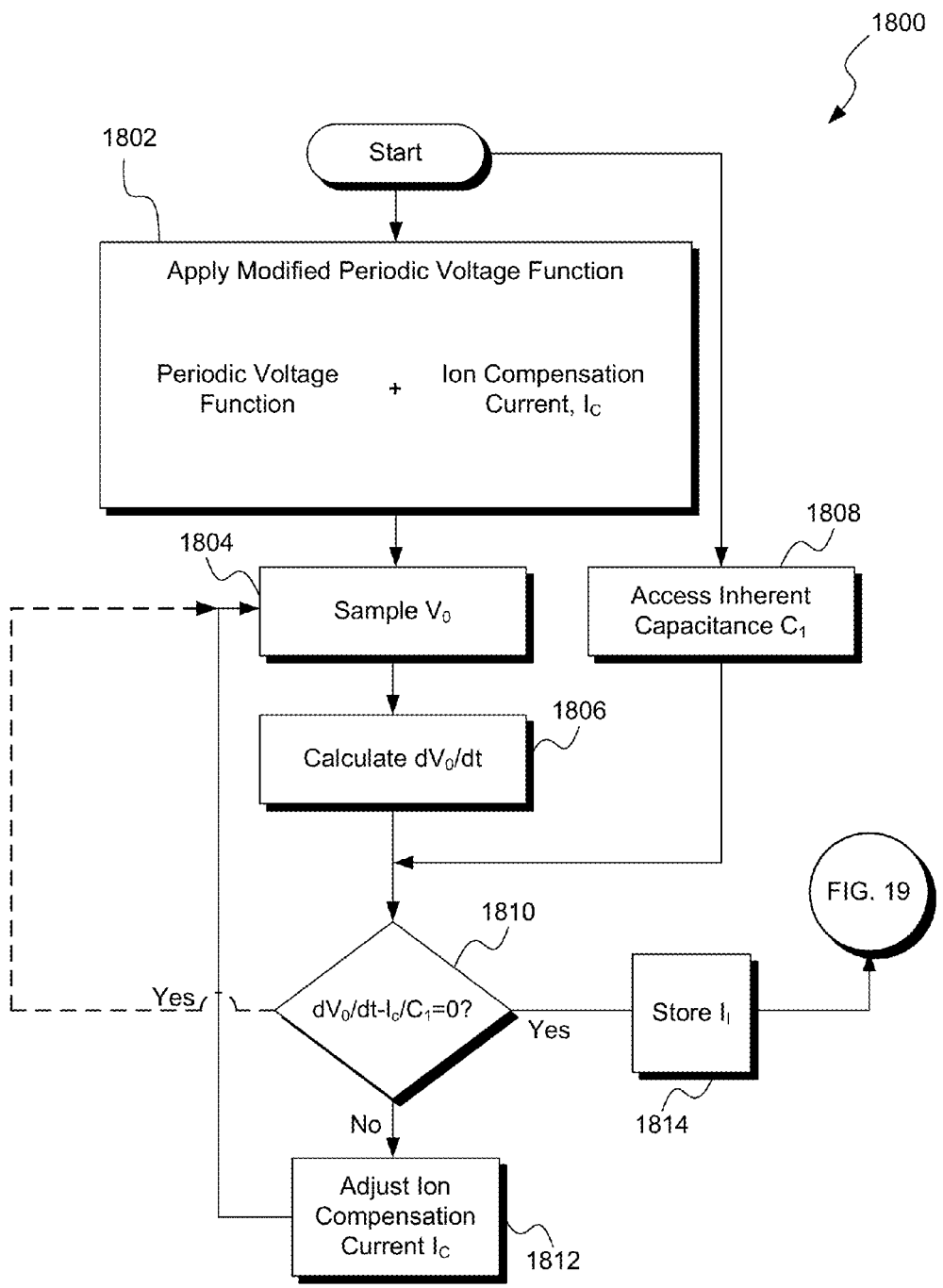
FIG. 18 is another embodiment of a method of controlling an ion energy distribution of ions impacting a surface of a substrate.

FIG. 18 illustrates another embodiment of a method of controlling an ion energy distribution of ions impacting a surface of a substrate. In some embodiments, as discussed above, it may be desirable to achieve a narrow IEDF width (e.g., a minimum IEDF width or in the alternative, ~6% full-width half maximum). As such, the method 1800 can provide a modified periodic voltage function to the chamber and to the substrate support such that a constant substrate voltage, and hence sheath voltage, exists at the surface of the substrate. This in turn accelerates ions across the sheath using a substantially constant voltage thus enabling ions to impact the substrate with substantially the same ion energy (in other words, a narrow IEDF width). For instance, in FIG. 22 it can be seen that adjusting the ion current compensation, $I_C$, can cause the substrate voltage, $V_{sub}$, between pulses to have a constant, or substantially constant voltage thus causing the IEDF to narrow.

Figure 22:
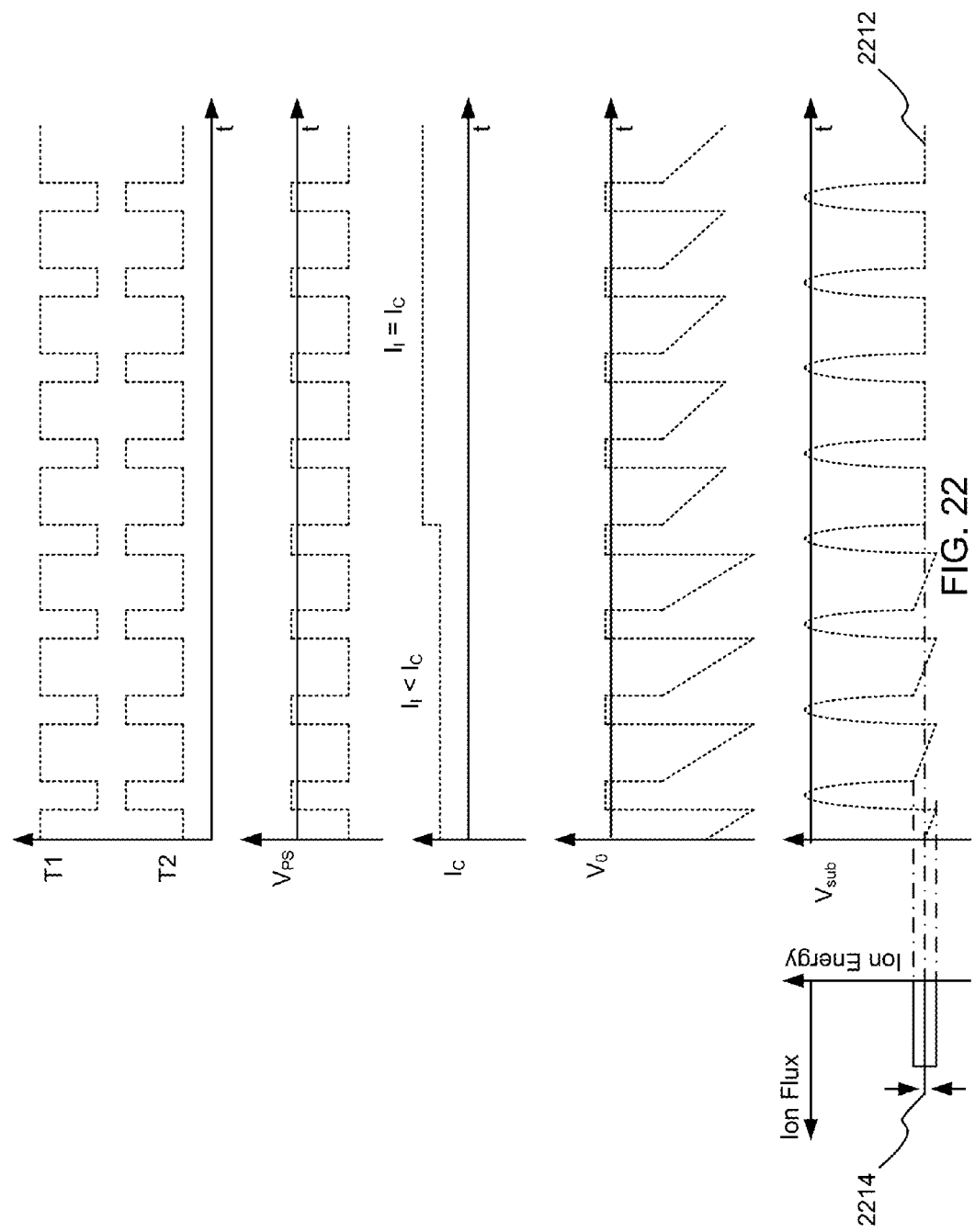
FIG. 22 is a further embodiment of charts showing relations between power supply switch timing, periodic voltage function, ion current compensation, modified periodic voltage function, substrate surface voltage, and ion energy distribution function.

Such a modified periodic voltage function is achieved when the ion current compensation, $I_C$, equals the ion current, $I_I$, assuming no stray capacitances (see the last five cycles of the periodic voltage function ($V_0$) in FIG. 22). In the alternative, where stray capacitance, $C_{stray}$, is considered, the ion current compensation, $I_C$, is related to the ion current, $I_I$, according to Equation 3:

$$I_I = I_C \frac{C_1}{C_1 + C_{stray}} \quad \text{(Equation 3)}$$

where, $C_1$, is an effective capacitance (e.g., the inherent capacitance described with reference to FIGS. 2 and 9-10). The effective capacitance, $C_1$, can vary in time or be constant. For the purposes of this disclosure, the narrow IEDF width can exist when either $I_I = I_C$ or, in the alternative, when Equation 3 is met (the equivalence of $I_I$ and $I_C$ taking into account stray capacitance). FIGS. 21-27 use the nomenclature, $I_I = I_C$, but it should be understood that this relationship assumes negligible stray capacitance. The more rigorous relationship is shown via Equation 3, and thus Equation 3 could substitute for the equalities used in FIGS. 21-27. The stray capacitance, $C_{stray}$, is a cumulative capacitance of the plasma chamber as seen by the power supply. There are eight cycles illustrated in FIG. 22.

The method 1800 can begin with an application of a modified periodic voltage function (e.g., the modified periodic voltage function depicted in FIG. 8 or the modified periodic voltage function 2102 in FIG. 21) to the substrate support 1802 (e.g., substrate support 108 in FIG. 1). A voltage of the modified periodic voltage function can be sampled 1804 at two or more times, and from this sampling, a slope $dV_0/dt$ for at least a portion of a cycle of the modified periodic voltage function can be calculated 1806 (e.g., a slope of the portion between the pulses or the fourth portion 808). At some point before a decision 1810, a previously-determined value of an effective capacitance $C_1$ (e.g., inherent capacitance $C_1$ in FIG. 13, and an inherent capacitance C10 in FIG. 2) can be accessed 1808 (e.g., a previously-measured value retrieved from a memory, a value entered by a user, or a value measured in real-time). Based on the slope, $dV_0/dt$, the effective capacitance, $C_1$, and the ion current compensation, $I_C$, a function $f$ (Equation 4), can be evaluated for each value of the ion current compensation, $I_C$, as follows:

$$f(I_C) = \frac{dV_0}{dt} - \frac{I_C}{C_1} = 0 \quad \text{(Equation 4)}$$

If the function $f$ is true, then the ion current compensation, $I_C$, equals the ion current, $I_I$, or in the alternative, makes Equation 3 true, and a narrow IEDF width has been achieved 1810 (e.g., see FIG. 22). If the function $f$ is not true, then the ion current compensation, $I_C$, can be adjusted 1812 further until the function $f$ is true. Another way to look at this is that the ion current compensation, $I_C$, can be adjusted until it matches the ion current, $I_I$, (or in the alternative, meets the relationship of Equation 3), at which point a narrow IEDF width will exist. Such an adjustment to the ion current compensation, Ic, and resulting narrowing of the IEDF, can be seen in FIG. 22. The ion current, $I_I$, and the corresponding ion current compensation, Ic, can be stored (e.g., in a memory) in store operation 1814. The ion current, $I_C$, can vary in time, as can the effective capacitance, $C_1$.

When Equation 4 is met, ion current, $I_I$, is known (either because $I_C = I_I$, or because Equation 3 is true). Thus, the method 1800 enables remote and non-invasive measurements of ion current, $I_I$, in real time without affecting the plasma.

This leads to a number of novel metrics such as remote monitoring of plasma density and remote fault detection of the plasma source.

Figure 21:
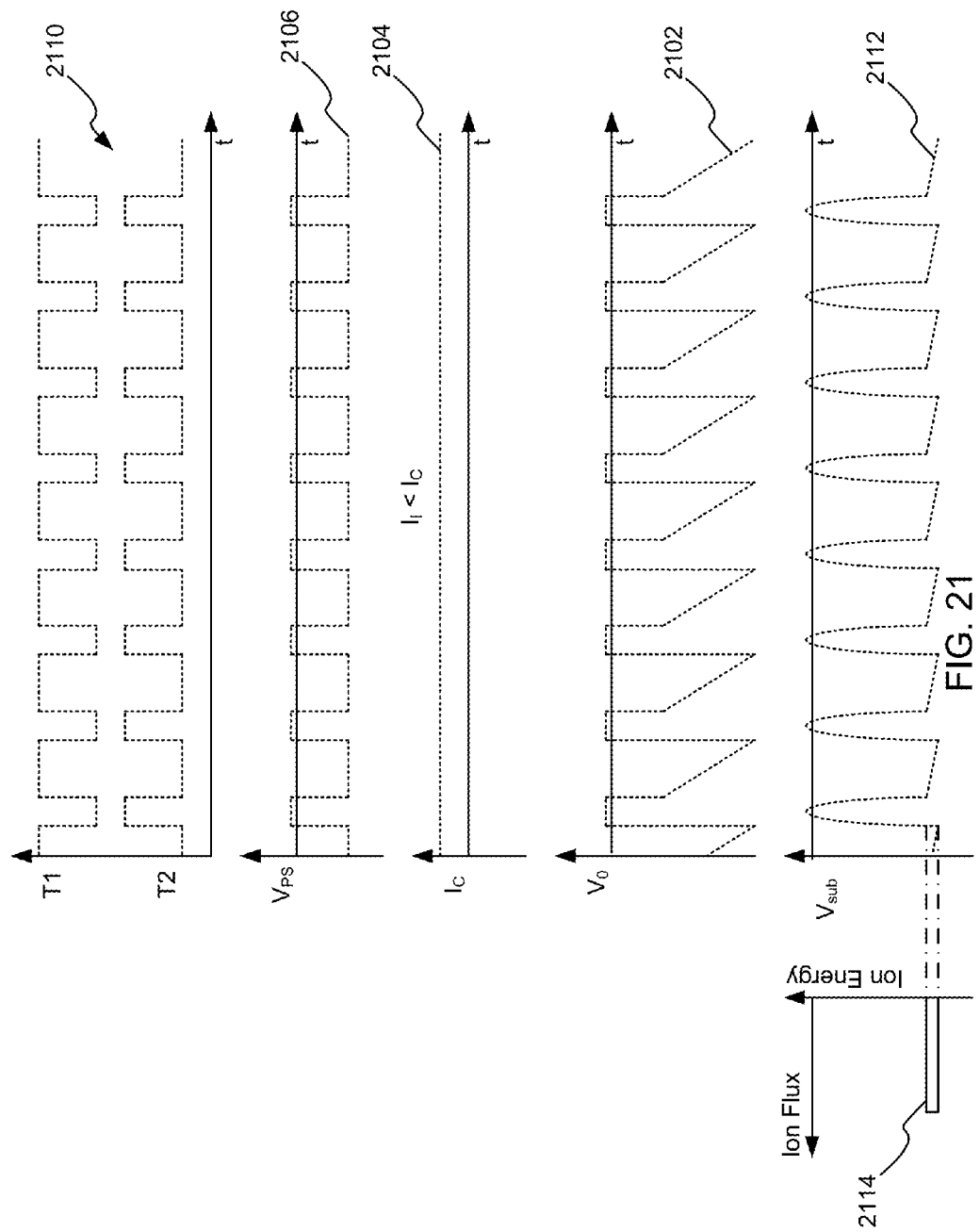
FIG. 21 is an embodiment of charts showing relations between power supply switch timing, periodic voltage function, ion current compensation, modified periodic voltage function, substrate surface voltage, and ion energy distribution function.

While adjusting 1812 the compensation current, $I_C$, the ion energy will likely be broader than a delta function and the ion energy will resemble that of FIG. 21. However, once the compensation current, $I_C$, is found that meets Equation 3, the IEDF will appear as the right portion of FIG. 22—as having a narrow IEDF width (e.g., a minimum IEDF width). This is because the voltage between pulses of the modified periodic voltage function causes a substantially constant sheath or substrate voltage, and hence ion energy, when $I_C=I_I$ (or alternatively when Equation 3 is true). In FIG. 23 the substrate voltage, 2308, includes pulses between the constant voltage portions. These pulses have such a short duration that their effect on ion energy and IEDF is negligible and thus the substrate voltage 2308 is referred to as being substantially constant.

The following provides further details about each of the method steps illustrated in FIG. 18. In one embodiment, the modified periodic voltage function can have a waveform like that illustrated in FIG. 8 and can include a first portion (e.g., first portion 802), a second portion (e.g., 804), a third portion (e.g., third portion 806), and a fourth portion (e.g., fourth portion 808), where the third portion can have a voltage step, $\Delta V$, and the fourth portion can have a slope, $dV_0/dt$. The slope, $dV_0/dt$, can be positive, negative, or zero. The modified periodic voltage function 800 can also be described as having pulses comprising the first portion 802, the second portion 804, and the third portion 806, and a portion between the pulses, a fourth portion 808, which is often sloped.

The modified periodic voltage function can be measured as $V_0$ in FIG. 2 and can appear as the modified periodic voltage function 2102 in FIG. 21. The modified period voltage function 2102 is produced by combining the power supply voltage 2106 (also known as the periodic voltage function) with the ion current compensation 2104. The power supply voltage 2106 is largely responsible for generating and shaping the pulses of the modified periodic voltage function 2102 and the ion current compensation 2104 is largely responsible for generating and shaping the portion between the pulses, which is often a straight sloped voltage. Increasing the ion current compensation, Ic, causes a decrease in a magnitude of the slope of the portion between the pulses as seen in FIG. 22. Decreasing a magnitude of the power supply voltage 2306 causes a decrease in a magnitude of the amplitude of the pulses and the peak-to-peak voltage of the modified periodic voltage function 2302 as seen in FIG. 23.

In cases where the power supply is a switch-mode power supply, the switching diagram 2110 of a first switch $T_1$ and a second switch $T_2$ can apply. For instance, the first switch $T_1$ can be implemented as the switch $T_1$ in FIG. 2 and the second switch $T_2$ can be implemented as the second switch $T_2$ in FIG. 2. The two switches are illustrated as having identical switching times, but being 180° out of phase. In other embodiments, the switches may have a slight phase offset such as that illustrated in FIG. 3. When the first switch $T_1$ is on (up to a first time $T_1$), the power supply voltage ($V_{PS}$) is drawn to a maximum magnitude (a negative voltage since the power supply has a negative bus voltage). The second switch $T_2$ is turned off during this period so that the power supply voltage 2106 is isolated from ground. When the switches reverse (at the first time $T_1$), the power supply voltage 2106 ramps and slightly passes ground and then settles at this positive voltage. This ramping and settling occurs between the first time $\tau_1$ and a second time $\tau_2$. The first switch $T_1$ is then turned on again and the second switch $T_2$ is turned off until a third time $T_3$. Turning the first switch $T_1$ on causes the voltage to drop by a voltage step $\Delta V$, which is then followed by a sloped region having a slope $dV_0/dt$ until the switches again reverse at the third time $T_3$. The third time $T_3$ is also a first time of a subsequent cycle or period of the modified periodic voltage function.

In the illustrated embodiment, there are two pulse widths, but this is not required. In other embodiments, the pulse width can be identical for all cycles. In other embodiments, the pulse width can be varied or modulated in time.

The modified periodic voltage function can be applied to the substrate support 1802, and sampled 1804 as $V_0$ at a last accessible point before the modified periodic voltage function reaches the substrate support (e.g., between the switch mode power supply and the effective capacitance). The unmodified periodic voltage function (or power supply voltage 2106 in FIG. 21) can be sourced from a power supply such as the switch mode power supply 1206 in FIG. 12. The ion current compensation 2104 in FIG. 21 can be sourced from a current source such as the ion current compensation component 1260 in FIG. 12 or 1360 in FIG. 13.

A portion of or the whole modified periodic voltage function can be sampled 1804. For instance, the fourth portion (e.g., fourth portion 808) can be sampled. The sampling 1804 can be performed between the power supply and the substrate support. For instance, in FIG. 1, the sampling 1804 can be performed between the switch mode power supply 106 and the support 108. In FIG. 2, the sampling 1804 can be performed between the inductor L1 and the inherent capacitance C10. In one embodiment, the sampling 1804 can be performed at $V_0$ between the capacitance C3 and the inherent capacitance C10. Since the inherent capacitance C10 and the elements representing the plasma (R2, R3, C1, and C2) are not accessible for real time measurement, the sampling 1804 is typically performed to the left of the inherent capacitance C10 in FIG. 2. Although the inherent capacitance C10 typically is not measured during processing, it is typically a known constant, and can therefore be set during manufacturing. At the same time, in some cases the inherent capacitance C10 can vary with time.

While only two samples of the modified periodic voltage function are needed in some embodiments, in others, hundreds, thousands, or tens of thousands of samples can be taken for each cycle of the modified periodic voltage function. For instance, the sampling rate can be greater than 400 kHz. These sampling rates enable more accurate and detailed monitoring of the modified periodic voltage function and its shape. In this same vein, more detailed monitoring of the periodic voltage function allows more accurate comparisons of the waveform: between cycles, between different process conditions, between different processes, between different chambers, between different sources, etc. For instance, at these sampling rates, the first, second, third, and fourth portions 802, 804, 806, 808 of the periodic voltage function illustrated in FIG. 8 can be distinguished, which may not be possible at traditional sampling rates. In some embodiments, the higher sampling rates enable resolving of the voltage step, $\Delta V$, and the slope, $dV_0/dt$, which are not possible in the art. In some embodiments, a portion of the modified periodic voltage function can be sampled while other portions are not sampled.

The calculation 1806 of the slope, $dV_0/dt$, can be based on a plurality of $V_0$ measurements taken during the time t (e.g., the fourth portion 808). For instance, a linear fit can be performed to fit a line to the $V_0$ values where the slope of the line gives the slope, $dV_0/dt$. In another instance, the $V_0$ values at the beginning and end of time t (e.g., the fourth portion 808)

in FIG. 8 can be ascertained and a line can be fit between these two points with the slope of the line given as $dV_0/dt$. These are just two of numerous ways that the slope, $dV_0/dt$, of the portion between the pulses can be calculated.

The decision 1810 can be part of an iterative loop used to tune the IEDF to a narrow width (e.g., a minimum width, or in the alternative, 6% full-width half maximum). Equation 4 only holds true where the ion current compensation, Ic, is equal to the ion current, $I_I$ (or in the alternative, is related to $I_I$ according to Equation 3), which only occurs where there is a constant substrate voltage and thus a constant and substantially singular ion energy (a narrow IEDF width). A constant substrate voltage 2308 ($V_{sub}$) can be seen in FIG. 23. Thus, either ion current, $I_I$, or alternatively ion current compensation, Ic, can be used in Equation 4.

Alternatively, two values along the fourth portion 808 (also referred to as the portion between the pulses) can be sampled for a first cycle and a second cycle and a first and second slope can be determined for each cycle, respectively. From these two slopes, an ion current compensation, Ic, can be determined which is expected to make Equation 4 true for a third, but not-yet-measured, slope. Thus, an ion current, $I_I$, can be estimated that is predicted to correspond to a narrow IEDF width. These are just two of the many ways that a narrow IEDF width can be determined, and a corresponding ion current compensation, Ic, and/or a corresponding ion current, $I_I$, can be found.

The adjustment to the ion current compensation, Ic, 1812 can involve either an increase or a decrease in the ion current compensation, Ic, and there is no limitation on the step size for each adjustment. In some embodiments, a sign of the function f in Equation 4 can be used to determine whether to increase or decrease the ion current compensation. If the sign is negative, then the ion current compensation, Ic, can be decreased, while a positive sign can indicate the need to increase the ion current compensation, Ic.

Once an ion current compensation, Ic, has been identified that equals the ion current, $I_I$ (or in the alternative, is related thereto according to Equation 3), the method 1800 can advance to further set point operations (see FIG. 19) or remote chamber and source monitoring operations. The further set point operations can include setting the ion energy (see also FIG. 23) and the distribution of ion energy or IEDF width (see also FIG. 24). The source and chamber monitoring can include monitoring plasma density, source supply anomalies, plasma arcing, and others.

Furthermore, the method 1800 can optionally loop back to the sampling 1804 in order to continuously (or in the alternative, periodically) update the ion current compensation, Ic. For instance, the sampling 1804, calculation 1806, the decision 1810, and the adjusting 1812 can periodically be performed given a current ion current compensation, Ic, in order to ensure that Equation 4 continues to be met. At the same time, if the ion current compensation, Ic, that meets Equation 4 is updated, then the ion current, $I_I$, can also be updated and the updated value can be stored 1814.

While the method 1800 can find and set the ion current compensation, Ic, so as to equal the ion current, $I_I$, or in the alternative, to meet Equation 3, a value for the ion current compensation, Ic, needed to achieve a narrow IEDF width can be determined without (or in the alternative, before) setting the ion current, $I_C$, to that value. For instance, by applying a first ion current compensation, $Ic_1$, for a first cycle and measuring a first slope, $dV_{01}/dt$, of the voltage between the pulses, and by applying a second ion current compensation, $Ic_2$, for a second cycle and measuring a second slope, $dV_{02}/dt$, of the voltage between the pulses, a third slope, $dV_{03}/dt$, associated with a third ion current compensation, $Ic_3$, can be determined at which Equation 4 is expected to be true. The third ion current compensation, $Ic_3$, can be one that if applied would result in a narrow IEDF width. Hence, the ion current compensation, Ic, that meets Equation 4 and thus corresponds to ion current, $I_I$, can be determined with only a single adjustment of the ion current compensation. The method 1800 can then move on to the methods described in FIG. 19 without ever setting the ion current, $I_C$, to a value needed to achieve the narrow IEDF width. Such an embodiment may be carried out in order to increase tuning speeds.

Alternatively, given a first slope, $dV_{01}/dt$, and a corresponding first ion current compensation, $I_{C1}$, a second slope, $dV_{02}/dt$, and a corresponding second ion current compensation, $I_{C2}$, and the effective capacitance $C_1$, the ion current, $I_I$, can be estimated using the following equation without adjusting the ion compensation current $I_C$ to equal the ion current, $I_I$, or adjusting it to meet Equation 3:

$$I_I = \frac{C_1 \cdot \left(I_{c1} \cdot \frac{dV_{02}}{dt} - U_{c2} \cdot \frac{dV_{01}}{dt}\right)}{I_{c1} - I_{c2} + C_1 \cdot \left(\frac{dV_{02}}{dt} - \frac{dV_{01}}{dt}\right)} \quad \text{(Equation 5)}$$

Figure 13:
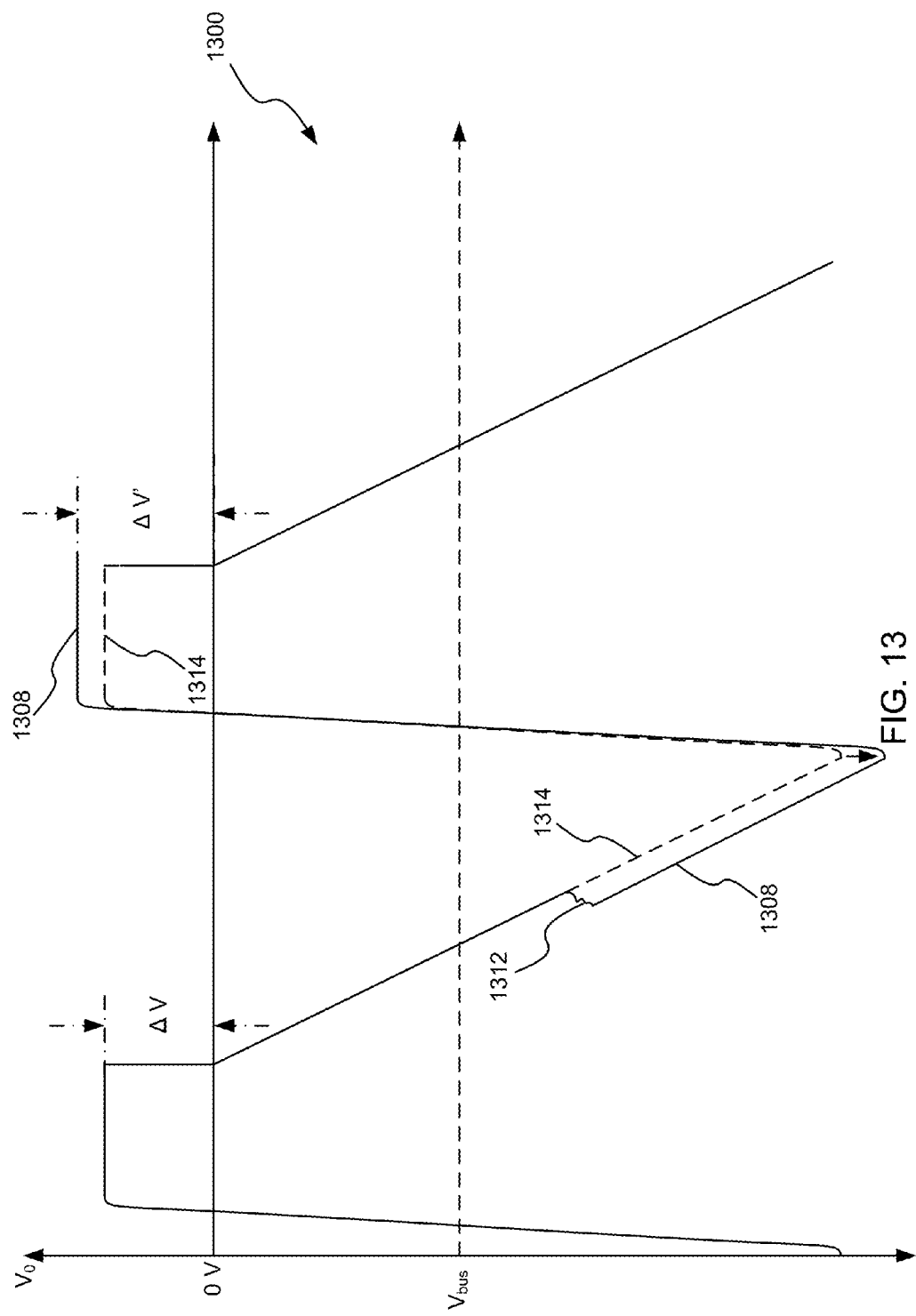
FIG. 13 is shows a similar modified periodic voltage function, but in this case a disturbance causes the falling voltage to follow the path rather than the path.

FIG. 19 illustrates methods for setting the IEDF width and the ion energy. The method originates from the method 1800 illustrated in FIG. 18, and can take either of the left path 1900 (also referred to as an IEDF branch) or the right path 1901 (also referred to as an ion energy branch), which entail setting of the IEDF width and the ion energy, respectively. Ion energy, eV, is proportional to a voltage step, $\Delta V$, or the third portion 806 of the modified periodic voltage function 800 of FIG. 8. The relationship between ion energy, eV, and the voltage step, $\Delta V$, can be written as Equation 6:

$$eV = \Delta V \frac{C_1}{C_2 + C_1} \quad \text{(Equation 6)}$$

where $C_1$ is the effective capacitance (e.g., chuck capacitance; inherent capacitance, C10, in FIG. 2; or inherent capacitance, C1, in FIG. 13), and $C_2$ is a sheath capacitance (e.g., the sheath capacitance C2 in FIG. 2 or the sheath capacitance C2 in FIG. 13). The sheath capacitance, $C_2$, may include stray capacitances and depends on the ion current, $I_I$. The voltage step, $\Delta V$, can be measured as a change in voltage between the second portion 804 and the fourth portion 808 of the modified periodic voltage function 800. By controlling and monitoring the voltage step, $\Delta V$, (which is a function of a power supply voltage or a bus voltage such as bus voltage, $V_{bus}$ in FIG. 2), ion energy, eV, can be controlled and known.

Throughout this disclosure ion energy, eV, is referred to as if it is a singular value. However, the meaning of ion energy, eV, has slightly different meanings depending on the IEDF width. Where the IEDF width is minimized, the ion energy, eV, is an average ion energy of the IEDF. When the IEDF width is not minimized, the ion energy, eV, marks either a minimum or maximum of the IEDF, depending on whether $I_I<I_C$ or $I_I>I_C$. Where $I_I<I_C$, the ion energy, eV, corresponds to a minimum ion energy, eV, of the IEDF. Where $I_I>I_C$, the ion energy, eV, corresponds to a maximum ion energy, eV, of the IEDF. Where the IEDF width is small, this technicality is not too important, and thus ion energy, eV, will be treated as if representing an average ion energy for an IEDF. But, for the sake of rigor, one should bear in mind the above description At the same time, the IEDF width can be approximated according to Equation 7:

$$\text{IEDF width} = V_{PP} - \Delta V - \frac{It}{C} \quad \text{(Equation 7)}$$

where I is $I_I$ where C is $C_{series}$, or I is $I_C$ where C is $C_{effective}$. Time, t, is the time between pulses, $V_{PP}$, is the peak-to-peak voltage, and $\Delta V$ is the voltage step.

Additionally, sheath capacitance, $C_2$, can be used in a variety of calculations and monitoring operations. For instance, the Debye sheath distance, $\lambda_{sheath}$, can be estimated as follows:

$$\lambda_{sheath} = \frac{\epsilon A}{C_2} \quad \text{(Equation 8)}$$

where is vacuum permittivity and A is an area of the substrate (or in an alternative, a surface area of the substrate support). In some high voltage applications, Equation 8 is written as Equation 9:

$$\lambda_{sheath} = \sqrt{\frac{T_e \cdot \epsilon_0}{n_e q}} \cdot \left(\frac{V}{2} T_e\right)^{.75} \quad \text{(Equation 9)}$$

Additionally, an e-field in the sheath can be estimated as a function of the sheath capacitance, $C_2$, the sheath distance, $\lambda_{sheath}$, and the ion energy, eV. Sheath capacitance, $C_2$, along with the ion current, $I_I$, can also be used to determine plasma density, $n_e$, from Equation 10 where saturation current, $I_{sat}$, is linearly related to the compensation current, $I_C$, for singly ionized plasma.

$$I_{sat} = \sum n_i q_i \sqrt{\frac{kT_e}{m_i}} A \approx n_e q \sqrt{\frac{kT_e}{\langle m \rangle}} A \quad \text{(Equation 10)}$$

An effective mass of ions at the substrate surface can be calculated using the sheath capacitance, $C_2$ and the saturation current, $I_{sat}$. Plasma density, $n_e$, electric field in the sheath, ion energy, eV, effective mass of ions, and a DC potential of the substrate, $V_{DC}$, are fundamental plasma parameters that are typically only monitored via indirect means in the art. This disclosure enables direct measurements of these parameters thus enabling more accurate monitoring of plasma characteristics in real time.

As seen in Equation 6, the sheath capacitance, $C_2$, can also be used to monitor and control the ion energy, eV, as illustrated in the ion energy branch 1901 of FIG. 19. The ion energy branch 1901 starts by receiving a user selection of ion energy 1902. The ion energy branch 1901 can then set an initial power supply voltage for the switch-mode power supply that supplies the periodic voltage function 1904. At some point before a sample periodic voltage operation 1908, the ion current can also be accessed 1906 (e.g., accessed from a memory). The periodic voltage can be sampled 1908 and a measurement of the third portion of the modified periodic voltage function 1910. Ion energy, $I_I$, can be calculated from the voltage step, $\Delta V$, (also referred to as the third portion (e.g., third portion 806)) of the modified periodic voltage function 1912. The ion energy branch 1901 can then determine whether the ion energy equals the defined ion energy 1914, and if so, the ion energy is at the desired set point and the ion energy branch 1901 can come to an end. If the ion energy is not equal to the defined ion energy, then the ion energy branch 1901 can adjust the power supply voltage 1916, and again sample the periodic voltage 1908. The ion energy branch 1901 can then loop through the sampling 1908, measuring 1910, calculating 1912, decision 1914, and the setting 1916 until the ion energy equals the defined ion energy.

The method for monitoring and controlling the IEDF width is illustrated in the IEDF branch 1900 of FIG. 19. The IEDF branch 1900 includes receiving a user selection of an IEDF width 1950 and sampling a current IEDF width 1952. A decision 1954 then determines whether the defined IEDF width equals the current IEDF width, and if the decision 1952 is met, then the IEDF width is as desired (or defined), and the IEDF branch 1900 can come to an end. However, if the current IEDF width does not equal the defined IEDF width, then the ion current compensation, Ic, can be adjusted 1956. This determination 1954 and the adjustment 1956 can continue in a looping manner until the current IEDF width equals the defined IEDF width.

Figure 11:
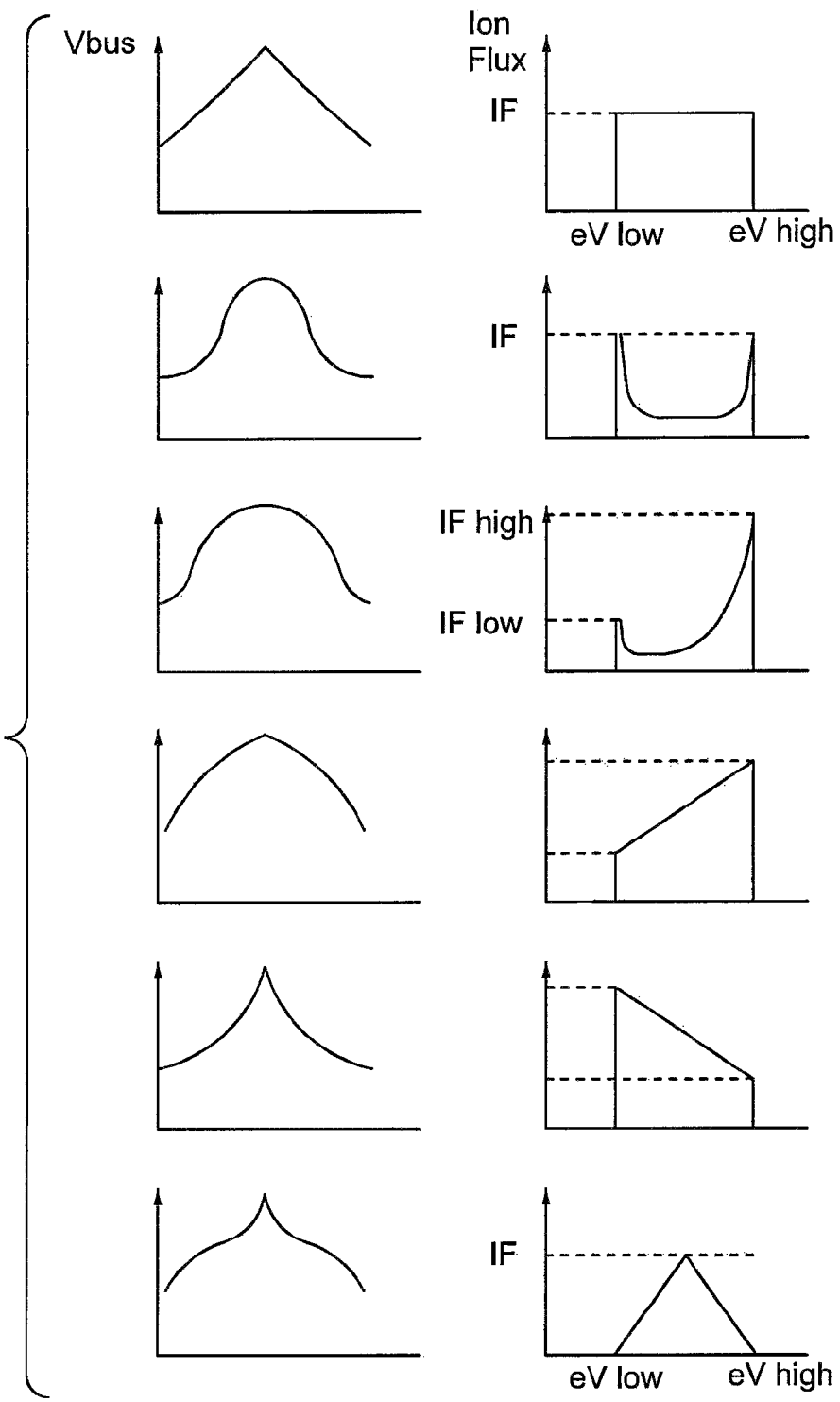
FIG. 11 illustrates graphs of various IEDF shapes.

In some embodiments, the IEDF branch 1900 can also be implemented to secure a desired IEDF shape. Various IEDF shapes can be generated and each can be associated with a different ion energy and IEDF width. For instance, a first IEDF shape may be a delta function while a second IEDF shape may be a square function. Other IEDF shapes may be cupped. Examples of various IEDF shapes can be seen in FIG. 11.

With knowledge of the ion current, $I_I$, and the voltage step, $\Delta V$, Equation 6 can be solved for ion energy, eV. The voltage step, $\Delta V$, can be controlled by changing the power supply voltage which in turn causes the voltage step, $\Delta V$, to change. A larger power supply voltage causes an increase in the voltage step, $\Delta V$, and a decrease in the power supply voltage causes a decrease in the voltage step, $\Delta V$. In other words, increasing the power supply voltage results in a larger ion energy, eV.

Furthermore, since the above systems and methods operate on a continuously varying feedback loop, the desired (or defined) ion energy and IEDF width can be maintained despite changes in the plasma due to variations or intentional adjustments to the plasma source or chamber conditions.

Although FIGS. 17-19 have been described in terms of a single ion energy, one of skill in the art will recognize that these methods of generating and monitoring a desired (or defined) IEDF width (or IEDF shape) and ion energy can be further utilized to produce and monitor two or more ion energies, each having its own IEDF width (or IEDF shape). For instance, by providing a first power supply voltage, $V_{PS}$, in a first, third, and fifth cycles, and a second power supply voltage in a second, fourth, and sixth cycles, two distinct and narrow ion energies can be achieved for ions reaching the surface of the substrate (e.g., top two figures in FIG. 20). Using three different power supply voltages results in three different ion energies (e.g., middle two figures in FIG. 20). By varying a time during which each of multiple power supply voltages is applied, or the number of cycles during which each power supply voltage level is applied, the ion flux of different ion energies can be controlled (e.g., bottom two figures in FIG. 20).

The above discussion has shown how combining a periodic voltage function provided by a power supply with an ion current compensation provided by an ion current compensation component, can be used to control an ion energy and IEDF width and/or IEDF shape of ions reaching a surface of a substrate during plasma processing.

Some of the heretofore mentioned controls are enabled by using some combination of the following: (1) a fixed waveform (consecutive cycles of the waveform are the same); (2) a waveform having at least two portions that are proportional to an ion energy and an IEDF (e.g., the third and fourth portions 806 and 808 illustrated in FIG. 8); and (3) a high sampling rate (e.g., 125 MHz) that enables accurate monitoring of the distinct features of the waveform. For instance, where the prior art, such as linear amplifiers, sends a waveform to the substrate that is similar to the modified periodic voltage function, undesired variations between cycles make it difficult to use those prior art waveforms to characterize the ion energy or IEDF width (or IEDF shape).

Where linear amplifiers have been used to bias a substrate support, the need to sample at a high rate has not been seen since the waveform is not consistent from cycle to cycle and thus resolving features of the waveform (e.g., a slope of a portion between pulses) typically would not provide useful information. Such useful information does arise when a fixed waveform is used, as seen in this and related disclosures.

The herein disclosed fixed waveform and the high sampling rate further lead to more accurate statistical observations being possible. Because of this increased accuracy, operating and processing characteristics of the plasma source and the plasma in the chamber can be monitored via monitoring various characteristics of the modified periodic voltage function. For instance, measurements of the modified periodic voltage function enable remote monitoring of sheath capacitance and ion current, and can be monitored without knowledge of the chamber process or other chamber details. A number of examples follow to illustrate just some of the multitude of ways that the heretofore mentioned systems and methods can be used for non-invasive monitoring and fault detection of the source and chamber.

As an example of monitoring, and with reference to FIG. 8, the DC offset of the waveform 800 can represent a health of the plasma source (hereinafter referred to as the "source"). In another, a slope of a top portion 804 (the second portion) of a pulse of the modified periodic voltage function can be correlated to damping effects within the source. The standard deviation of the slope of the top portion 804 from horizontal (illustrated as having a slope equal to 0) is another way to monitor source health based on an aspect of the waveform 800. Another aspect involves measuring a standard deviation of sampled $V_0$ points along the fourth portion 808 of the modified periodic voltage function and correlating the standard deviation to chamber ringing. For instance, where this standard deviation is monitored among consecutive pulses, and the standard deviation increases over time, this may indicate that there is ringing in the chamber, for instance in the e-chuck. Ringing can be a sign of poor electrical connections to, or in, the chamber or of additional unwanted inductance or capacitance.

One of skill in the art will recognize that the methods illustrated in FIGS. 17, 18, and 19 do not require any particular or described order of operation, nor are they limited to any order illustrated by or implied in the figures. For instance, metrics can be monitored before, during, or after setting and monitoring the IEDF width and/or the ion energy, eV.

FIG. 21 illustrates various waveforms at different points in the systems herein disclosed. Given the illustrated switching pattern 2110 for switching components of a switch mode power supply, power supply voltage, $V_{PS}$, 2106 (also referred to herein as a periodic voltage function), ion current compensation, Ic, 2104, modified periodic voltage function 2102, and substrate voltage, $V_{sub}$, 2112, the IEDF has the illustrated width 2114 (which may not be drawn to scale) or IEDF shape 2114. This width is wider than what this disclosure has referred to as a "narrow width." As seen, when the ion current compensation, Ic, 2104 is greater than the ion current, $I_I$, the substrate voltage, $V_{sub}$, 2112 is not constant. The IEDF width 2114 is proportional to a voltage difference of the sloped portion between pulses of the substrate voltage, $V_{sub}$, 2112.

Given this non-narrow IEDF width 2114, the methods herein disclosed call for the ion current compensation, Ic, to be adjusted until $I_C=I_I$ (or in the alternative are related according to Equation 3). FIG. 22 illustrates the effects of making a final incremental change in ion current compensation, Ic, in order to match it to ion current $I_I$. When $I_C=I_I$ the substrate voltage, $V_{sub}$, 2212 becomes substantially constant, and the IEDF width 2214 goes from non-narrow to narrow.

Once the narrow IEDF has been achieved, one can adjust the ion energy to a desired or defined value as illustrated in FIG. 23. Here, a magnitude of the power supply voltage (or in the alternative a bus voltage, $V_{bus}$, of a switch-mode power supply) is decreased (e.g., a maximum negative amplitude of the power supply voltage 2306 pulses is reduced). As a result, $\Delta V_1$ decreases to $\Delta V_2$ as does the peak-to-peak voltage, from $V_{PP}1$ to $V_{PP}2$. A magnitude of the substantially constant substrate voltage, $V_{sub}$, 2308 consequently decreases, thus decreasing a magnitude of the ion energy from 2315 to 2314 while maintaining the narrow IEDF width.

Whether the ion energy is adjusted or not, the IEDF width can be widened after the narrow IEDF width is achieved as shown in FIG. 24. Here, given $I_I=I_C$ (or in the alternative, Equation 3 giving the relation between $I_I$ and $I_C$), $I_C$ can be adjusted thus changing a slope of the portion between pulses of the modified periodic voltage function 2402. As a result of ion current compensation, Ic, and ion current, $I_I$, being not equal, the substrate voltage moves from substantially constant to non-constant. A further result is that the IEDF width 2414 expands from the narrow IEDF 2414 to a non-narrow IEDF 2402. The more that $I_C$ is adjusted away from $I_I$, the greater the IEDF 2414 width.

Figure 25:
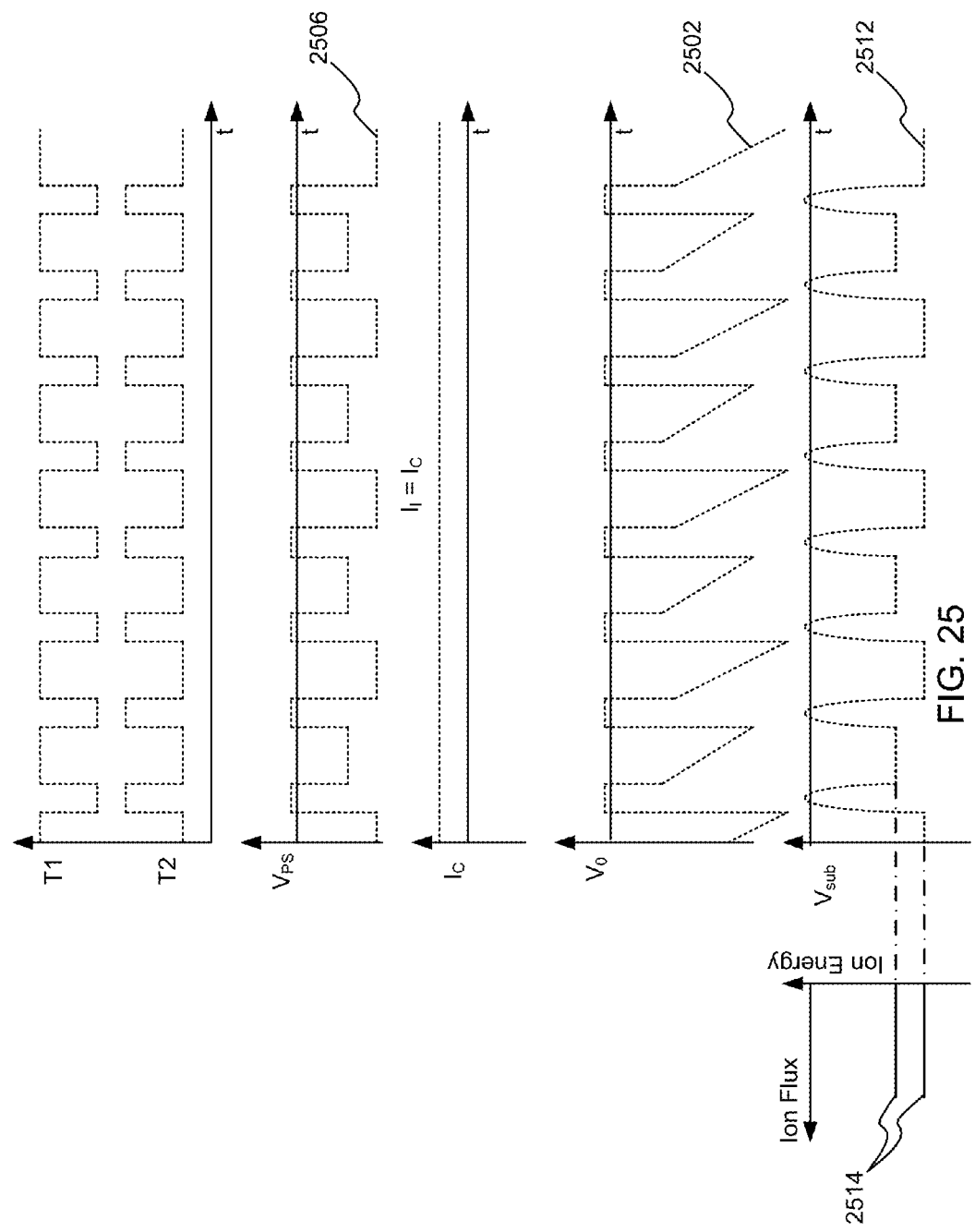
FIG. 25 is another embodiment of charts showing relations between power supply switch timing, periodic voltage function, ion current compensation, modified periodic voltage function, substrate surface voltage, and ion energy distribution function.

FIG. 25 illustrates one pattern of the power supply voltage that can be used to achieve more than one ion energy level where each ion energy level has a narrow IEDF 2514 width. A magnitude of the power supply voltage 2506 alternates each cycle. This results in an alternating $\Delta V$ and peak-to-peak voltage for each cycle of the modified periodic voltage function 2502. The substrate voltage 2512 in turn has two substantially constant voltages that alternate between pulses of the substrate voltage. This results in two different ion energies each having a narrow IEDF 2514 width.

Figure 26:
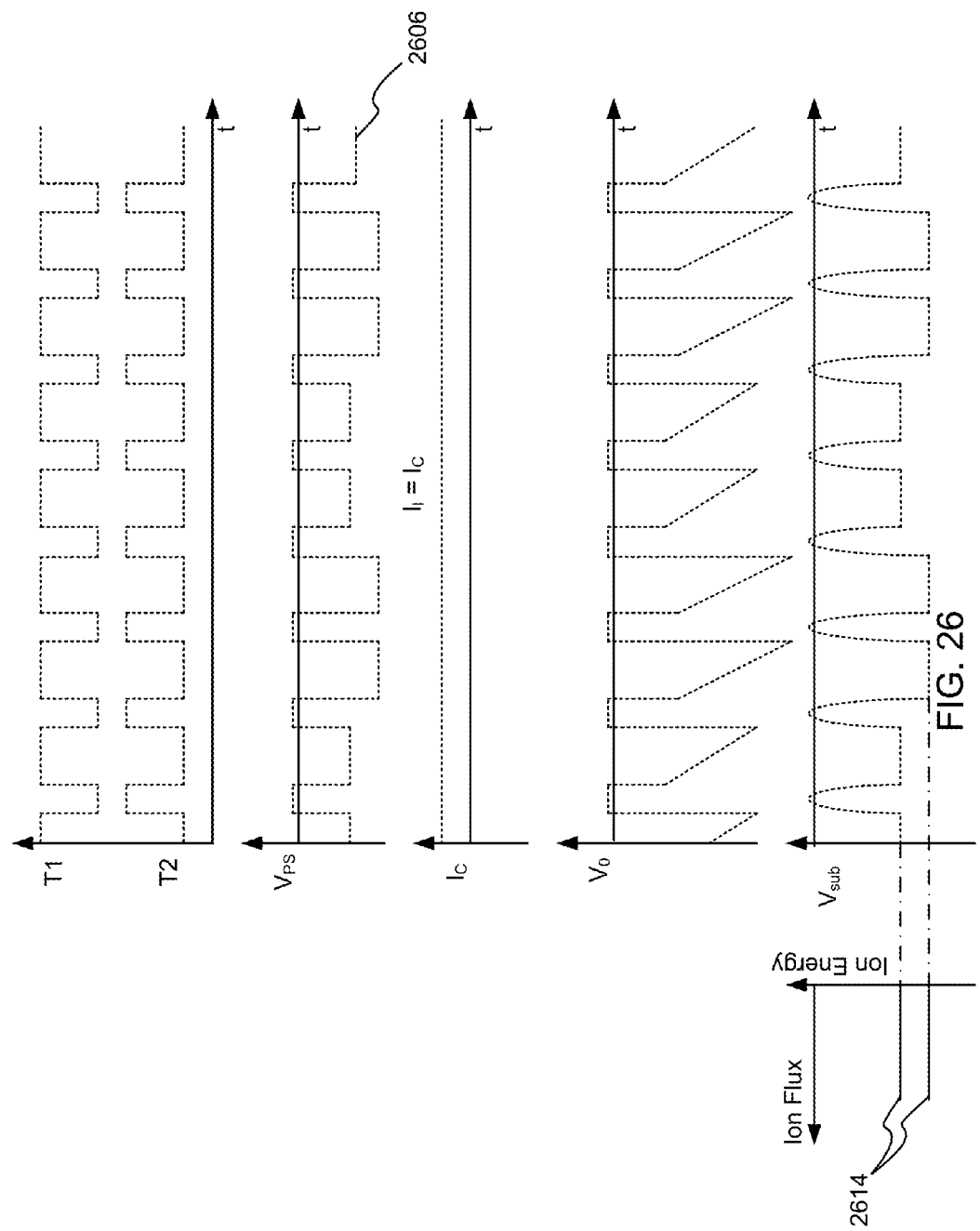
FIG. 26 is yet another embodiment of charts showing relations between power supply switch timing, periodic voltage function, ion current compensation, modified periodic voltage function, substrate surface voltage, and ion energy distribution function.

FIG. 26 illustrates another pattern of the power supply voltage that can be used to achieve more than one ion energy level where each ion energy level has a narrow IEDF 2614 width. Here, the power supply voltage 2606 alternates between two different magnitudes but does so for two cycles at a time before alternating. As seen, the average ion energies are the same as if $V_{PS}$ 2606 were alternated every cycle. This shows just one example of how various other patterns of the $V_{PS}$ 2606 can be used to achieve the same ion energies.

Figure 27:
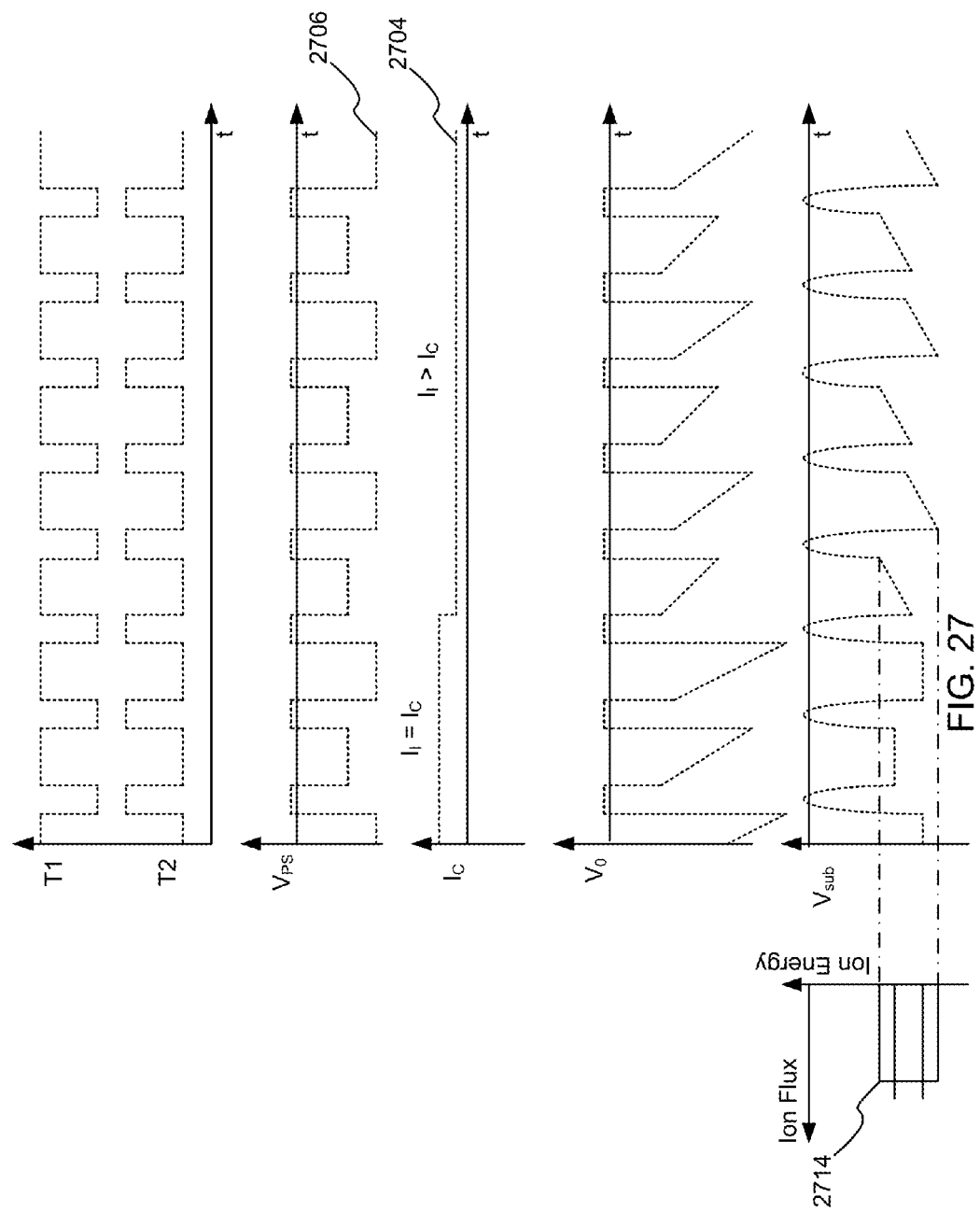
FIG. 27 is a further embodiment of charts showing relations between power supply switch timing, periodic voltage function, ion current compensation, modified periodic voltage function, substrate surface voltage, and ion energy distribution function.

FIG. 27 illustrates one combination of power supply voltages, $V_{PS}$, 2706 and ion current compensation, Ic, 2704 that can be used to create a defined IEDF 2714. Here, alternating power supply voltages 2706 result in two different ion energies. Additionally, by adjusting the ion current compensation 2704 away from the ion current, $I_I$, the IEDF 2714 width for each ion energy can be expanded. If the ion energies are close enough, as they are in the illustrated embodiment, then the IEDF 2714 for both ion energies will overlap resulting in one large IEDF 2714. Other variations are also possible, but this example is meant to show how combinations of adjustments to the $V_{PS}$ 2706 and the $I_C$ 2704 can be used to achieve defined ion energies and defined IEDFs 2714.

Circuit Memory as a Cause of Inaccurate Ion Energies

Referring to FIGS. 2 and 8, a modified periodic voltage function 800 can be seen as generated at an output of the switch-mode power supply 206. The modified period voltage function 800 begins with an upswing in voltage, $V_0$, as the first switch component 226' closes and charges a series capacitance, $C_{series}$, that includes the substrate support 208. When $C_{series}$ is charged, the first switch component 226' is opened. The first and second switch components 226' and 226" can both be open for a short time (tc−t) causing the voltage across $C_{series}$ to remain constant. The second switch component 226" is then closed causing $V_0$ to drop a voltage ΔV, after which point the modified periodic voltage function 800 begins to slope downward with a slope $dV_0/dt$ as ion current compensation from the ion energy control 220 is provided to the substrate support 208. The voltage step ΔV is related to ion energy for ions striking a substrate surface in the plasma processing chamber 204. The modified periodic voltage function 800 is illustrated and described without disturbances.

However, in practice disturbances can affect ΔV and thus ion energy. For instance, where a narrow ion energy distribution function IEDF is desired, ΔV, should be constant from cycle to cycle. If a disturbance causes ΔV to differ in some cycles, then the IEDF will have a smear or jitter.

Figure 12:
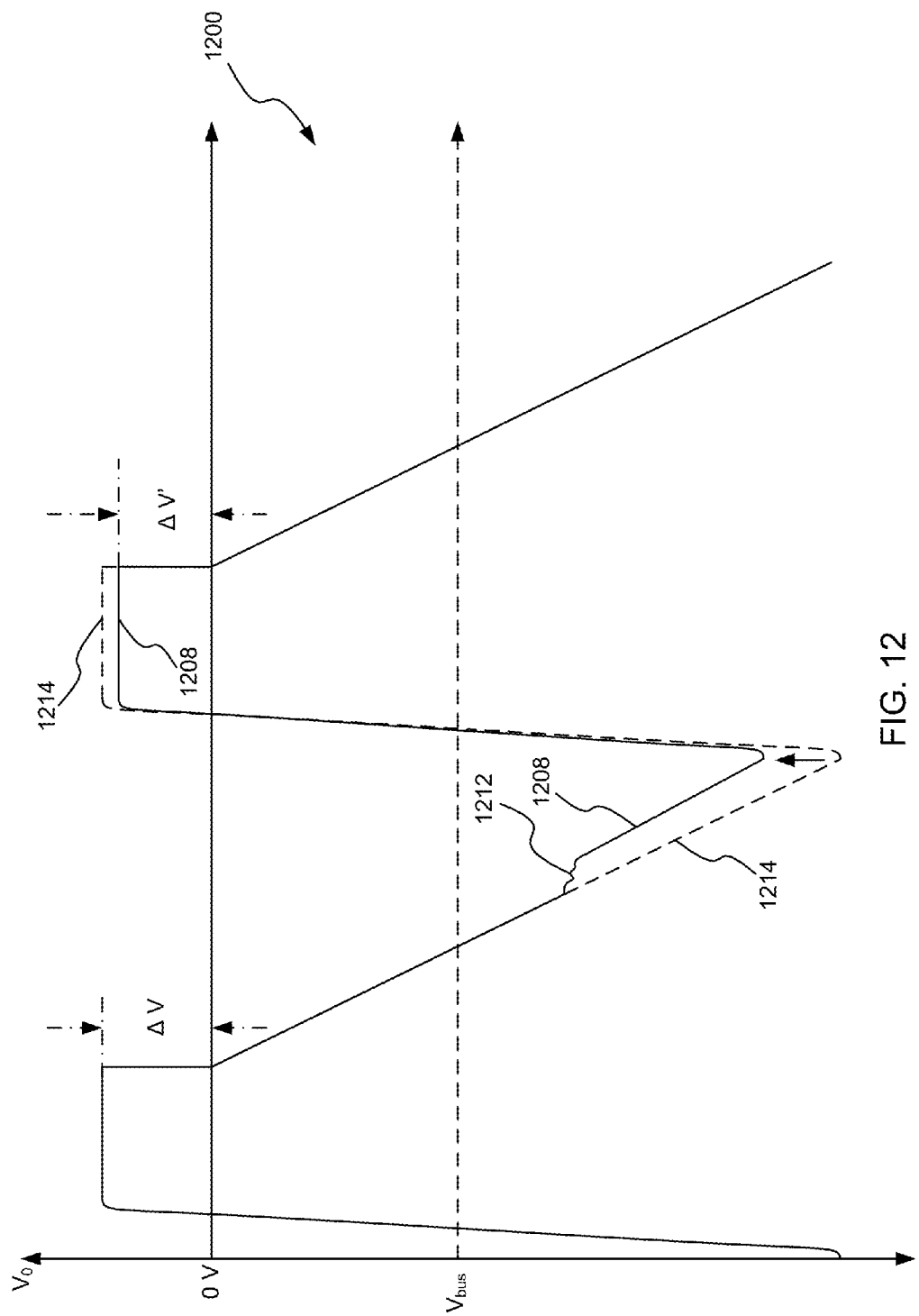
FIG. 12 is a modified periodic voltage function where a disturbance can be seen in a first cycle, which influences the ΔV of a next cycle.

This problem is illustrated in FIGS. 12 and 13. FIG. 12 illustrates a modified periodic voltage function 1200 where a disturbance 1212 can be seen in a first cycle, which influences the ΔV of a next cycle. FIG. 12 also shows a more accurate presentation of the voltage rise at the start of each cycle—this shape is more sinusoidal than the vertical shape illustrated in FIG. 8. The sinusoidal shape is a result of the recharging of $C_{series}$ through $L_1$ that is occurring during this voltage rise.

A disturbance 1212 is seen during the downward sloping portion of the first cycle (other types of disturbances are also possible and such disturbances can occur anywhere in a cycle, not just during the sloped portion). Without the disturbance 1212, the voltage would continue to fall with substantially the same slope along line 1214. However, the disturbance 1212 causes the voltage to continue to fall with the same slope, but along a line 1208 having a higher voltage. As a result, when the first switch component 226' is again closed and $V_0$ begins to rise, instead of following the path 1214 followed in the previous cycle, $V_0$ follows the path 1208 leading to a ΔV' which is lower than the ΔV of the previous cycle and lower than desired. This affect can be referred to as 'memory' since each cycle remembers the voltage at which the previous cycle ended (e.g., when the first switch component 226' closes).

FIG. 13 shows a similar modified periodic voltage function 1300, but in this case a disturbance 1312 causes the falling voltage to follow the path 1308 rather than the path 1314. As a result, $V_0$ is lower when the first switch component 226' is closed and $C_{series}$ begins to charge. Consequently, $V_0$ follows the path 1308 rather than 1314 when the first switch component 226' opens. The result is a ΔV' that is larger than desired and larger than the ΔV of the previous cycle.

Thus, this 'memory' causes inaccuracies, and potentially instability, in the ion energy. There is therefore a need in the art to eliminate this memory and achieve accurate and stable ion energy while still using energy efficient resonant switching.

The memory is partially the result of excess energy stored in a series capacitance $C_{series}$ that would normally be completely removed from $C_{series}$ by the time the first switch component 226' closes. However, where there is a disturbance (e.g., 1312), energy remains in $C_{series}$ when the first switch component 226' closes. One way to remove this energy is to couple $C_{series}$ to a resistor such that the energy dissipates into the resister. This is a fast method of removing the memory from $C_{series}$, but has the downside of wasting energy as the energy is merely converted to heat rather than put to work.

A preferred operating regime is known as resonant since energy is passed back and forth between a capacitor and an inductor and thus reused rather than being wasted in a resistor (some dissipation in inherent resistances is unavoidable, but at least is smaller than in a resistive regime). However, inductors are not charged quickly, and thus an inductor in a resonant system is not effective to remove excess capacitance from the capacitor at the end of each cycle.

Thus, there is a need in the art for systems, methods, and apparatus operating in the more efficient resonant regime, while also being able to quickly remove excess charge from a capacitor of the system in order to avoid inaccuracies and instability caused by so-called memory.

Figure 14:
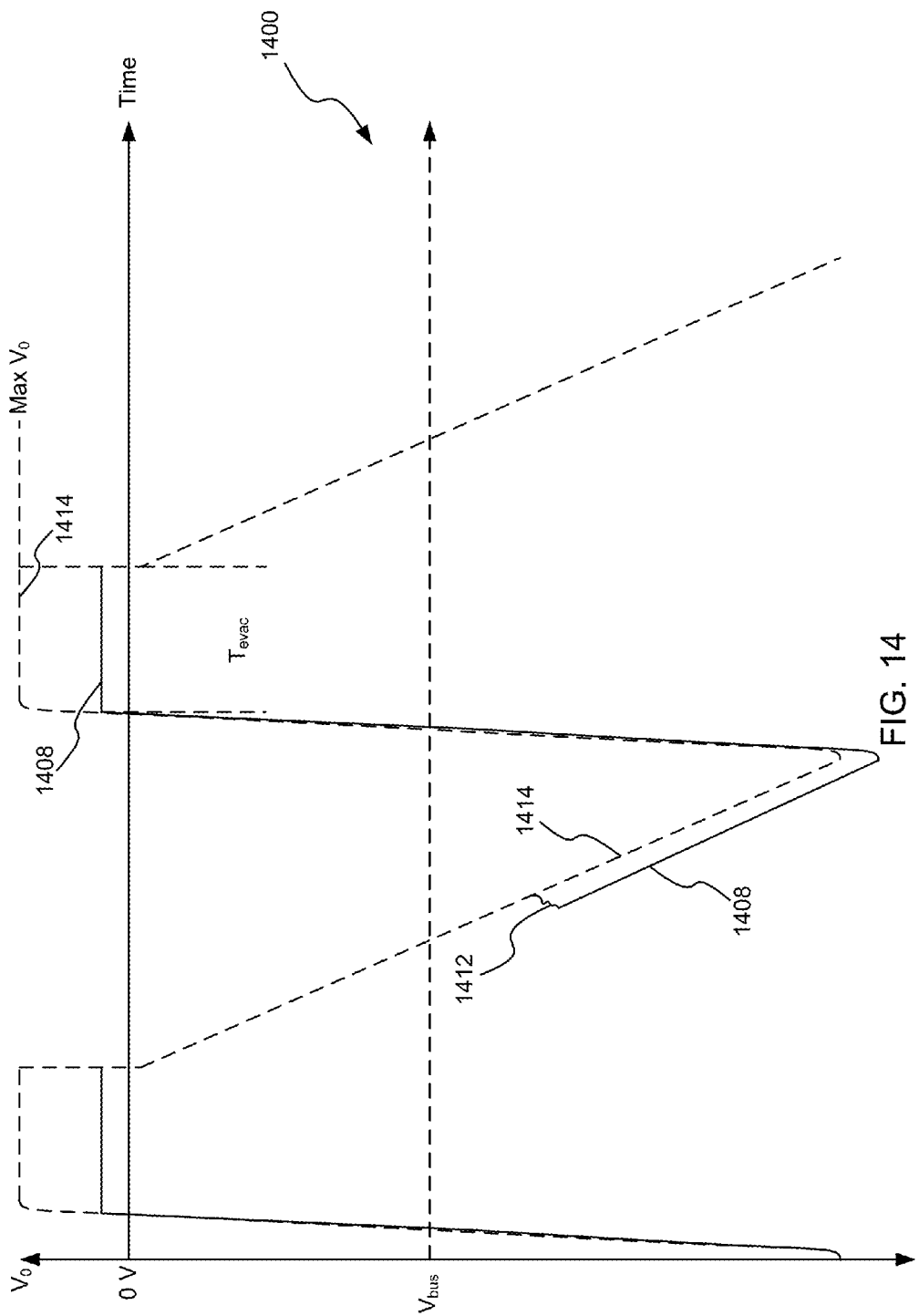
FIG. 14 is a waveform where the systems and methods herein disclosed are used to achieve a desired ion energy despite different disturbances in a previous cycle.
Figure 15:
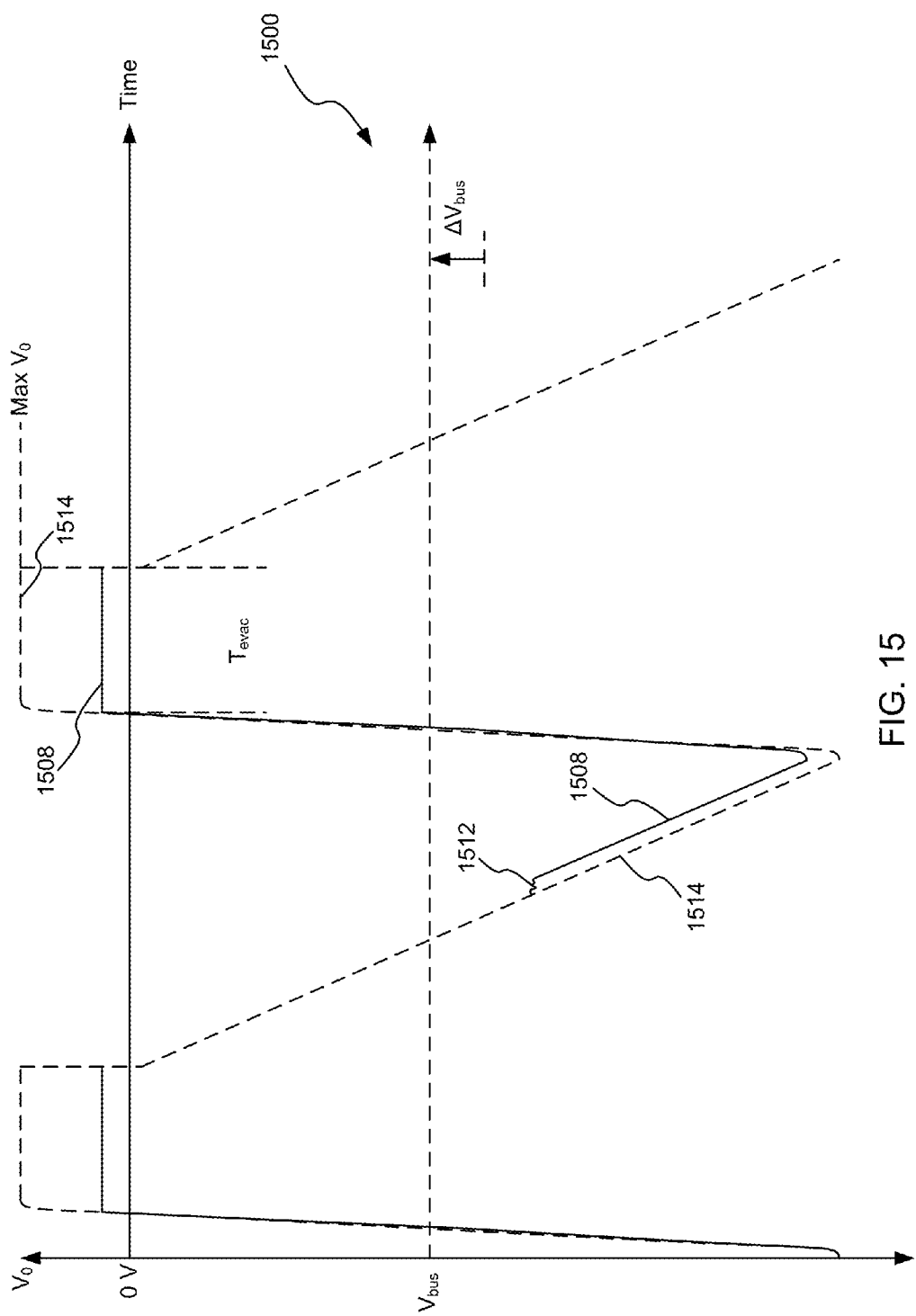
FIG. 15 is a waveform where the systems and methods herein disclosed are used to achieve a desired ion energy despite different disturbances in a previous cycle.

FIGS. 14 and 15 illustrate waveforms where the systems and methods herein disclosed are used to achieve a desired ion energy despite different disturbances in a previous cycle. In FIG. 14 the disturbance 1408 would have caused ΔV to be higher than desired (recall FIG. 13), but instead, as $V_0$ rises at the start of a cycle (with a first switch component closed), the bias supply monitors the rising voltage and cuts off the increasing voltage when $V_0$ reaches a voltage 1408 that corresponds to a desired ion energy. In other words, the bias supply cuts off the voltage increase before the default period for the voltage rise—or before $C_{series}$ is fully charged. In FIG. 15 the disturbance 1508 would have caused ΔV to be lower than desired (recall FIG. 12), but instead, as $V_0$ rises at the start of the cycle, the bias supply monitors the rising voltage and cuts off the increasing voltage when $V_0$ reaches a level that corresponds to the desired ion energy 1508. In this case, the voltage is allowed to rise for longer than a default period for the voltage rise—but still is cutoff before $C_{series}$ is fully charged.

In FIG. 14, the key is to cut off the voltage rise before a default period. However, in FIG. 15, there are two keys to the method: first the bus voltage, $V_{bus}$ is set such that $V_0$ can theoretically be allowed to rise far higher than would ever be required (e.g., level 1514). In other words, $V_{bus}$ is set such that $C_{series}$ typically will not be fully charged in order to achieve any desired ion energies. In this way, $V_0$ can be cutoff later than the default period, and thus can rise above where it would otherwise reach due to the disturbance 1512.

Unfortunately, when $V_0$ is cutoff before the voltage is allowed to rise to a Max $V_0$, energy remains stored in an inductor of the bias supply, and/or in inherent inductance of the bias supply. Were the bias supply allowed to fully charge $C_{series}$, the inductor's energy would have been fully discharged into or exchanged with $C_{series}$. Thus, while the switching algorithm herein described enables resonant operation and the ability to wipe out 'memory' from the previous cycle, thus removing inaccuracy and instability, a new problem is created in that the inductor and/or inductance of the bias supply is never fully depleted. This stored energy can cause further 'memory' problems for the subsequent cycle, and thus there is a further need to quickly and efficiently remove the remaining stored energy in the inductor and/or inductance of the bias supply. Solutions to this problem are described with reference to the system illustrated in FIG. 9.

Figure 9:
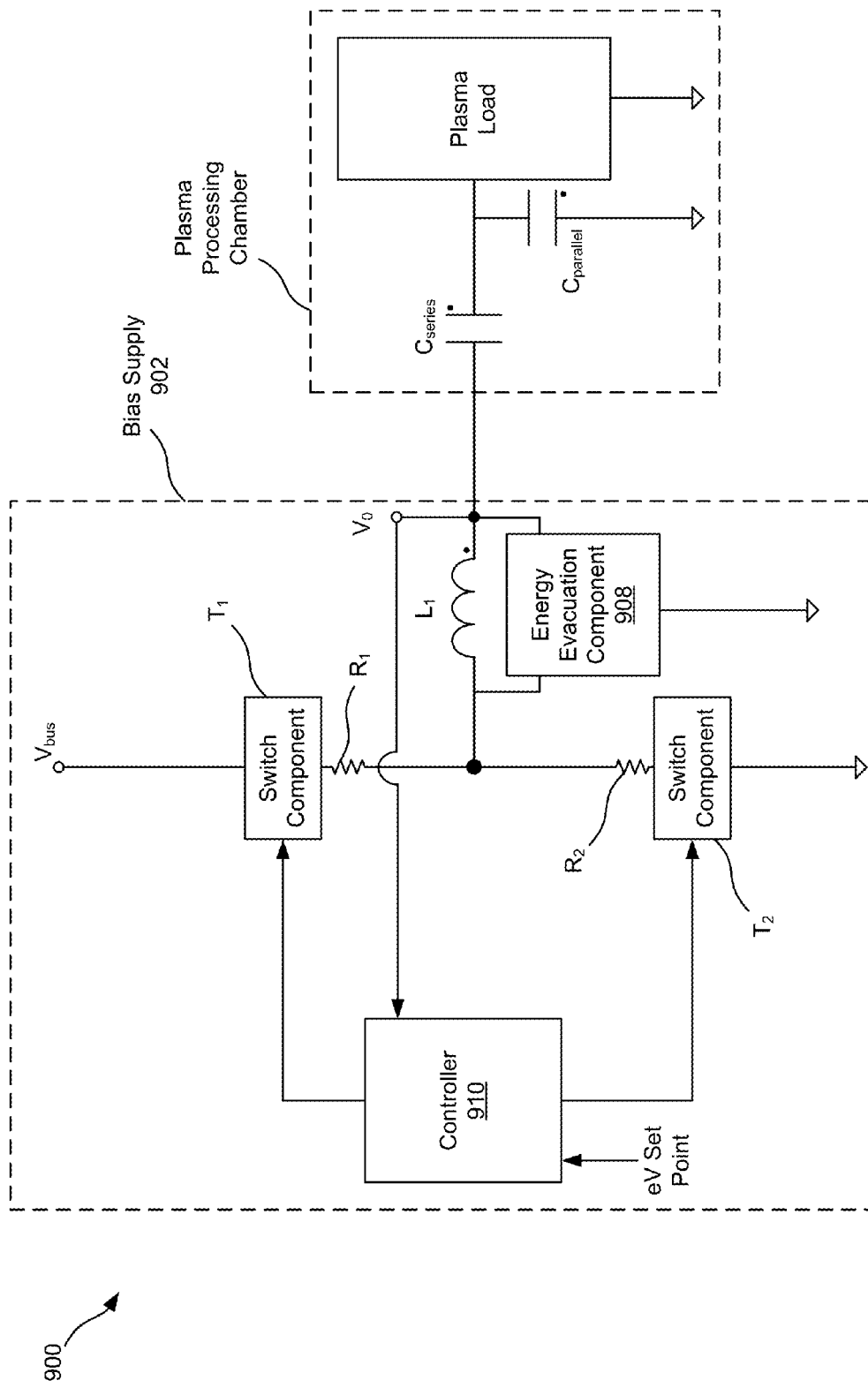
FIG. 9 is illustrates an inductance L1 between switch components $T_1$ and $T_2$ and the series capacitance, $C_{series}$.

FIG. 9 illustrates an inductance $L_1$ between switch components $T_1$ and $T_2$ and the series capacitance, $C_{series}$ (the use of $C_{series}$ assumes that there is no stray capacitance; where stray capacitance is considered, $C_{effective}$ can be used, where $C_{series}$ can be a part of $C_{effective}$). The inductance $L_1$ can represent a discrete inductor or a combination of a discrete inductor and inherent inductances. There is also an inherent resistance $R_1$ in the switch component $T_1$ as well as an inherent resistance $R_2$ in switch component $T_2$. The series combination of $R_1$ and $C_{series}$ acts as a RC circuit leading to an exponential decay or discharge of $C_{series}$ whenever the switch component $T_1$ is open and switch component $T_2$ is closed. The series combination of inherent inductance $L_1$ and series capacitance $C_{series}$ operates as an LC circuit having a resonant nature leading to the exchange of energy between $C_{series}$ and $L_1$ in a periodic fashion. Were $R_1$ to dominate over $L_1$ this RLC circuit would operate resistively and energy discharged from $C_{series}$ would be wasted as heat dissipated in $R_1$. This would be an inefficient and undesirable situation.

One alternative is for this RLC circuit to operate in a resonant regime in which $L_1$ dominates over $R_1$, and energy primarily is exchanged between $C_{series}$ and $L_1$ with only a small fraction of energy being lost to $R_1$. The downside of operating in a resonant fashion is that energy stored in the inductor $L_1$ and $C_{series}$ leads to what will be referred to as a 'memory,' wherein disturbances in one cycle affect the waveform of a subsequent cycle. Because of this memory, the voltage provided to the right-hand side of $C_{series}$, which is representative of a substrate surface within a plasma, may see inaccuracies or instability.

For instance in FIG. 12 a disturbance 1212 in the modified periodic voltage function measured at $V_0$ in FIG. 9 causes an inaccuracy in that $\Delta V'$ is smaller than it would have been without the disturbance and smaller than $\Delta V$ in the previous cycle. This leads to some ions being accelerated with $\Delta V$ and some being accelerated at $\Delta V'$, leading to a broader-than-desired, or smeared, IEDF. In FIG. 13 a disturbance 1308 causes an inaccuracy in that $\Delta V'$ is larger than it would have been without the disturbance and larger than $\Delta V$ of the previous cycle. In both cases, since $\Delta V'$ is other than expected and desired, there is an inaccuracy in ion energy.

Furthermore, since an inaccuracy in one cycle causes a further inaccuracy in the subsequent cycle, a single disturbance can cause instability—an increasing error in $\Delta V$ each cycle.

In order to have the bias supply 902 operate in an efficient resonant regime, the discrete inductor $L_1$ is used that renders the resistive effects of $R_1$ negligible. While $L_1$ represents at least an inductance of a discrete inductor, in some embodiments it can also represent inherent inductances as well, although these should be small relative to the inductance of the discrete inductor. For purposes of this disclosure, $L_1$ in FIG. 9 can refer to an inductance of a discrete inductor or to an inductance of a discrete inductor and inherent inductances. Either way, $L_1$ dominates over $R_1$, so that the bias supply 902 operates resonantly. But as described above, this along with the novel switching algorithm leads to unwanted stored energy in $L_1$ at the end of each cycle.

To solve the problems associated with excess energy being stored in $L_1$ when switch component $T_1$ opens, an energy evacuation component 908 can be used to remove this stored energy and to do so in a fraction of a cycle length. The energy evacuation component 908 can remove energy from $L_1$ at any point or any period during what is labeled $T_{evac}$ in FIGS. 14 and 15. In other words, the energy evacuation component 1408 can be activated at any time during $T_{evac}$. The particular time at which the energy evacuation component 908 begins to remove energy from the inductor $L_1$ is governed by controller 910 and the eV setpoint, which is provided to the controller 910. In particular, the switch component $T_1$ closes to begin a cycle and charge $C_{series}$. $V_0$ rises and would reach a maximum voltage (Max $V_0$) if the switch component $T_1$ were not opened at some point. In other words, if $C_{series}$ were charged indefinitely, $V_0$ would reach and settle at the Max $V_0$. $V_{bus}$ can be set such that $C_{series}$ can be charged beyond a level corresponding to a desired ion energy. In this way, if there is a disturbance in a previous cycle, the switch component $T_1$ can close and then open before $C_{series}$ is fully charged, thus achieving a desired $V_0$ regardless of disturbances. As $V_0$ rises, the controller 910 can receive voltage measurements from $V_o$ and compare these to the eV set point. When $V_o$ matches the eV set point, the controller 910 can instruct the switch component $T_1$ to open, thus cutting off the increase in $V_o$. At this time, or any time during $T_{evac}$, the controller 910 can instruct the energy evacuation component 908 to activate or begin removing energy from $L_1$.

The energy evacuation component 908 can include any variety of circuitry, such as batteries, capacitors, resistors, switches, and/or electrical connections to other portions of the bias supply 902 or any component that can benefit from the energy removed from $L_1$. For instance, the energy evacuation component 908 can include a battery or capacitive element that stores the energy evacuated from $L_1$ for later use (e.g., providing the energy back to $V_{bus}$ to supplement the rail voltage).

Figure 10:
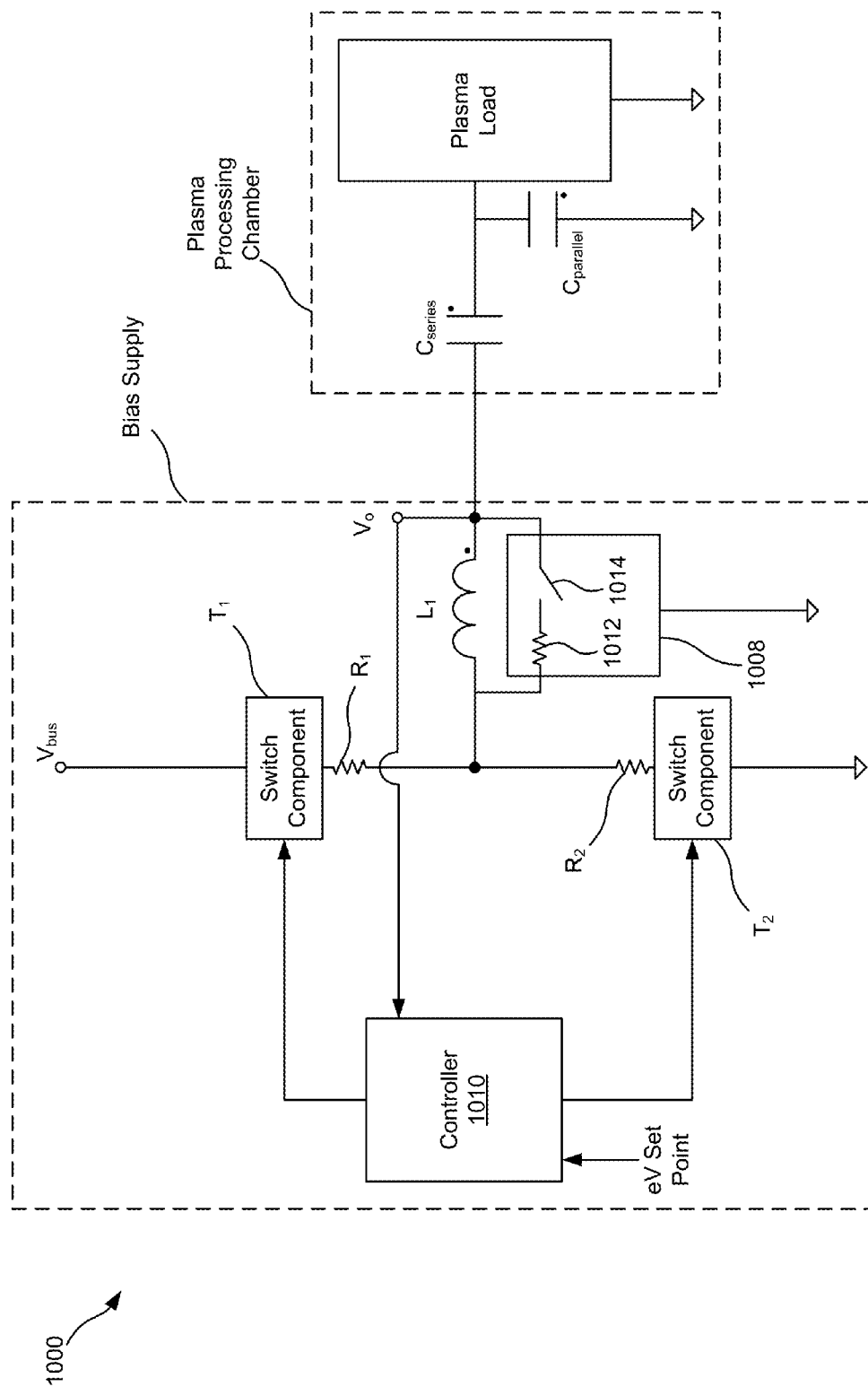
FIG. 10 is a bias supply with a particular embodiment of the energy evacuation component.

FIG. 10 illustrates a bias supply with a particular embodiment of the energy evacuation component. Here, a switch 1014 of the energy evacuation component 1008 closes at a point during $T_{evac}$ and any energy in $L_1$ is evacuated into the energy evacuation component 1008 and dissipated in a resistor 1012.

The controllers 910 and 1010, in some embodiments, can include an analog comparator or an A-to-D converter feeding a digital comparator.

Wide Dynamic Range

At low energies, the inaccuracies and instability discussed above, become more problematic. This makes it difficult to achieve a wide dynamic range for ion energies since a wide dynamic range of ion energies typically require at least one ion energy having a low value. The systems and methods discussed above can therefore be implemented to remove inaccuracies and instabilities at high energies, and especially at low energies, thus enabling a bias supply to achieve a wide dynamic range of ion energies in a plasma.

Fast Ion Energy Control

Certain applications call for a 'fast' change in ion energy, where 'fast' can include changes in ion energy within a few cycles of the modified periodic voltage function, or even from cycle to cycle. One way to change ion energy is to adjust $V_{bus}$ but this is difficult to do fast enough for 'fast' applications. However, using the switching algorithm discussed above and the energy evacuation component to remove excess energy stored in an inductor of a bias supply, ion energy can be adjusted from cycle to cycle (i.e., where a first cycle produces a first ion energy and a next cycle produces a second ion energy).

The systems and methods herein disclosed can adjust the ion energy without a change in $V_{bus}$. For instance, in FIGS. 12-15 it can be seen that various ion energies (different $\Delta V$) can be achieved for a given $V_{bus}$. Ion energy switching is so 'fast' that the ion energy for a cycle can even be selected while $V_0$ is rising. In other words, $\Delta V$, or the ion energy, can be decided upon at any time prior to the switching component $T_1$ being opened.

While 'fast' ion energy control can be advantageous when switching between different ion energies, it is also advantageous when a plasma is ignited, since the ability to stop charging $C_{series}$ at an exact eV set point greatly reduces if not eliminates transients in plasma ion energy that are sometimes seen when a plasma is ignited.

Pulsed Ion Energy Control

Figure 28:
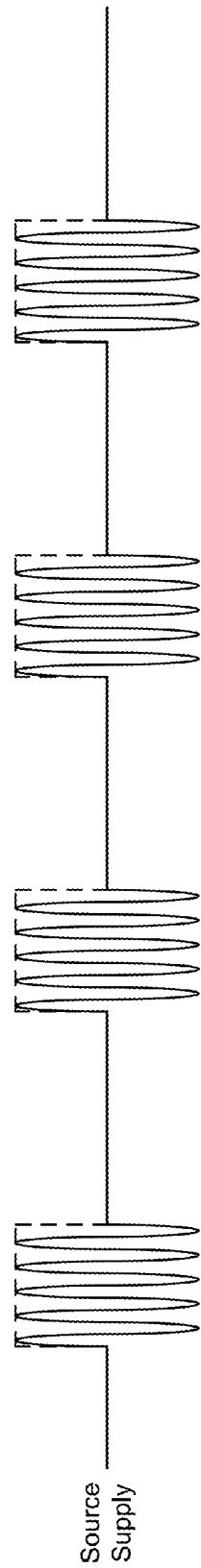
FIG. 28 is a source supply being pulsed within a pulse envelope indicated by dashed lines.

Many plasma processing recipes call for a pulsing envelope for RF power provided by a plasma source. FIG. 28 illustrates a pulsed source supply as a function of time. As seen, the RF sine wave is pulsed according to a pulse envelope indicated with dashed lines. Pulsing enables, for instance, the ratio of ions to free radicals to be controlled. In particular, free radicals typically have a longer lifetime than ions, and therefore, when the RF is turned off, the ratio of free radicals to ions increases with time. An increased ratio of radicals can affect, for instance, the relative etch rates of various materials on the surface of a work piece, which is advantageous in some recipes. However, to maintain a desired level of free radicals and ions, the RF power is turned back on, hence pulsing of the source supply is carried out. In some cases the source supply can be pulsed between two different RF amplitudes rather than between an RF amplitude and 0 for the purpose of maintaining a more consistent level of ions and radicals within the processing chamber.

Figure 29:
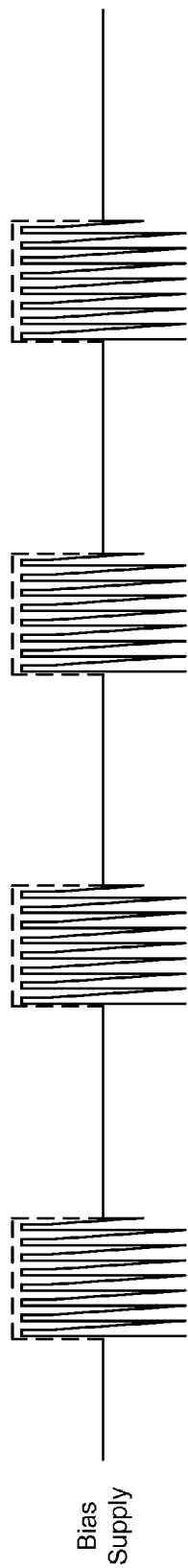
FIG. 29 is a modified periodic voltage for a bias supply being pulsed within a pulse envelope indicated by dashed lines
Figure 30:
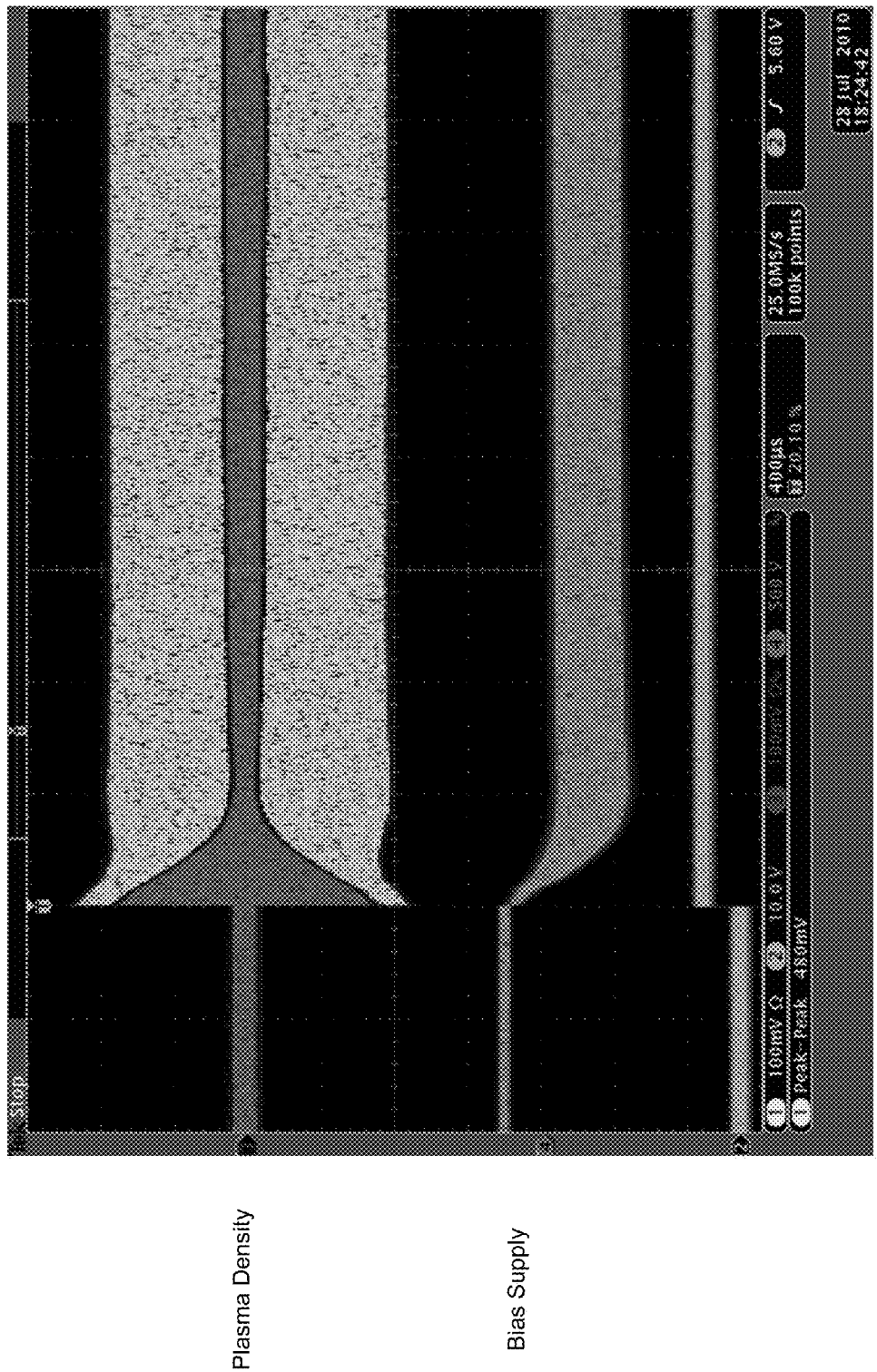
FIG. 30 shows measured waveforms for plasma density and bias supply.

When pulsed RF source supplies are used, bias supplies are typically synchronized in some manner to the source supply pulses (see FIG. 29). Where bilevel source supply voltages are used, the bias supply can also be pulsed between two different bias supply voltages. However, systems and methods in the art of pulsing multiple supplies suffer from various disadvantages. For instance, pulsed bias supplies can see transients in the ion density and ion energy every time that the bias supply is turned on. One example can be seen in FIG. 30, where the bias supply illustrates a slow turn-on transient in addition to an overshoot of the desired voltage target shortly after being turned on prior to settling into a desired voltage regime. Similarly, the intra-pulse turn-on transient seen on the source pulse envelope is affected by the turn-on of the bias supply. These transients can result in part from the fact that traditional bias supplies and plasma density are non-orthogonal—a change in bias supply voltage has a substantial effect on the plasma density. These transients not only make accurate processing recipes difficult to design, but when monitoring bias supply voltages, many methods in the art do not use data points from the transient regimes, thus injecting potential measurement and regulation errors while potentially increasing processing time. Some recipes may also call for rapid changes in ion energy within a given source supply pulse. Traditional systems and methods have difficulty controlling the ion energy with accuracy and stability and have difficulty making such changes at all within a period of time as short as a few cycles of the bias supply.

The systems and methods herein disclosed solve a number of these issues. FIG. 29 illustrates a modified periodic voltage for a bias supply, such as the bias supply 902 of FIG. 9, being pulsed within a pulse envelope indicated by dashed lines. The pulses of the bias supply are synchronized with those of the source supply in FIG. 28. Transients, such as that seen in FIG. 30, can be reduced and possibly eliminated since the maximum voltage of the modified periodic voltage function produced by the herein disclosed bias supply can be accurately controlled via opening a switch component $T_1$ at the exact moment needed to achieve a desired ion energy. These systems and methods also enable orthogonality between the ion energy control and the plasma density control. Thus, the same systems and methods that previously were described as reducing inaccuracy and instability in ion energy have the additional benefit of avoiding transients during pulsed bias supply operation and enabling orthogonality between the ion energy and plasma density controls.

Transients are also avoided since the systems and methods herein disclosed achieve a nearly orthogonal relationship between ion energy and plasma density—thus pulsing of the bias supply (e.g., 902) has a negligible effect on plasma density.

Further, because the herein disclosed systems and methods can be used to achieve 'fast' ion energy changes (e.g., changing ion energy from cycle-to-cycle), ion energy can be altered one or more times within a single source supply or bias supply pulse.

The systems and methods discussed relative to the wide dynamic range can also be used in pulsed bias supply embodiments to achieve wide dynamic ranges of multiple ion energies within a single pulse of the bias supply.

Along with changes to ion energy as discussed above, in other embodiments the ion energy distribution function (IEDF) can be adjusted from cycle-to-cycle. In other words, within a given pulse of the bias supply, the IEDF and/or ion energy can be adjusted one or more times.

Pulsed bias supply embodiments can further benefit from the ability to set presets for $I_C$. Thus, at the start of a bias supply pulse, $I_c$ can be 'guessed' so that a desired ion energy can be achieved in less time. For instance, as previously discussed, some iterations may be required to determine a minimum IEDF after which time the desired ion energy can be set. By starting such iterations with an $I_C$ based on prior IEDF settings, the minimum IEDF may be found quicker and thus the desired ion energy can be established sooner. In other embodiments, the $I_C$ used in a previous pulse can be used as an initial condition at the start of a subsequent pulse to again decrease the time used to set ion energy for the pulse. Further, if multiple ion energies are to be set in a given pulse, than the $I_C$ used in the previous pulse or previous pulses can be used as initial conditions for setting the various ion energies in subsequent pulses. Similarly, $C_2$ or its more accurate derivative, $C_{series}/(C_2+C_{series})$ can be used as initial conditions in combination with or alternatively to $I_C$.

Pulsing embodiments can also benefit from the ability to measure plasma density via ion current and $C_2$ as discussed earlier, but here applied to pulsed bias supply situations. This leads to further embodiments, in which the bias supply can be controlled based upon measurements of plasma density during pulse operation. For instance, bias supply pulses can be triggered, or regulated in amplitude, duty factor, etc., based on a plasma density threshold (e.g., the bias supply can turn on when the plasma density falls below a threshold). In another example, changes to ion energy or the eV set point can be triggered by the plasma density falling below or rising above a plasma density threshold. The ion energy and IEDF within a bias supply pulse can also be controlled as a function of plasma density.

In other embodiments, the source supply can be controlled as a function of plasma density. For instance, pulses of the source supply can be triggered, or amplitude, duty factor, etc. of the pulse envelope, can be regulated based on the plasma density crossing a plasma density threshold or for the purpose of maintaining plasma density near to a desired level.

Virtual Front Panel

FIGS. 31 to 52 illustrate various 'virtual front panel' (VFP) displays associated with a bias supply as disclosed earlier. The VFPs can have a variety of controls (e.g., buttons, sliders, radio buttons), indicators (e.g., color indicators, bar indicators, numerical indicators), and graphs or charts (e.g., voltage versus time). The VFPs can include controls and monitoring charts and indicators for controlling a bias supply and or a source supply. For instance, the VFPs can enable control of eV setpoints and IEDF shapes and widths and monitoring of achieved ion energies and IEDF shapes and widths. The VFPs can also be used to monitor ion current, $I_I$, as well as calibration of a bias supply and/or plasma processing chamber. These are just a few of the many embodiments in which a VFP can be used.

The VFPs can be embodied in a single display (e.g., LCD flat panel display embedded in a bias supply or coupled to a bias supply) or multiple displays. The VFP can include touch-sensitive control.

Figure 31:
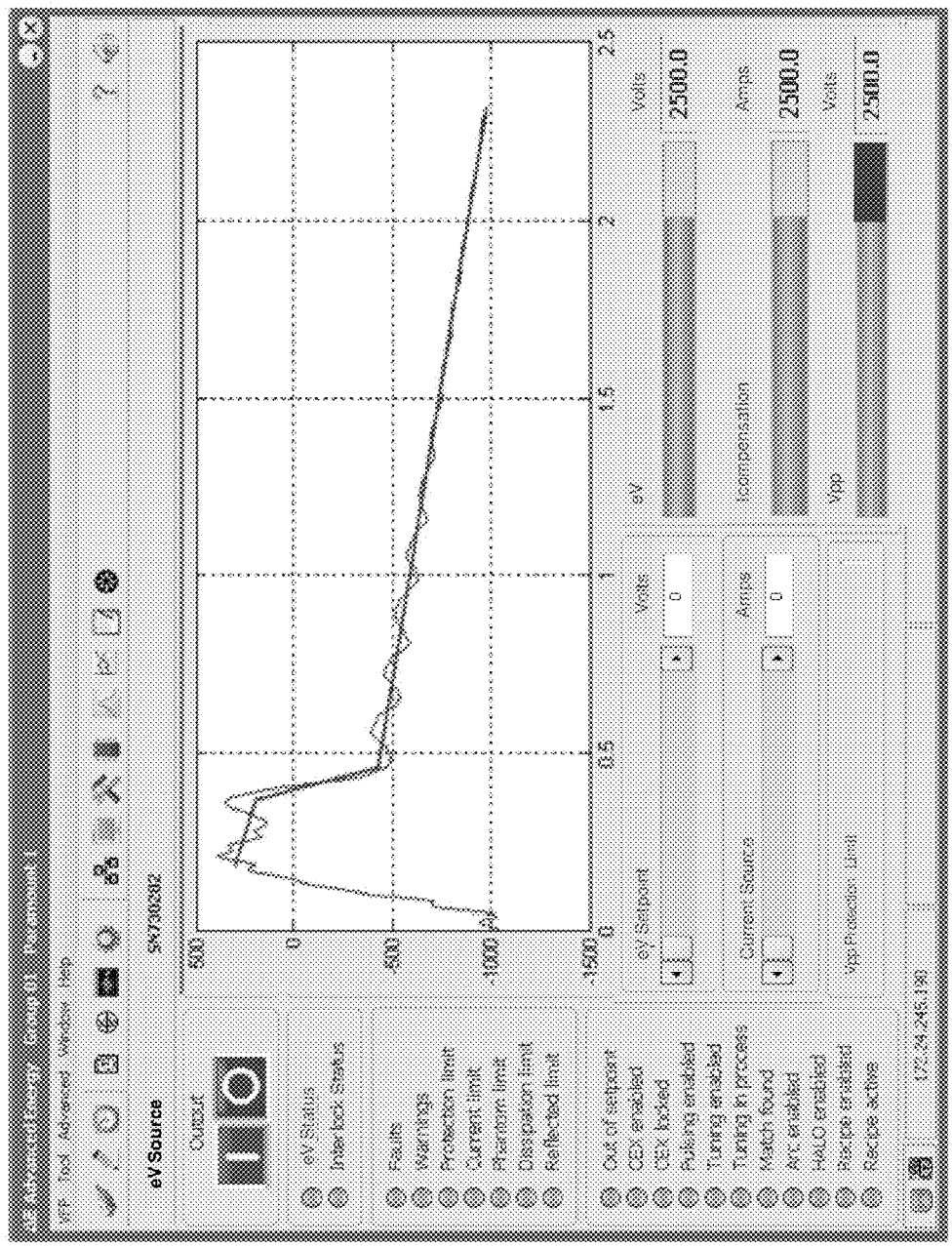
FIG. 31 is an embodiment of a virtual front panel.
Figure 32:
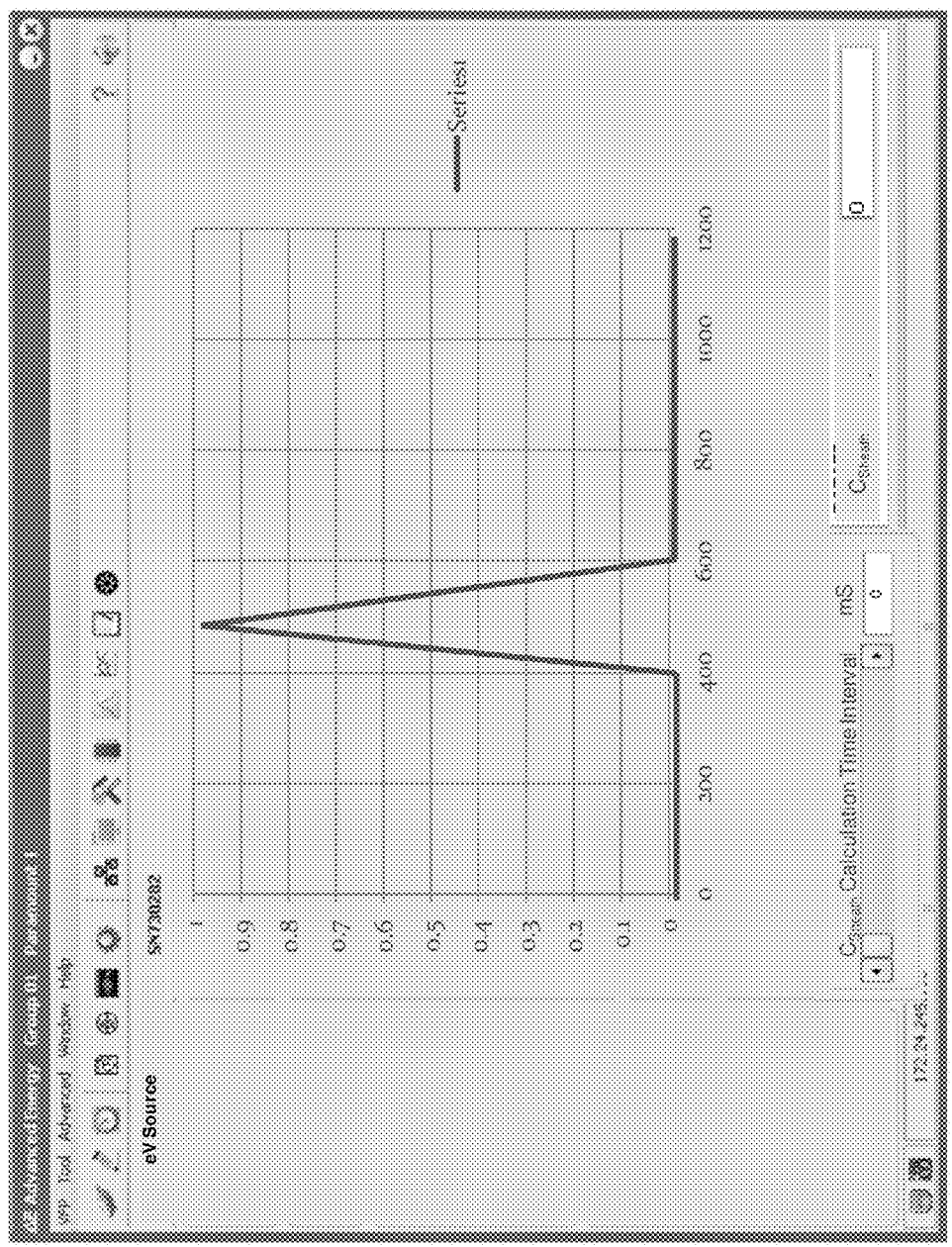
FIG. 32 is an embodiment of a virtual front panel.

FIG. 31 illustrates a VFP charting a modified periodic voltage function. The VFP further includes a power output control to toggle a bias supply output on and off. A number of warning indicators are arranged down the left side of the VFP. There are also bars and numerical indicators for showing a ion energy (eV), an ion current compensation, $I_C$ (Icompensation), and a peak-to-peak voltage ($V_{pp}$).

Figure 33:
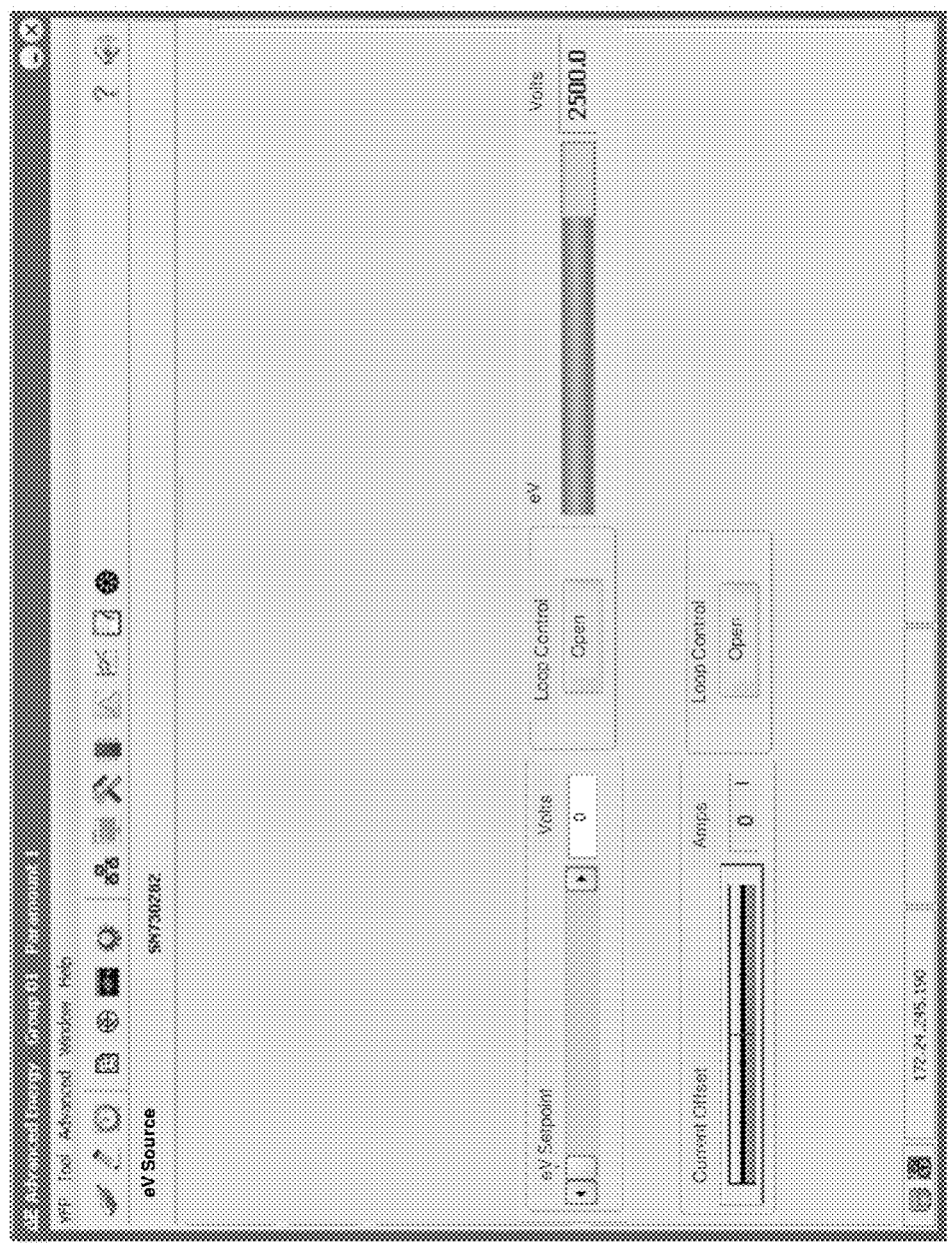
FIG. 33 is an embodiment of a virtual front panel.

FIG. 33 illustrates a VFP shows two controls of a bias supply, one for an ion energy set point (eV setpoint) and another for an ion current compensation (Current Offset). The VFP also has a bar indicator for the measured ion energy (eV).

Figure 35:
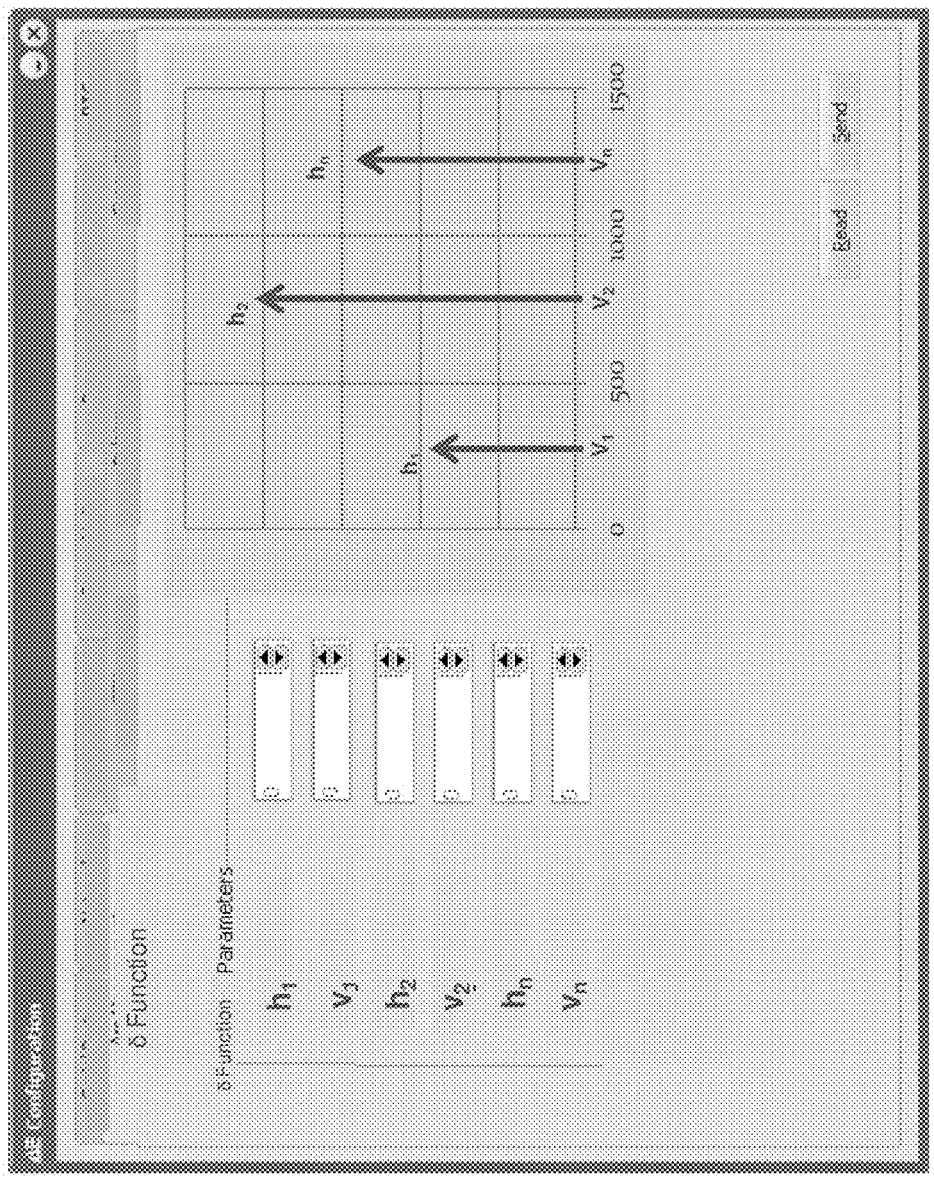
FIG. 35 is an embodiment of a virtual front panel.

FIG. 35 illustrates a VFP having a chart for three ion energies. The chart can either be a readout or an input screen. For instance, the chart can be used to indicate the achieved ion energies and the concentrations of ions at each of the three ion energies, or the chart can be used to show ion energies and concentrations that the system is to try and achieve.

Figure 36:
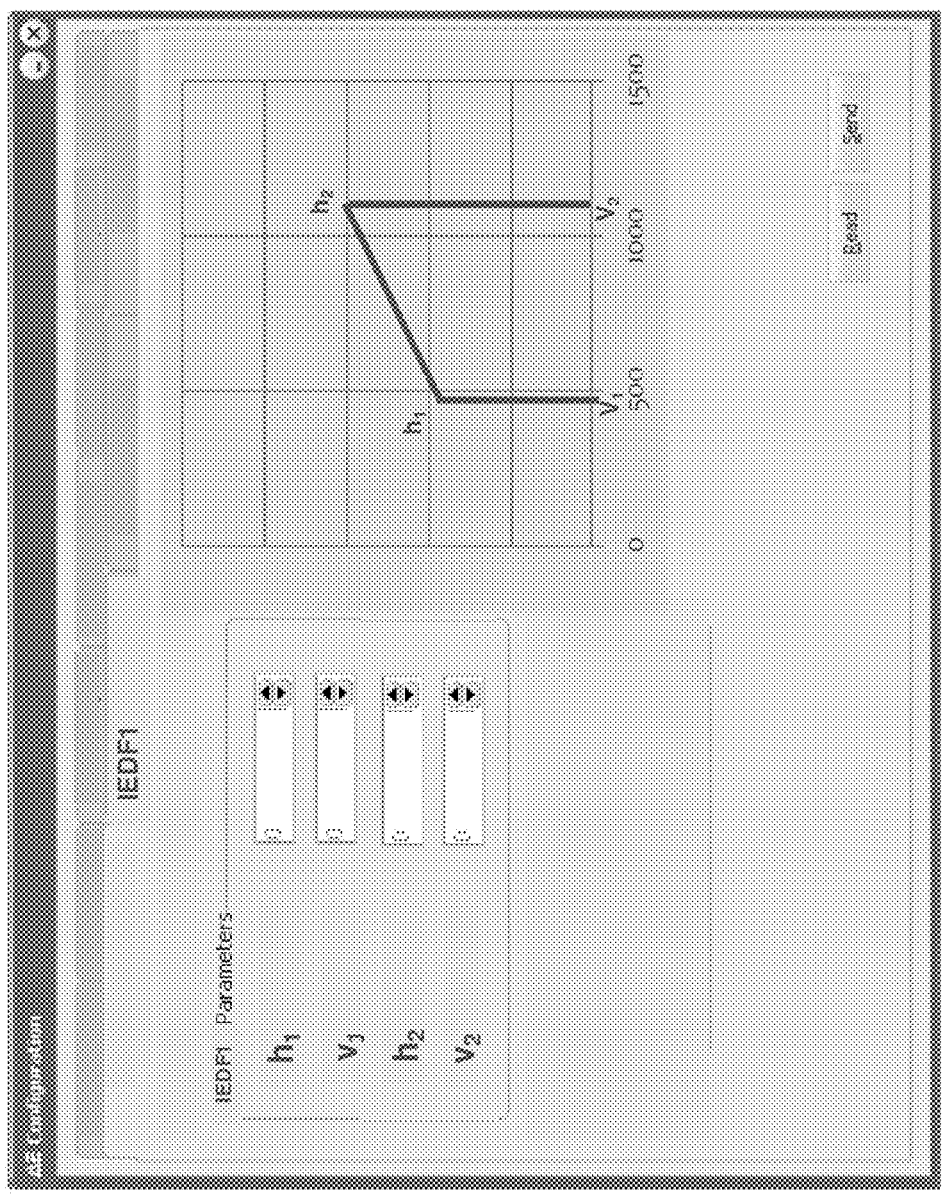
FIG. 36 is an embodiment of a virtual front panel.

FIG. 36 illustrates a VFP having a chart for an ion energy distribution function having a trapezoidal shape. The IEDF stretches from just below 500 to just above 1000 eV where the concentration of ions increases with ion energy. The VFP also includes controls on the left for controlling the low and high ends of the IEDF as well as a concentration of ions at both ends.

Figure 37:
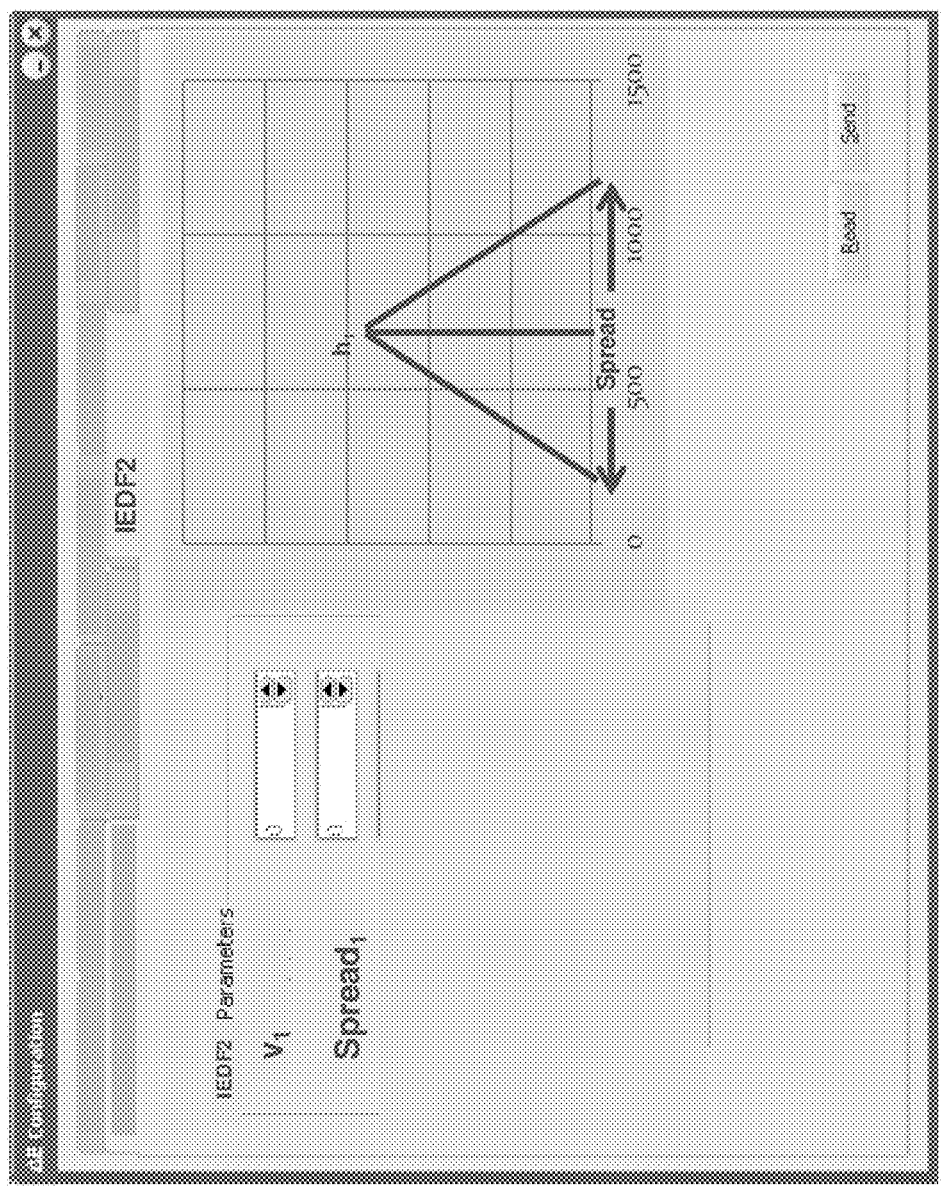
FIG. 37 is an embodiment of a virtual front panel.

FIG. 37 illustrates a VFP for controlling a spread of ion energies ($Spread_1$) around an ion energy $V_1$. In the illustrated embodiments, the concentration of ions at each energy drops off towards 0 for energies moving away from $V_1$.

Figure 38:
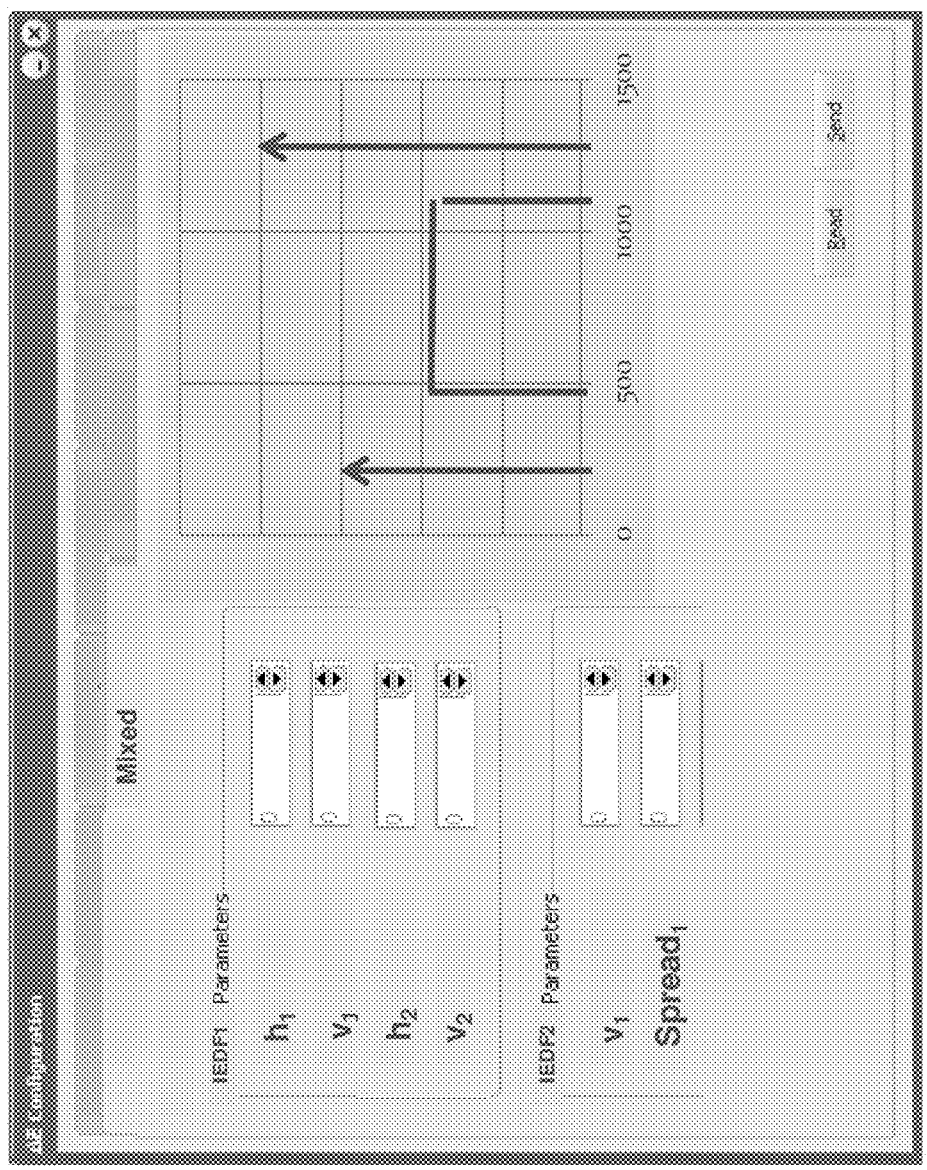
FIG. 38 is an embodiment of a virtual front panel.

FIG. 38 illustrates a VFP for controlling two narrow IEDF and one IEDF having a defined spread. As seen, two narrow IEDFs can exist at $h_1$ and $h_2$, and have ion concentrations equal to $v_1$ and $v_2$. The IEDF2 Parameters control the center ion energy of the wide IEDF ($V_1$) and the IEDF spread ($Spread_1$).

Figure 39:
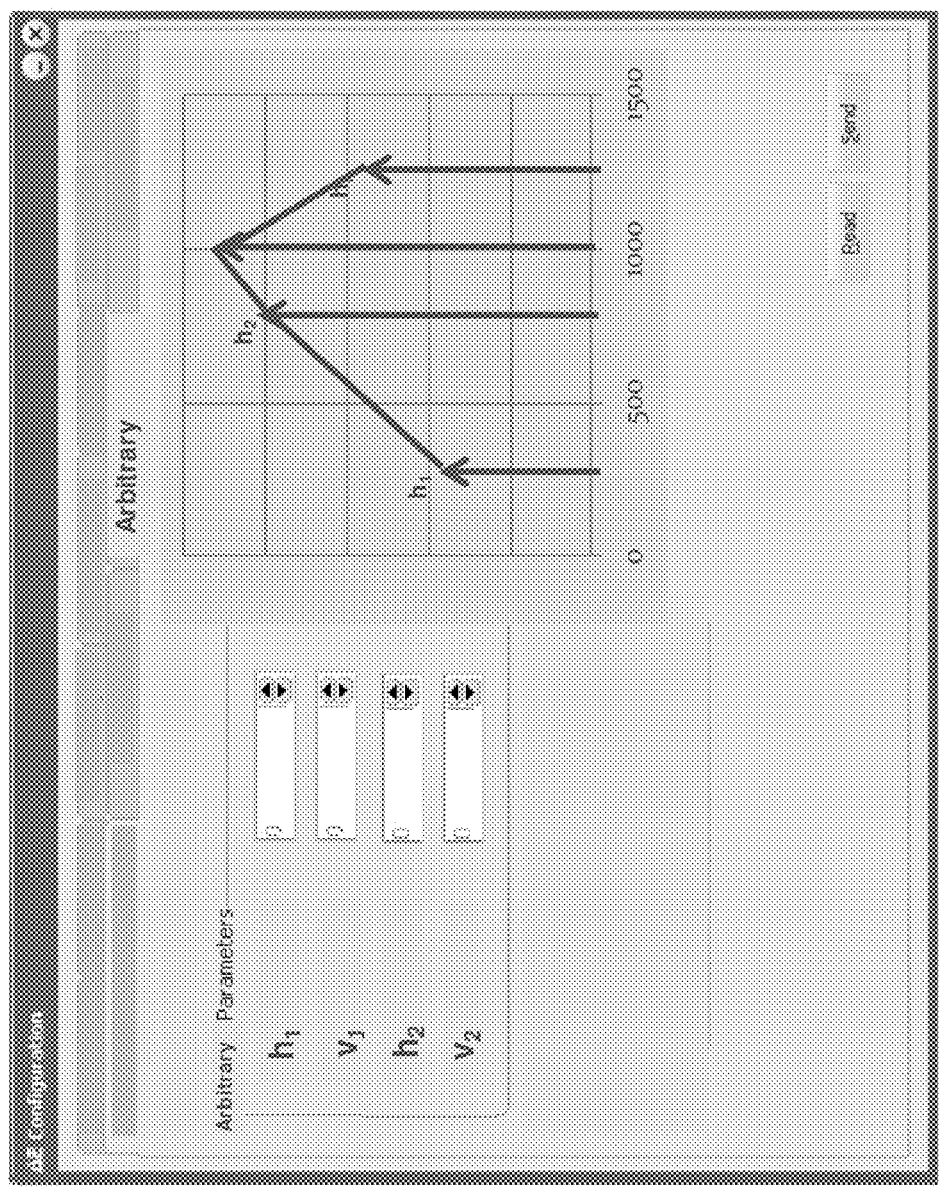
FIG. 39 is an embodiment of a virtual front panel.

FIG. 39 illustrates a VFP for controlling an IEDF comprising four ion energies each having particular concentrations where a spread between any two adjacent ion energies has a concentration that linearly connects the two adjacent ion energies.

Figure 40:
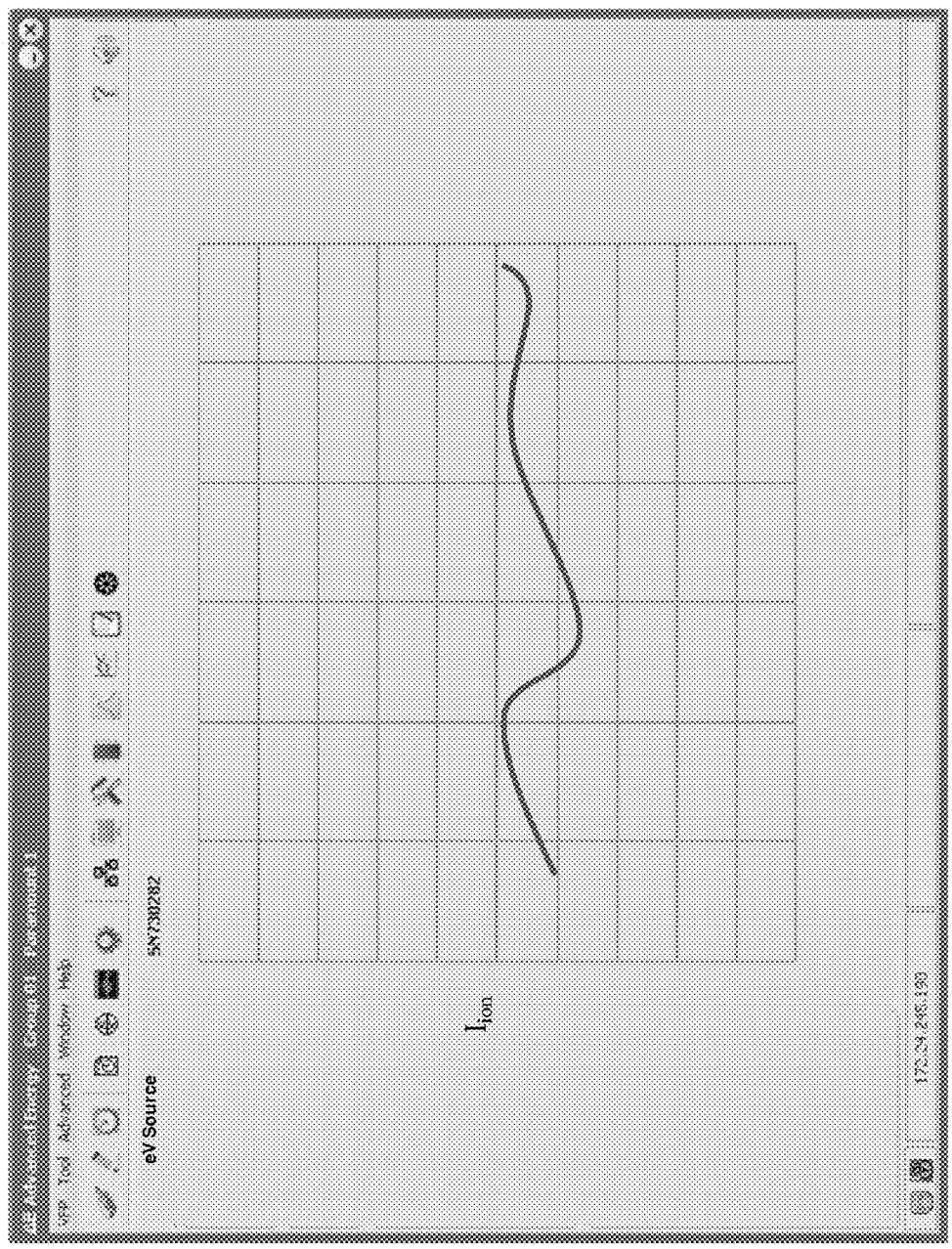
FIG. 40 is an embodiment of a virtual front panel.
Figure 41:
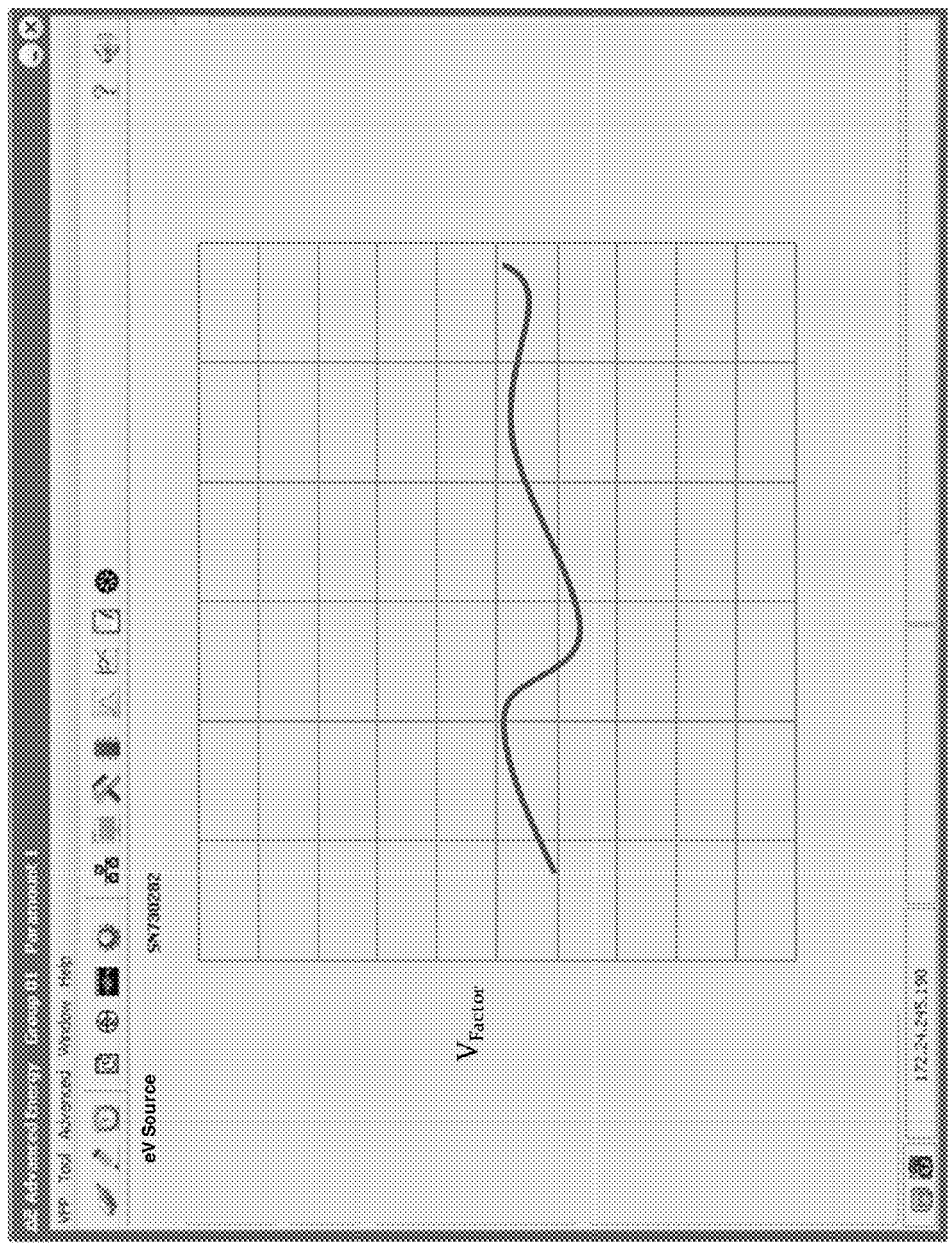
FIG. 41 is an embodiment of a virtual front panel.
Figure 42:
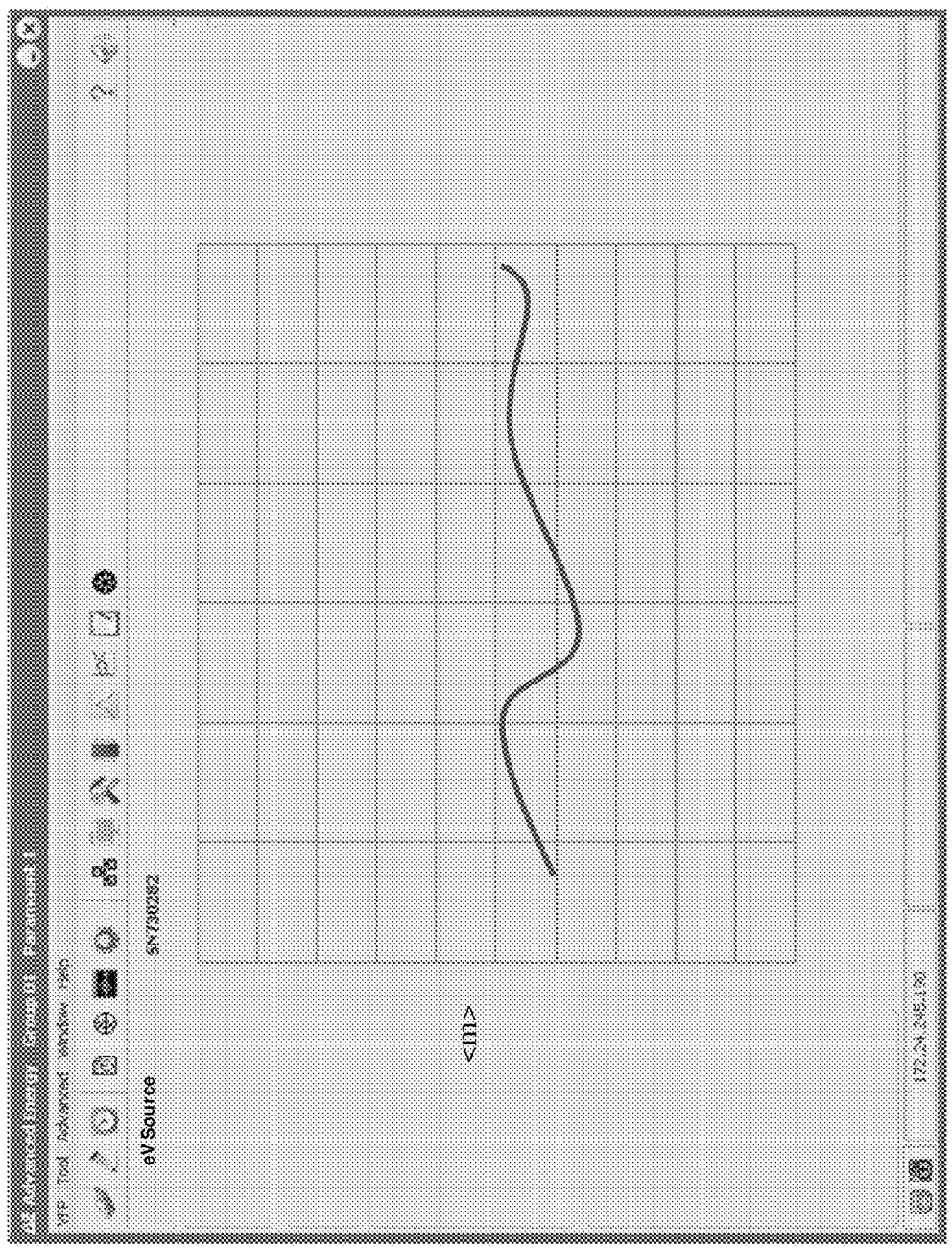
FIG. 42 is an embodiment of a virtual front panel.

FIG. 40 illustrates a VFP charting ion energy, $I_{ion}$, as a function of time or position.

Figure 43:
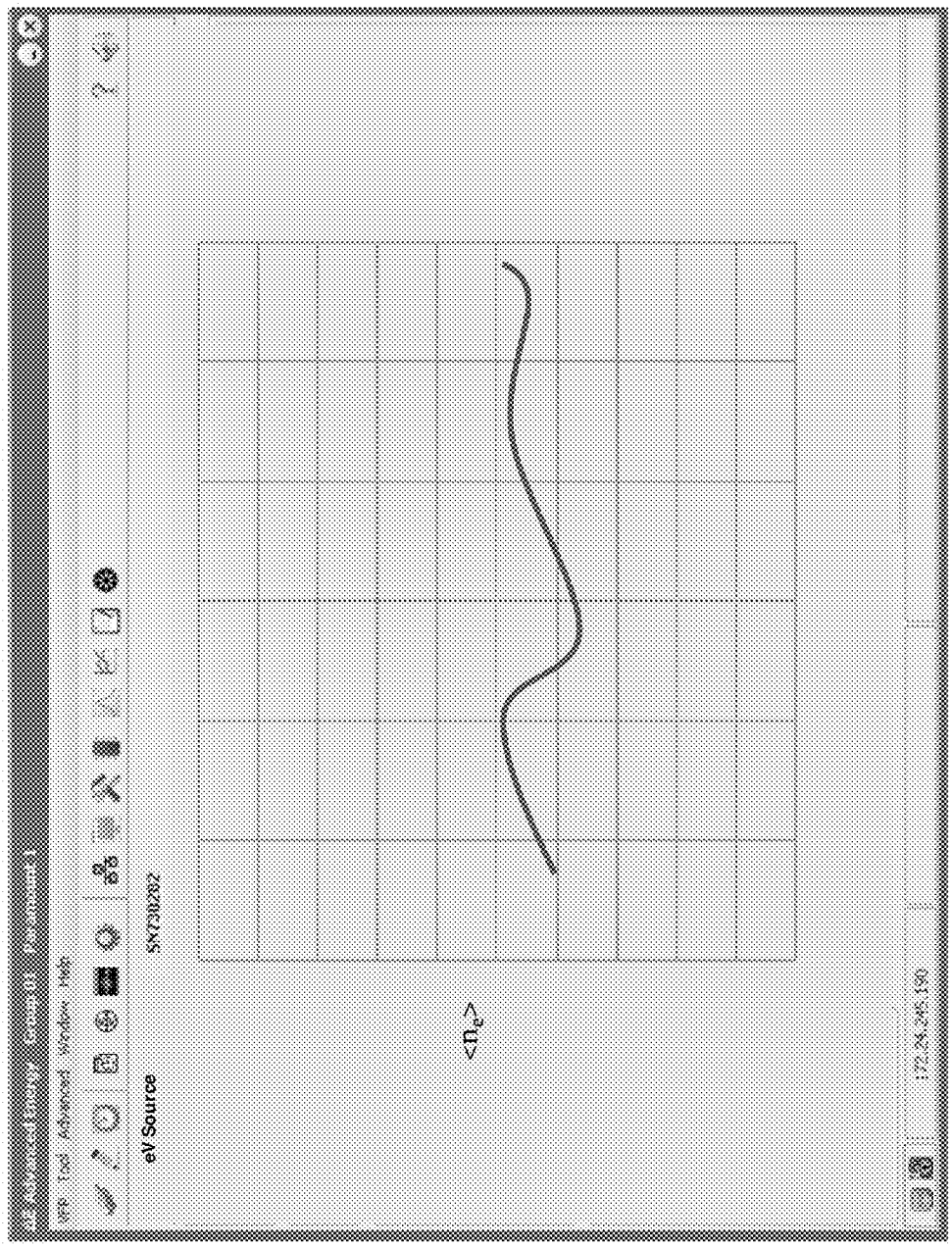
FIG. 43 is an embodiment of a virtual front panel.

FIG. 43 illustrates a VFP charting plasma density, $n_e$, as a function of time or position.

Figure 44:
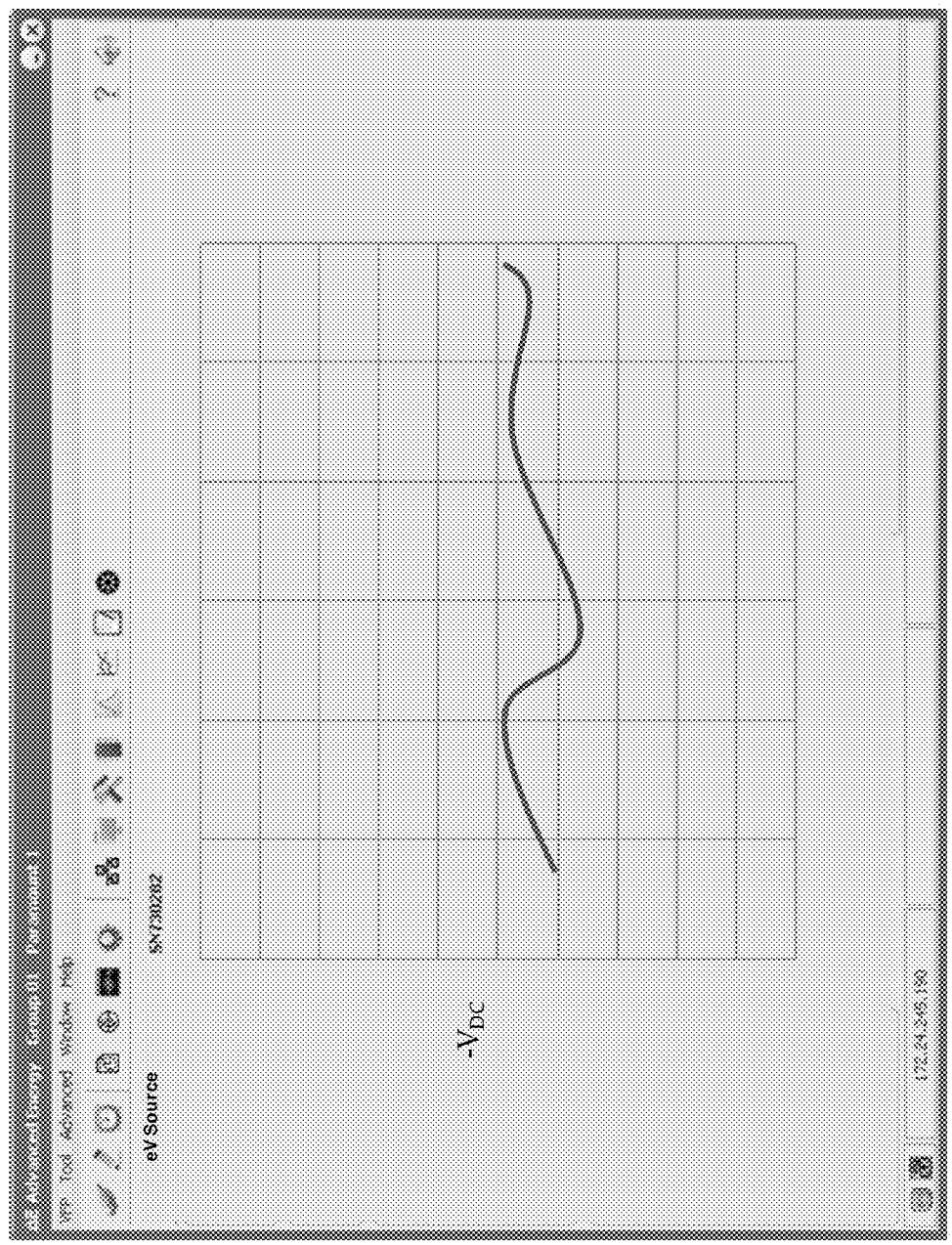
FIG. 44 is an embodiment of a virtual front panel.
Figure 45:
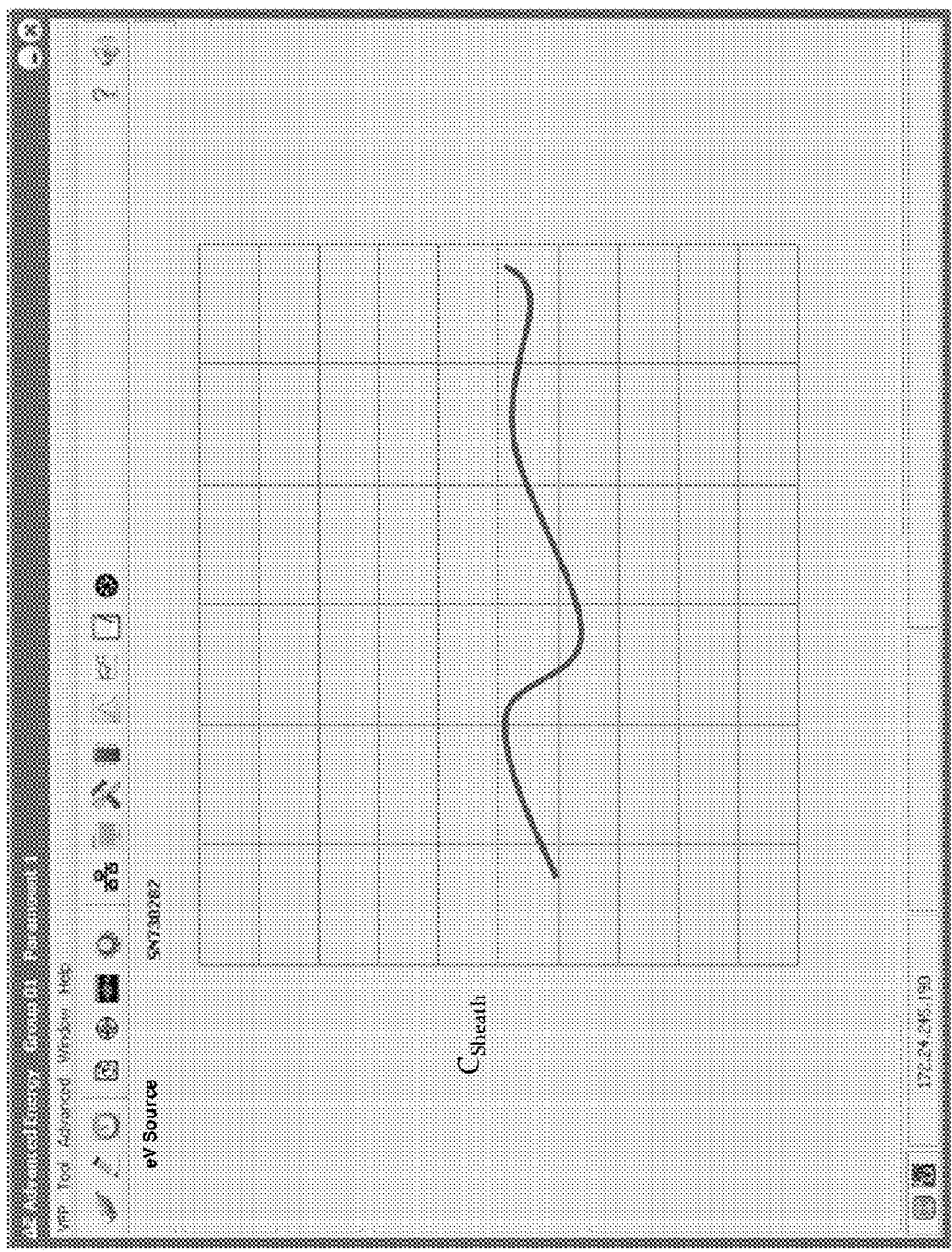
FIG. 45 is an embodiment of a virtual front panel.
Figure 46:
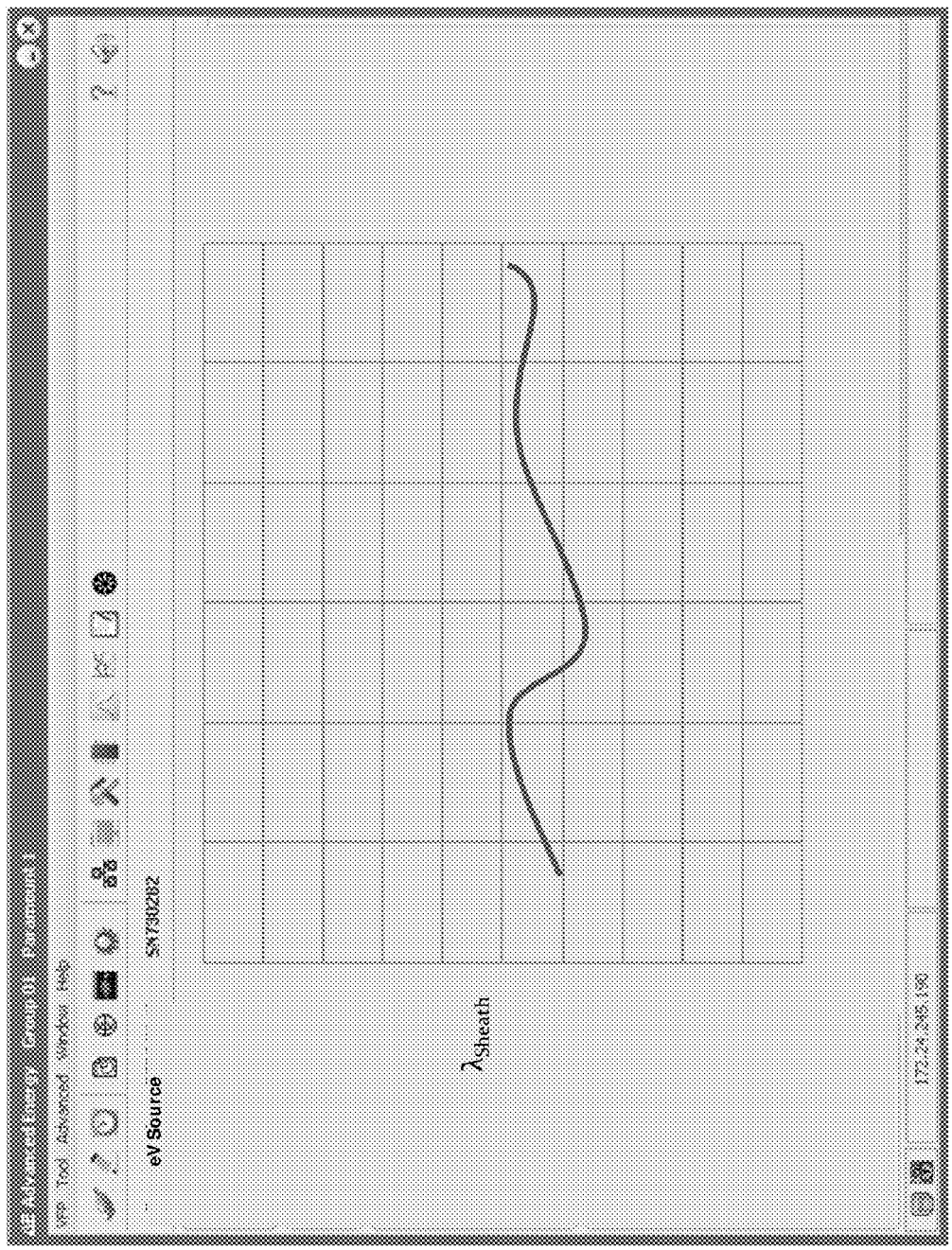
FIG. 46 is an embodiment of a virtual front panel.
Figure 47:
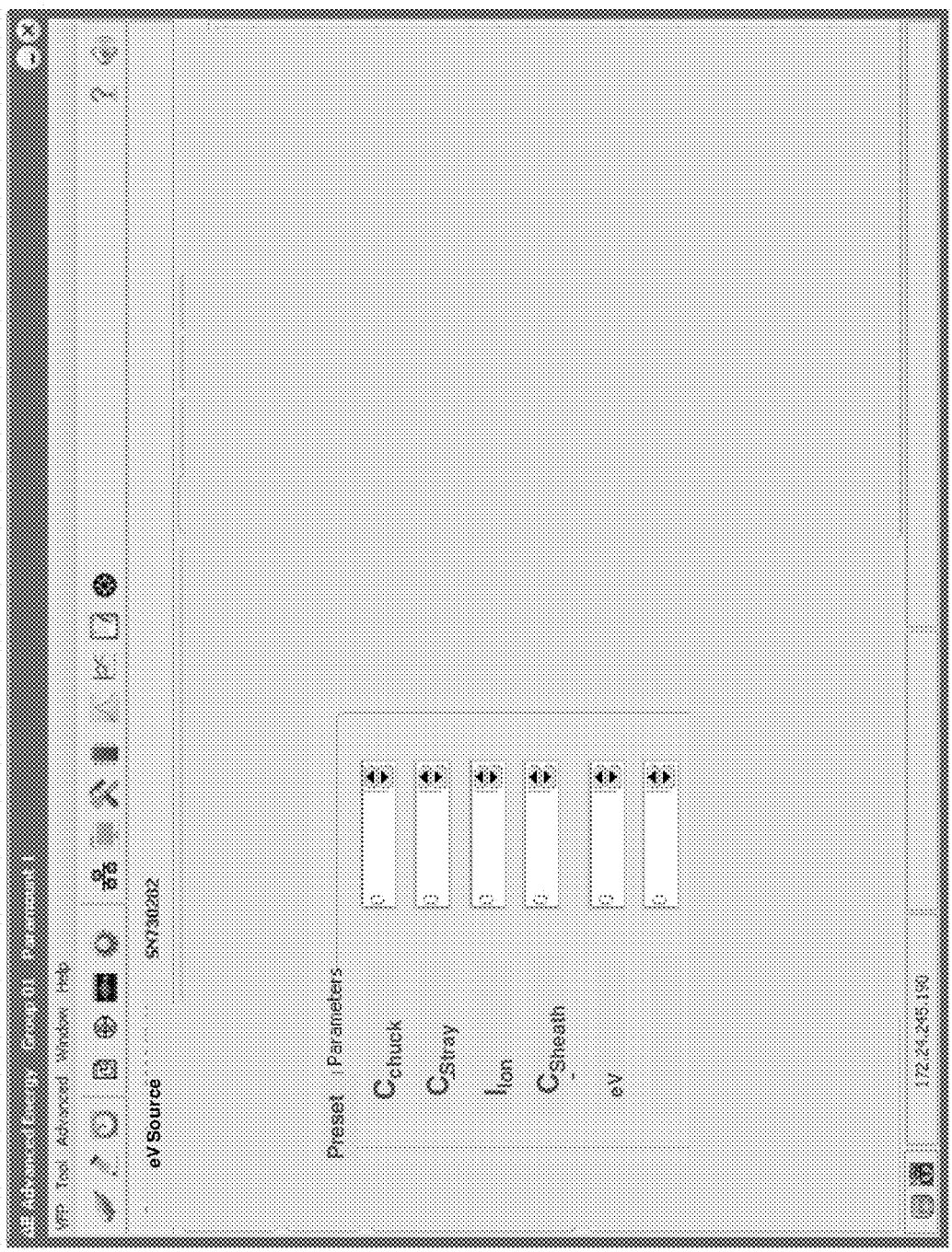
FIG. 47 is an embodiment of a virtual front panel.
Figure 48:
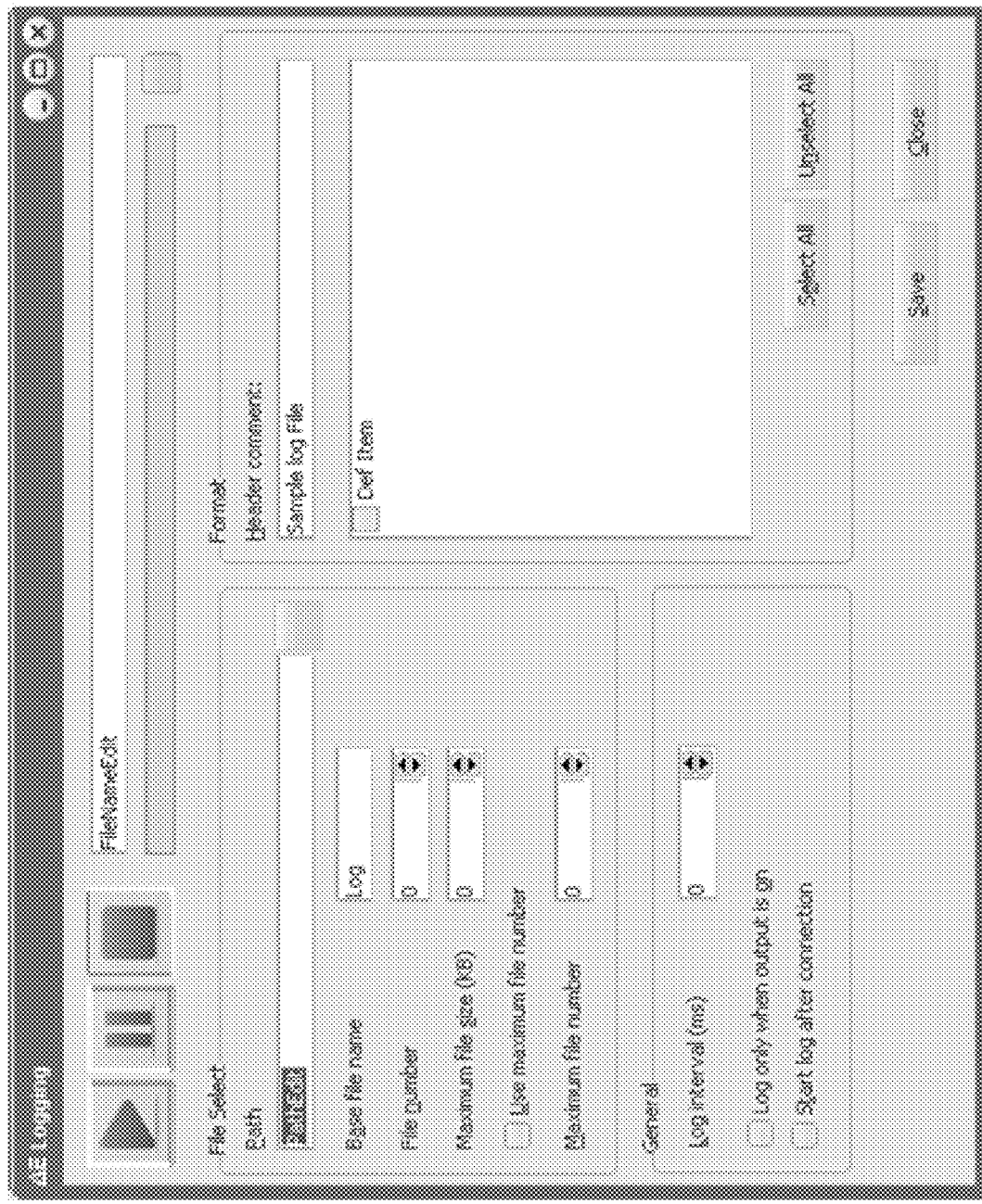
FIG. 48 is an embodiment of a virtual front panel.
Figure 49:
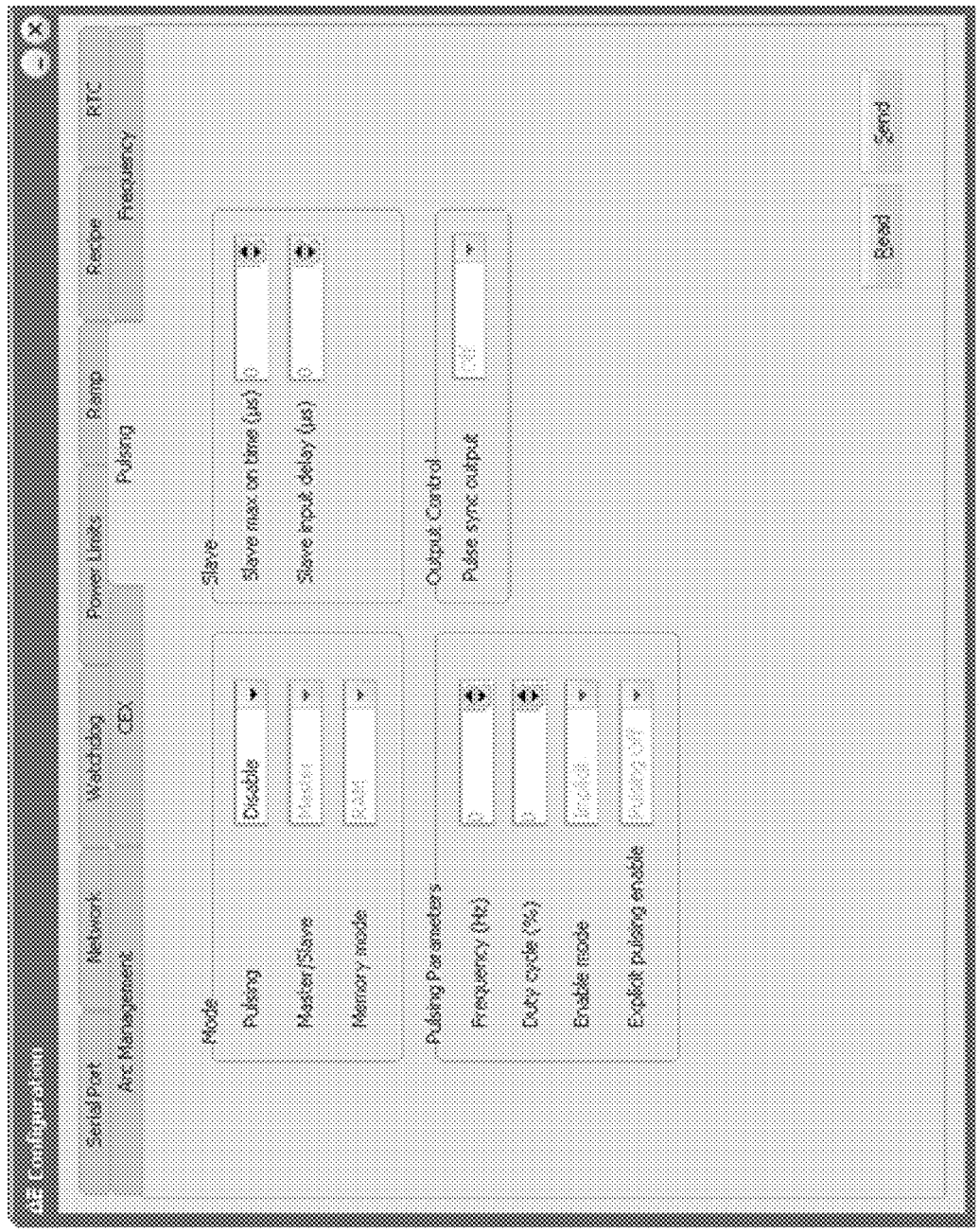
FIG. 49 is an embodiment of a virtual front panel.
Figure 50:
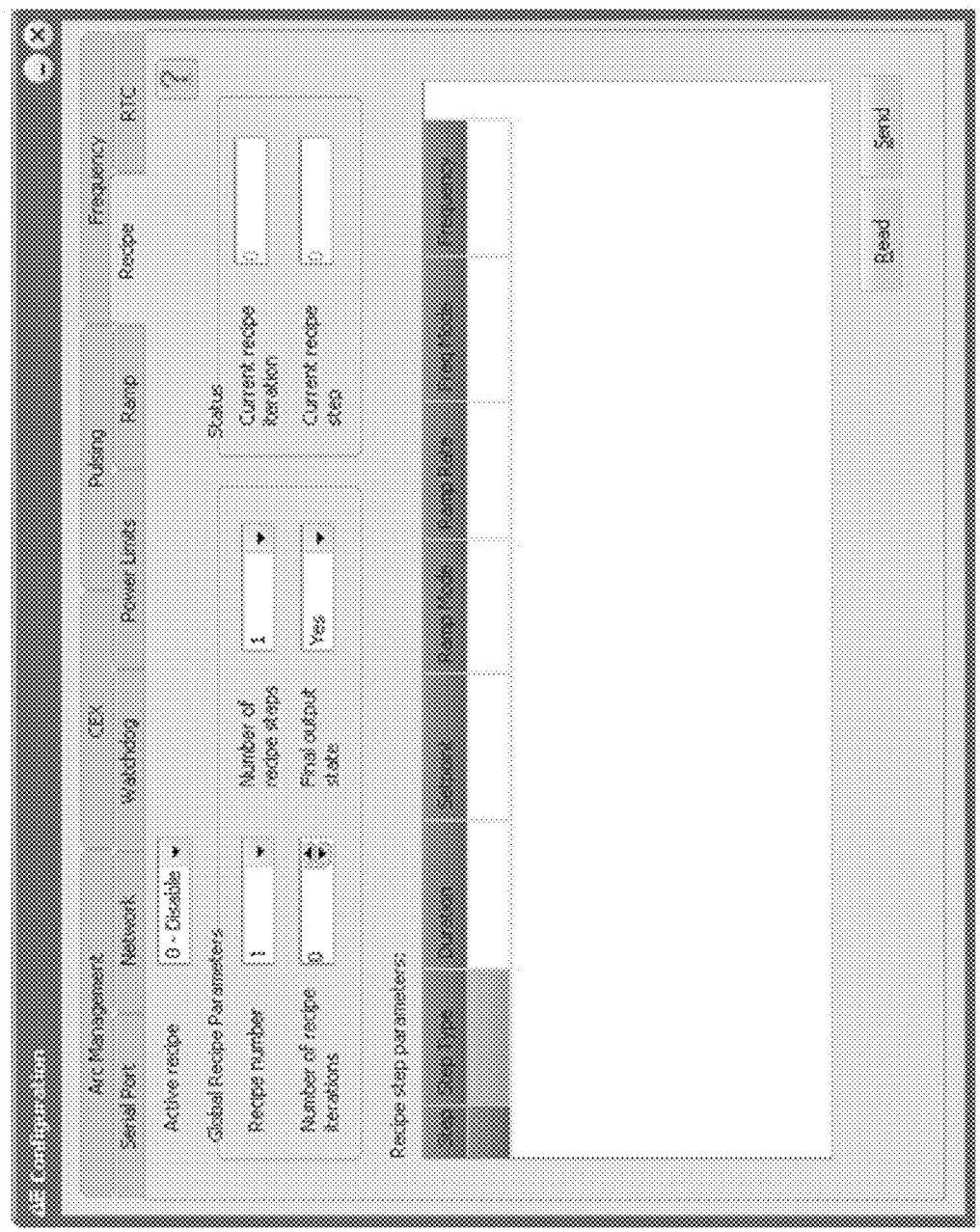
FIG. 50 is an embodiment of a virtual front panel.
Figure 51:
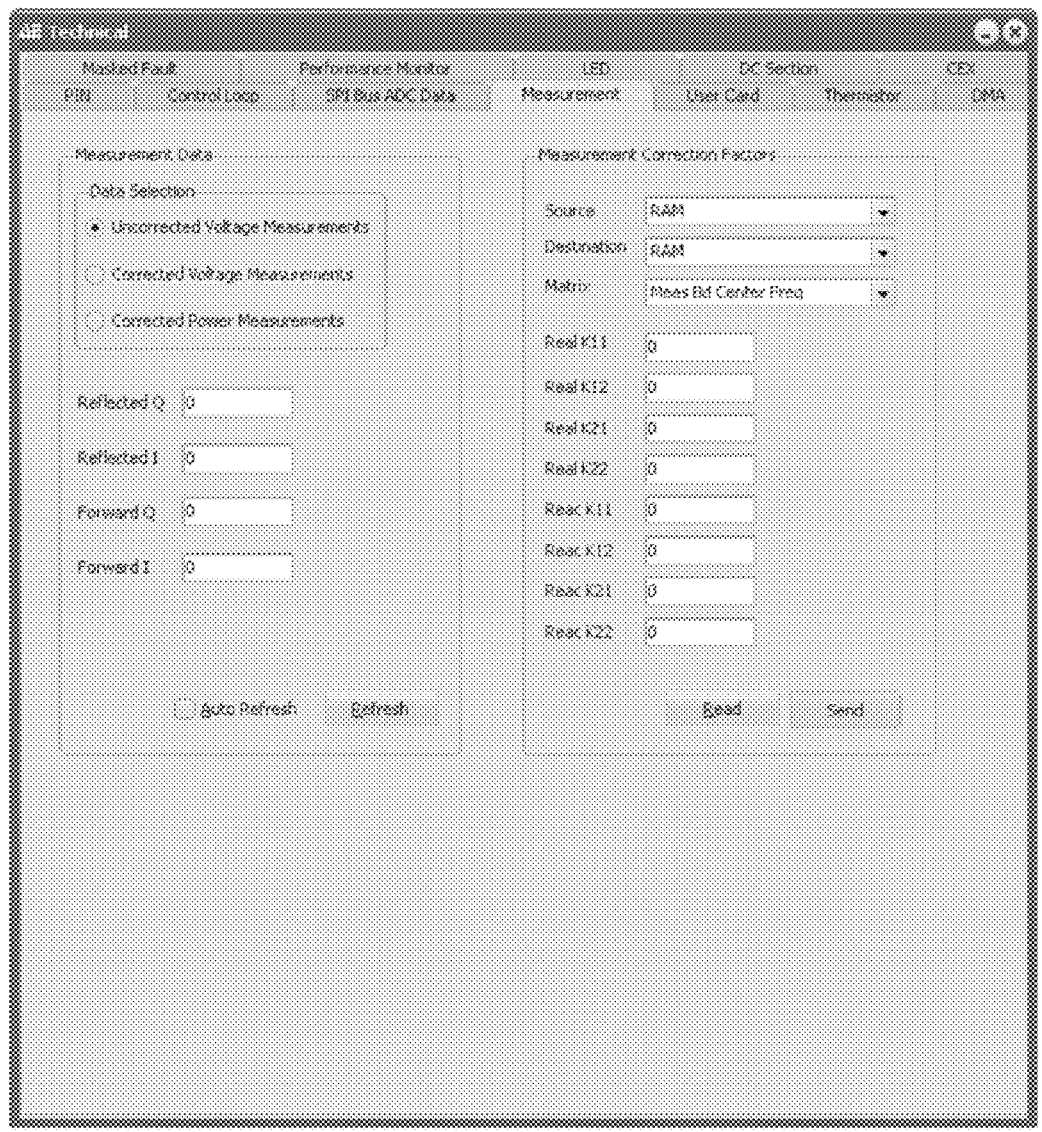
FIG. 51 is an embodiment of a virtual front panel.
Figure 52:
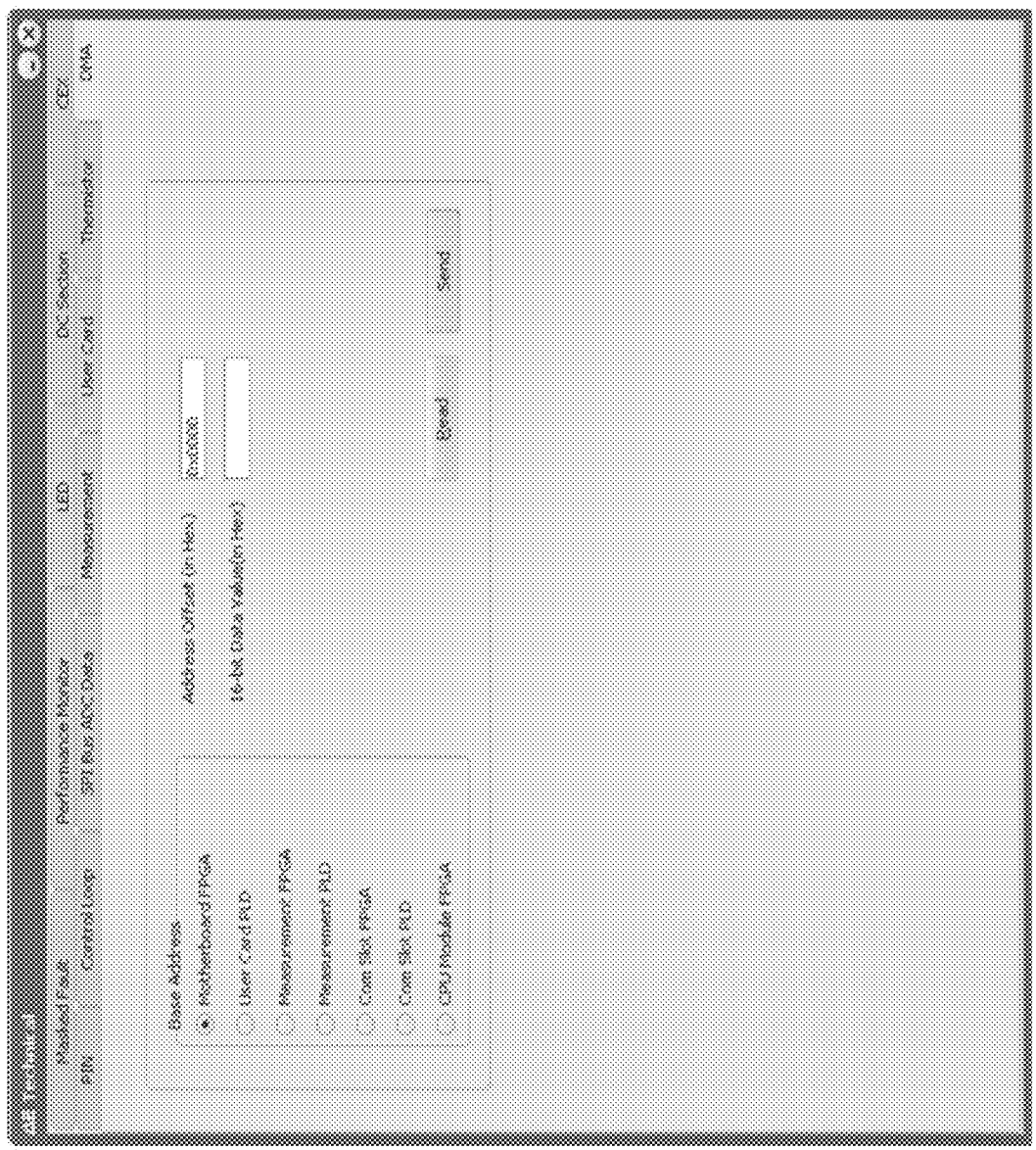
FIG. 52 is an embodiment of a virtual front panel.

FIG. 44 illustrates a VFP charting a substrate potential, $V_{DC}$, as a function of time or position.

Pulsed Heater

In a typical chuck there is an electrical heating system that may be powered from the AC distribution system of the premises where the processing chamber is housed. It is known that RF power can potentially propagate to the AC distribution system. To prevent this undesirable current path, an RF filter may be placed in the heating system so that it passes the 60 Hz or 50 Hz distribution power, but acts as a trap for the RF frequencies (e.g., 13.56 MHz or 60 MHz). But in some instances, there is not enough physical space for a filter (or two filters) because the filter must handle a substantial amount of power, and when a bias substrate supply is utilized, there are several frequencies that are applied (e.g., from 0.4 to 5 MHz), so a filter is difficult to design.

As a consequence, instead of utilizing a typical filter, a pulse may be generated with a heater power supply that is applied to a primary side of a transformer that has low inter-winding capacitance. The power is passed to a secondary of the transformer, then rectified and applied to the heater. The low capacitance barrier of the transformer does not allow a broad range of frequencies to pass from the secondary back to the primary of the transformer; thus preventing unwanted frequencies from propagating to the AC distribution system of the premises.

Figure 53:
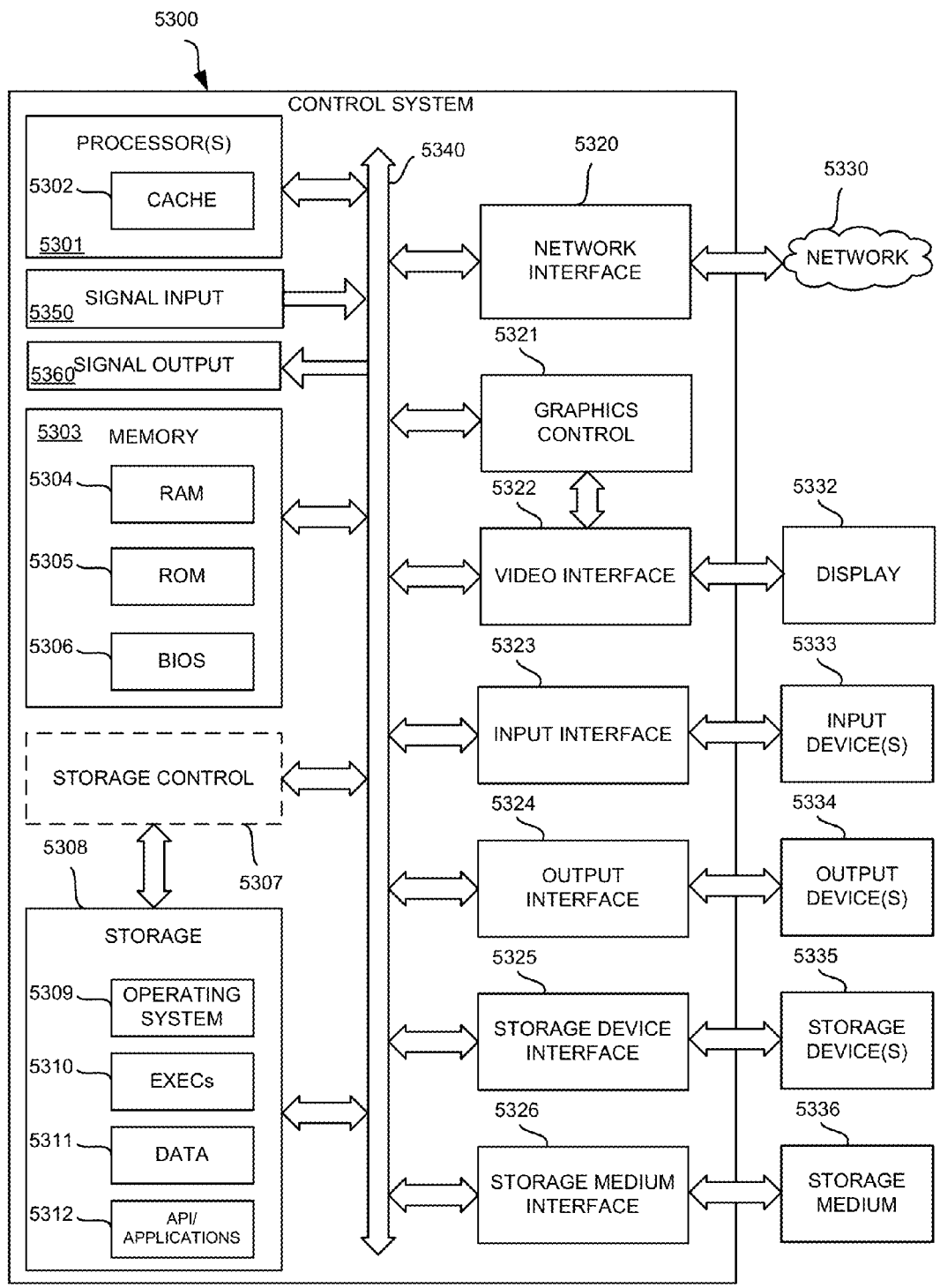
FIG. 53 shows a diagrammatic representation of one embodiment of a control system within which a set of instructions can execute for causing a device to perform or execute any one or more of the aspects and/or methodologies of the present disclosure.

The systems and methods described herein can be implemented in connection with a control and processing components in addition to the specific physical devices previously described herein. FIG. 53 shows a diagrammatic representation of one embodiment of a control system 5300 within which a set of instructions can execute for causing a device to perform or execute any one or more of the aspects and/or methodologies of the present disclosure. For example, the control system 5300 may be utilized to realize the control component 112, 612, 762, 910, 1010. But the components in FIG. 53 are examples only and do not limit the scope of use or functionality of any hardware, software, firmware, embedded logic component, or a combination of two or more such components implementing particular embodiments of this disclosure. Some or all of the illustrated components can be part of the control system 5300. For instance, the control system 5300 can include a general purpose computer or an embedded logic device (e.g., an FPGA), to name just two non-limiting examples.

Control system 5300 in this embodiment includes at least a processor 5301 such as a central processing unit (CPU) or an FPGA to name two non-limiting examples. The control system 5300 may also comprise a memory 5303 and storage 5308, both communicating with each other, and with other components, via a bus 5340. The bus 5340 may also link a display 5332, one or more input devices 5333 (which may, for example, include a keypad, a keyboard, a mouse, a stylus, etc.), one or more output devices 5334, one or more storage devices 5335, and various non-transitory, tangible processor-readable storage media 5336 with each other and with one or more of the processor 5301, the memory 5303, and the storage 5308. All of these elements may interface directly or via one or more interfaces or adaptors to the bus 5340. For instance, the various non-transitory, tangible processor-readable storage media 5336 can interface with the bus 5340 via storage medium interface 5326. Control system 5300 may have any suitable physical form, including but not limited to one or more integrated circuits (ICs), printed circuit boards (PCBs), mobile handheld devices, laptop or notebook computers, distributed computer systems, computing grids, or servers.

Processor(s) 5301 (or central processing unit(s) (CPU(s))) optionally contains a cache memory unit 5302 for temporary local storage of instructions, data, or processor addresses. Processor(s) 5301 are configured to assist in execution of non-transitory processor-readable instructions stored on at least one non-transitory, tangible processor-readable storage medium. Control system 5300 may provide functionality as a result of the processor(s) 5301 executing instructions embodied in one or more non-transitory, tangible processor-readable storage media, such as memory 5303, storage 5308, storage devices 5335, and/or storage medium 5336 (e.g., read only memory (ROM)). For instance, instructions to effectuate one or more steps of the methods described with reference to FIGS. 17-19 may be embodied in one or more non-transitory, tangible processor-readable storage media and processor(s) 5301 may execute the instructions. Memory 5303 may read the instructions from one or more other non-transitory, tangible processor-readable storage media (such as mass storage device(s) 5335, 5336) or from one or more other sources through a suitable interface, such as network interface 5320. Carrying out such processes or steps may include defining data structures stored in memory 5303 and modifying the data structures as directed by the software.

The signal input component 5350 generally operates to receive signals (e.g., digital and/or analog signals) that provide information about one or more aspects of the switch mode power supply 106, switch mode power supply 606, ion current compensation 660, plasma processing chamber 604, and current source 764. In some implementations, controller 112 and 612 may provide an output signal (e.g., a binary bit) to inform the switch mode power supply 106 and 506 to adjust a duty cycle of pulses or power supply voltage. In other implementations, the control system 5300 may be utilized in part to realize the ion current compensation 660, current control 762, controller 910, controller 1010.

The signal output component 5360 may include digital-to-analog components known to those of ordinary skill in the art to generate switch control signals to control switches $T_1$ and $T_2$. When switches $T_1$ and $T_2$ are implemented as field effect transistors (FETs), for example, the signal output component 5360 may generate gate drive signals to control the switches $T_1$ and $T_2$.

The memory 5303 may include various components (e.g., non-transitory, tangible processor-readable storage media) including, but not limited to, a random access memory component (e.g., RAM 5304) (e.g., a static RAM "SRAM", a dynamic RAM "DRAM, etc.), a read-only component (e.g., ROM 5305), and any combinations thereof. ROM 5305 may act to communicate data and instructions unidirectionally to processor(s) 5301, and RAM 5304 may act to communicate data and instructions bidirectionally with processor(s) 5301. ROM 5305 and RAM 5304 may include any suitable non-transitory, tangible processor-readable storage media described below. In some instances, ROM 5305 and RAM 5304 include non-transitory, tangible processor-readable storage media for carrying out the methods described herein.

Fixed storage 5308 is connected bidirectionally to processor(s) 5301, optionally through storage control unit 5307. Fixed storage 5308 provides additional data storage capacity and may also include any suitable non-transitory, tangible processor-readable media described herein. Storage 5308 may be used to store operating system 5309, EXECs 5310 (executables), data 5311, API applications 5312 (application programs), and the like. Often, although not always, storage 5308 is a secondary storage medium (such as a hard disk) that is slower than primary storage (e.g., memory 5303). Storage 5308 can also include an optical disk drive, a solid-state memory device (e.g., flash-based systems), or a combination of any of the above. Information in storage 5308 may, in appropriate cases, be incorporated as virtual memory in memory 5303.

In one example, storage device(s) 5335 may be removably interfaced with control system 5300 (e.g., via an external port connector (not shown)) via a storage device interface 5325. Particularly, storage device(s) 5335 and an associated machine-readable medium may provide nonvolatile and/or volatile storage of machine-readable instructions, data structures, program modules, and/or other data for the control system 5300. In one example, software may reside, completely or partially, within a machine-readable medium on storage device(s) 5335. In another example, software may reside, completely or partially, within processor(s) 5301.

Bus 5340 connects a wide variety of subsystems. Herein, reference to a bus may encompass one or more digital signal lines serving a common function, where appropriate. Bus 5340 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Control system 5300 may also include an input device 5333. In one example, a user of control system 5300 may enter commands and/or other information into control system 5300 via input device(s) 5333. Examples of an input device(s) 5333 include, but are not limited to, a touch screen, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 5333 may be interfaced to bus 5340 via any of a variety of input interfaces 5323 (e.g., input interface 5323) including, but not limited to, serial, parallel, game port, USB, FIREWIRE, THUNDERBOLT, or any combination of the above.

Information and data can be displayed through a display 5332. Examples of a display 5332 include, but are not limited to, a liquid crystal display (LCD), an organic liquid crystal display (OLED), a cathode ray tube (CRT), a plasma display, and any combinations thereof. The display 5332 can interface to the processor(s) 5301, memory 5303, and fixed storage 5308, as well as other devices, such as input device(s) 5333, via the bus 5340. The display 5332 is linked to the bus 5340 via a video interface 5322, and transport of data between the display 5332 and the bus 5340 can be controlled via the graphics control 5321.

In addition or as an alternative, control system 5300 may provide functionality as a result of logic hardwired or otherwise embodied in a circuit, which may operate in place of or together with software to execute one or more processes or one or more steps of one or more processes described or illustrated herein. Moreover, reference to a non-transitory, tangible processor-readable medium may encompass a circuit (such as an IC) storing instructions for execution, a circuit embodying logic for execution, or both, where appropriate. The present disclosure encompasses any suitable combination of hardware in connection with software.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In conclusion, the present invention provides, among other things, a system and method for arc-handling during plasma processing. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method of operating a plasma processing chamber comprising:
    sustaining a plasma in contact with a substrate on a substrate support within the plasma processing chamber;
    accessing an effective capacitance, $C_1$, of the substrate support;
    providing a modified periodic voltage function to the substrate support in order to effect a potential on a surface of the substrate, the modified periodic voltage function formed from a combination of a periodic voltage function and an ion current compensation, $I_C$; and
    calculating ion current, $I_I$, in the plasma as a function of measurements of the modified periodic voltage function.

2. The method of claim 1, wherein the modified periodic voltage function comprises:
    a rapidly increasing voltage called a first portion;
    a substantially constant voltage starting at an end of the first portion and called a second portion;
    a voltage step, $\Delta V$, below the substantially constant voltage starting at an end of the second portion and called a third portion; and
    a sloped voltage starting $\Delta V$ below the substantially constant voltage, starting at an end of the third portion, and called a fourth portion, the sloped voltage having a slope $dV_0/dt$ controlled by the ion current compensation.

3. The method of claim 2, further comprising, adjusting the ion current compensation, $I_C$, until the following equation is met:

$$0 = \frac{dV_0}{dt} - \frac{I_C}{C_1}$$

thus attaining a minimum width of an ion energy distribution function.

4. The method of claim 3, further comprising adjusting the ion current compensation, $I_C$, away from the ion current, $I_I$, so as to increase a width of the ion energy distribution function from the minimum.

5. The method of claim 3, wherein, when the equation is met, the following equation is true:

$$I_I = I_C \frac{C_1}{C_1 + C_{stray}}$$

where $C_{stray}$ is a cumulative capacitance of stray capacitances seen by the modified periodic voltage function.

6. The method of claim 2, wherein ion current, $I_I$, is calculated by:

determining a first slope, $dV_{01}/dt$, for a first ion current compensation, $I_{C1}$;
determining a second slope, $dV_{02}/dt$, for a second ion current compensation, $I_{C2}$; and
calculating the ion current, $I_I$, as a function of the effective capacitance, $C_1$, the first slope, $dV_{01}/dt$, the second slope, $dV_{02}/dt$, the first ion current compensation, $I_{C1}$, and the second ion current compensation, $I_{C2}$.

7. The method of claim 6, wherein the ion current, $I_I$, is calculated via the following equation:

$$I_I = \frac{C_1 \cdot \left(I_{c1} \cdot \frac{dV_{02}}{dt} - I_{c2} \cdot \frac{dV_{01}}{dt}\right)}{I_{c1} - I_{c2} + C_1 \cdot \left(\frac{dV_{02}}{dt} - \frac{dV_{01}}{dt}\right)}$$

8. The method of claim 2, further comprising controlling an ion energy, eV, of ions incident on the substrate surface by controlling the voltage step, $\Delta V$, thereby effecting the potential on the substrate surface.

9. The method of claim 8, further comprising effecting two or more ion energy distribution peaks by providing two different voltage steps, $\Delta V$, for two adjacent cycles of the modified periodic voltage function.

10. The method of claim 2, further comprising calculating a capacitance of the plasma sheath, $C_2$, in real time and noninvasively.

11. The method of claim 10, wherein $C_2$ is calculated as a function of ion current, $I_I$.

12. The method of claim 11, wherein $C_2$ is calculated from the following equation:

$$C_2 = \frac{C_1 \cdot (I_I + I_c)}{I_c - C_1 \cdot \frac{dV_0}{dt}}$$

13. The method of claim 1, further comprising monitoring an ion energy, eV, of ions incident on the substrate surface as a function of the voltage step, $\Delta V$.

14. The method of claim 13, wherein the ion energy, eV, is calculated from the voltage step, $\Delta V$, the effective capacitance, $C_1$, and the sheath capacitance, $C_2$, as follows:

$$eV = \Delta V \frac{C_1}{C_2 + C_1}$$

15. The method of claim 1, wherein the modified periodic voltage function includes one or more periodically repeating fixed waveforms.

16. The method of claim 1, further comprising remotely and noninvasively monitoring a density of the plasma as a function of the ion current, $I_I$.

17. The method of claim 16, further comprising adjusting a peak-to-peak voltage of the periodic voltage function in response to the density of the plasma crossing one or more thresholds.

18. The method of claim 1, wherein accessing includes retrieval of the effective capacitance from a memory.

19. The method of claim 1, wherein the modified periodic voltage function includes a voltage step, $\Delta V$, followed by a sloped portion having a slope $dV_0/dt$.

20. The method of claim 19, wherein the ion current, $I_I$, is a function of the voltage step, $\Delta V$, and the slope of the sloped portion, $dV_0/dt$.

21. The method of claim 20, wherein the slope, $dV_0/dt$, is calculated using at least one voltage measurement from each of two different cycles of the modified periodic voltage function.

22. The method of claim 19, wherein the voltage step, $\Delta V$, corresponds to an average potential on the surface of the substrate opposite the substrate support and thereby effects an average ion energy, eV, of ions incident on the substrate.

23. The method of claim 22, wherein the slope of the sloped portion, $dV_0/dt$, is a function of the ion current compensation, $I_C$.

24. The method of claim 1, further comprising adjusting the ion current compensation, $I_C$, until it equals the ion current, $I_I$, thus minimizing a width of an ion energy distribution function via effecting a constant potential on the surface of the substrate opposite the substrate support.

25. The method of claim 3, further comprising adjusting the ion current compensation, $I_C$, in order to vary the potential on the surface of the substrate opposite the substrate support, thus increasing a width of the ion energy distribution function to a desired width.

* * * * *